US012772875B2

(12) United States Patent
Yu et al.

(10) Patent No.: US 12,772,875 B2
(45) Date of Patent: Oct. 20, 2026

(54) SHIELDED THROUGH-SUBSTRATE VIA STRUCTURES FOR SILICON INTERCONNECT DIE

(71) Applicant: Taiwan Semiconductor Manufacturing Company Limited, Hsinchu (TW)

(72) Inventors: Cheng-Ming Yu, Taichung City (TW); Jhen-Hong Lin, Hsinchu (TW); Mochtar Chandra, Hsinchu City (TW); Wei-Fen Pai, Hsinchu (TW); Li-Chun Hung, Hsinchu (TW); Yen-Ming Chen, Chu-Pei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 435 days.

(21) Appl. No.: 18/451,043

(22) Filed: Aug. 16, 2023

(65) Prior Publication Data

US 2025/0062205 A1 Feb. 20, 2025

(51) Int. Cl.
*H10W 70/63* (2026.01)
*H10W 20/00* (2026.01)
(Continued)

(52) U.S. Cl.
CPC ....... *H10W 70/635* (2026.01); *H10W 20/023* (2026.01); *H10W 20/20* (2026.01);
(Continued)

(58) Field of Classification Search
CPC ........... H01L 23/49827; H01L 23/5384; H01L 23/481; H01L 21/76898; H01L 21/486;
(Continued)

(56) References Cited

U.S. PATENT DOCUMENTS 9,368,440 B1 * 6/2016 Hool .................. H10W 70/635
2002/0017399 A1 * 2/2002 Chang ................. H05K 1/0222
174/262
(Continued)

FOREIGN PATENT DOCUMENTS

CN 102130042 A * 7/2011
CN 111668204 A 9/2020
(Continued)

OTHER PUBLICATIONS

Machine translation of WO-2024060595 (Year: 2024).*
(Continued)

*Primary Examiner* — Younes Boulghassoul
(74) *Attorney, Agent, or Firm* — The Marbury Law Group, PLLC

(57) ABSTRACT

A silicon interconnect die includes through-substrate via (TSV) structures extending through a silicon substrate; an insulating spacer layer including a horizontally-extending portion overlying a top surface of the silicon substrate and a plurality of tubular insulating material portions laterally surrounding a respective one of the TSV structures; and a front metallic shield layer including a horizontally-extending metallic shield portion and at least one tubular metallic shield portion laterally surrounding a respective one of the tubular insulating material portions.

20 Claims, 47 Drawing Sheets

(51) Int. Cl.

| | |
|---|---|
| ***H10W 20/20*** | (2026.01) |
| ***H10W 20/41*** | (2026.01) |
| ***H10W 20/42*** | (2026.01) |
| ***H10W 42/20*** | (2026.01) |
| ***H10W 44/20*** | (2026.01) |

(52) U.S. Cl.
CPC ....... *H10W 20/2128* (2026.01); *H10W 20/42* (2026.01); *H10W 20/423* (2026.01); *H10W 20/435* (2026.01); *H10W 42/20* (2026.01); *H10W 44/212* (2026.01)

(58) Field of Classification Search
CPC ........... H01L 23/552; H01L 2924/3025; H01L 23/60; H01L 23/66; H01L 2225/06537; H01L 23/53223; H01L 23/53238; H01L 23/53252; H01L 23/53266; H10W 70/635; H10W 70/611; H10W 70/095; H10W 20/20–233; H10W 20/023–0265; H10W 44/212; H10W 42/20–287; H10W 42/60; H10W 20/423; H10W 20/032–0552; H10W 20/425; H10W 20/455; H10W 20/2128; H05K 1/0222
See application file for complete search history.

(56) References Cited

U.S. PATENT DOCUMENTS

| | | | | |
|---|---|---|---|---|
| 2007/0290300 | A1* | 12/2007 | Kawakami | H01L 21/76898 438/109 |
| 2011/0151621 | A1* | 6/2011 | Tuttle | H10W 20/023 438/107 |
| 2012/0068327 | A1* | 3/2012 | Oganesian | H10P 72/74 257/E21.597 |
| 2012/0258589 | A1* | 10/2012 | Volant | H10W 20/023 438/653 |
| 2014/0084480 | A1* | 3/2014 | Wang | H10W 70/095 257/774 |
| 2017/0231083 | A1* | 8/2017 | Wu | H05K 1/0216 |
| 2017/0278806 | A1* | 9/2017 | Kuo | H01L 23/66 |
| 2018/0226328 | A1* | 8/2018 | Rodriguez | H10W 70/685 |
| 2019/0088544 | A1* | 3/2019 | Yu | H10W 20/023 |
| 2020/0350363 | A1* | 11/2020 | Lim | H10B 61/00 |
| 2021/0183722 | A1* | 6/2021 | Anderson | H10W 40/22 |
| 2022/0045008 | A1* | 2/2022 | Kang | H10W 70/611 |
| 2023/0063808 | A1* | 3/2023 | Shahidi | H01L 23/49827 |
| 2023/0335506 | A1* | 10/2023 | Wang | H10W 42/20 |
| 2024/0321758 | A1* | 9/2024 | Chen | H10W 70/093 |

FOREIGN PATENT DOCUMENTS

| | | | |
|---|---|---|---|
| TW | 201130125 A | 9/2011 | |
| WO | WO-2024060595 A1 * | 3/2024 | H01L 21/76897 |

OTHER PUBLICATIONS

Machine translation of CN-102130042 (Year: 2011).*
Jianq Chyun Intellectual Property Office; TW Application No. 112125692; Office Action mailed Jun. 20, 2024; 10 pages.

* cited by examiner

SHIELDED THROUGH-SUBSTRATE VIA STRUCTURES FOR SILICON INTERCONNECT DIE

BACKGROUND

Silicon interconnect dies may be used in a composite interposer to provide high frequency signal paths through the interposer. A high signal-to-noise ratio is desired for signal transmission through the silicon interconnect dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
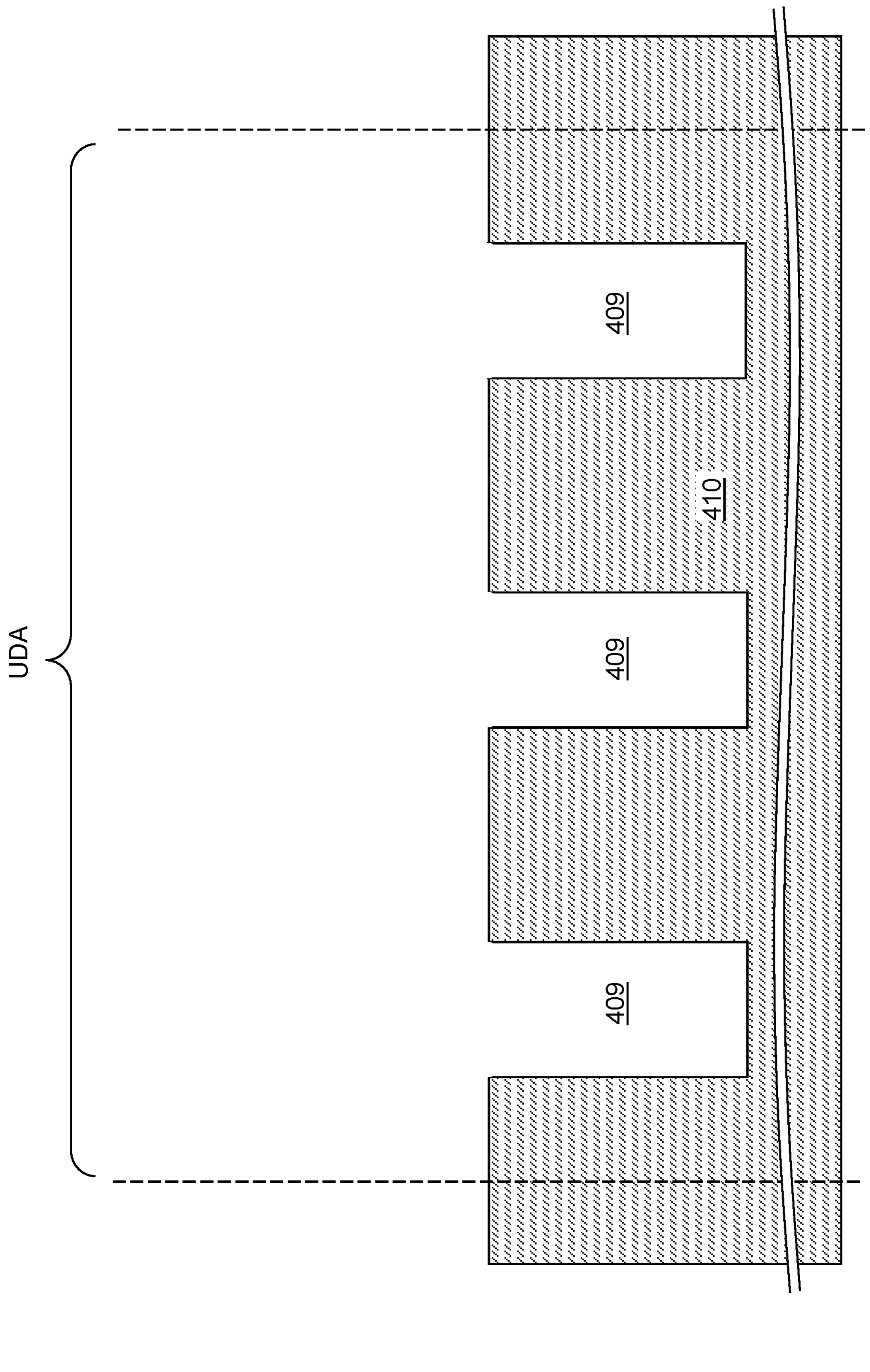
FIG. 1 is a vertical cross-sectional view of an embodiment intermediate structure of the present disclosure after formation of trenches in an upper portion of a silicon substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein are directed to various device structures including a silicon interconnect die, which may be incorporated into an interposer or assemblies including an interposer that may be used in devices that provide high speed communication typically in a range above 1 GHz. At such high frequencies, cross-talk between neighboring pairs of through-substrate via structures may degrade signal fidelity by decreasing the signal-to-noise ratio. Various embodiments disclosed herein use metallic shield structures to reduce the electromagnetic coupling between neighboring through-substrate via structures and to increase the signal-to-noise ratio in a silicon interconnect die. Various aspects of the present invention are now described with reference to accompanying drawings.

Referring to FIG. 1, an embodiment intermediate structure of the present disclosure is illustrated, which includes a silicon substrate 410. The silicon substrate 410 comprises a silicon layer, which may be a single crystalline silicon layer or a polycrystalline silicon layer. The silicon substrate 410 may be a commercially available silicon substrate. For example, the silicon substrate 410 may be a silicon wafer having a diameter of 150 mm, 200 mm, 300 mm, or 400 mm, and having a thickness in a range from 500 microns to 1 mm.

An array of trenches 409 may be formed in an upper portion of the silicon substrate 410, for example, by applying and lithographically patterning an etch mask layer (not illustrated) over a top surface of the silicon substrate 410, and by performing an anisotropic etch process that transfers the pattern of the openings into the upper portion of the silicon substrate 410. The etch mask layer may comprise a hard mask layer such as a silicon oxide layer, and may be removed after formation of the trenches 409. The depth of the trenches 409 may be in a range from 5 microns to 30 microns, and the lateral dimension (such as a diameter) of each trench 409 may be in a range from 1 microns to 20 microns, such as from 2 microns to 10 microns, although lesser and greater lateral dimensions may also be used.

The pattern of the trenches 409 may be repeated as a two-dimensional periodic pattern having a first periodicity along a first horizontal direction and having a second periodicity along a second horizontal direction. The structure to be subsequently formed in, and over, the silicon substrate 410 includes a two-dimensional array of silicon interconnect dies. As used herein, a silicon interconnect die refers to a die including a silicon substrate and metal interconnect structures thereupon. In some embodiments, a silicon interconnect die may be a bridge die that may be disposed in an interposer. Each area of the structure to be subsequently converted into a silicon interconnect die is herein referred to as a unit die area, i.e., a unit area out of which a single silicon interconnect die is to be manufactured. The illustrated portion of the exemplary structure in FIG. 1 includes a single unit die area UDA with two peripheral portions of neighboring unit die areas UDA.

While various embodiments disclosed herein are illustrated using drawings in which three trenches 409 are illustrated in a unit die area UDA, it is understood that the drawings of the instant application are schematic, and an actual unit die area UDA may comprise rows of 3 to 10,000 trenches 409 along a first horizontal direction, and the total number of rows may be in a range from 3 to 10,000. As such, the total number of trenches may be in a range from 9 to 108, although lesser and greater numbers of trenches 409 may also be used.

FIGS. 2A-2G are sequential vertical cross-sectional views of a region of the embodiment intermediate structure of the present disclosure during formation of a front metallic shield layer 420, an insulating spacer layer 430, and through-substrate via (TSV) structures 440.

Figure 2A:
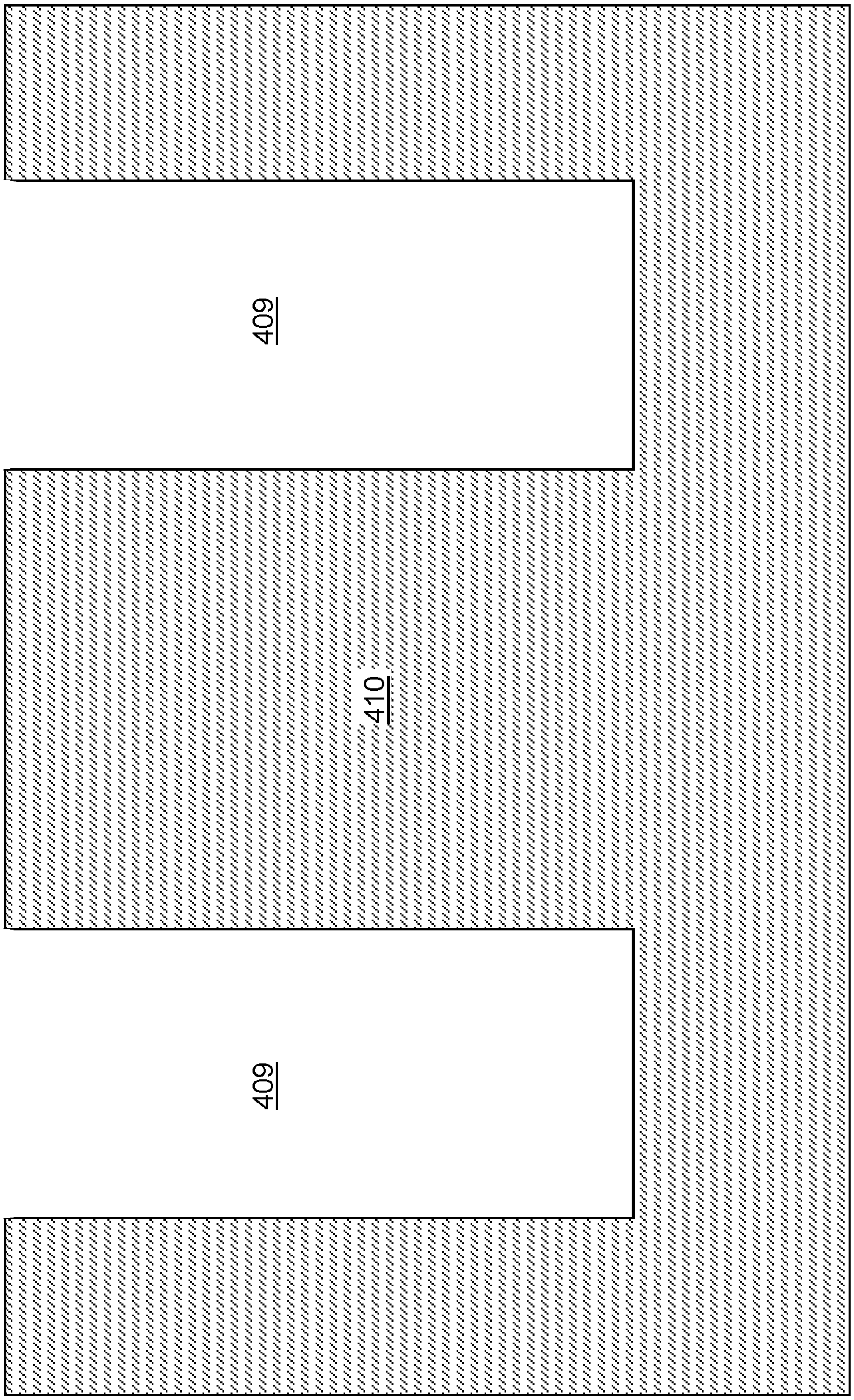
FIGS. 2A-2G are sequential vertical cross-sectional views of a region of the embodiment intermediate structure of the present disclosure during formation of a front metallic shield layer, an insulating spacer layer, and through-substrate via (TSV) structures.

Referring to FIG. 2A, a portion of the silicon substrate 410 described with reference to FIG. 1 is illustrated. The illustrated portion of the silicon substrate 410 comprises two trenches 409, which may be, for example, discrete cylindrical trenches.

Figure 2B:
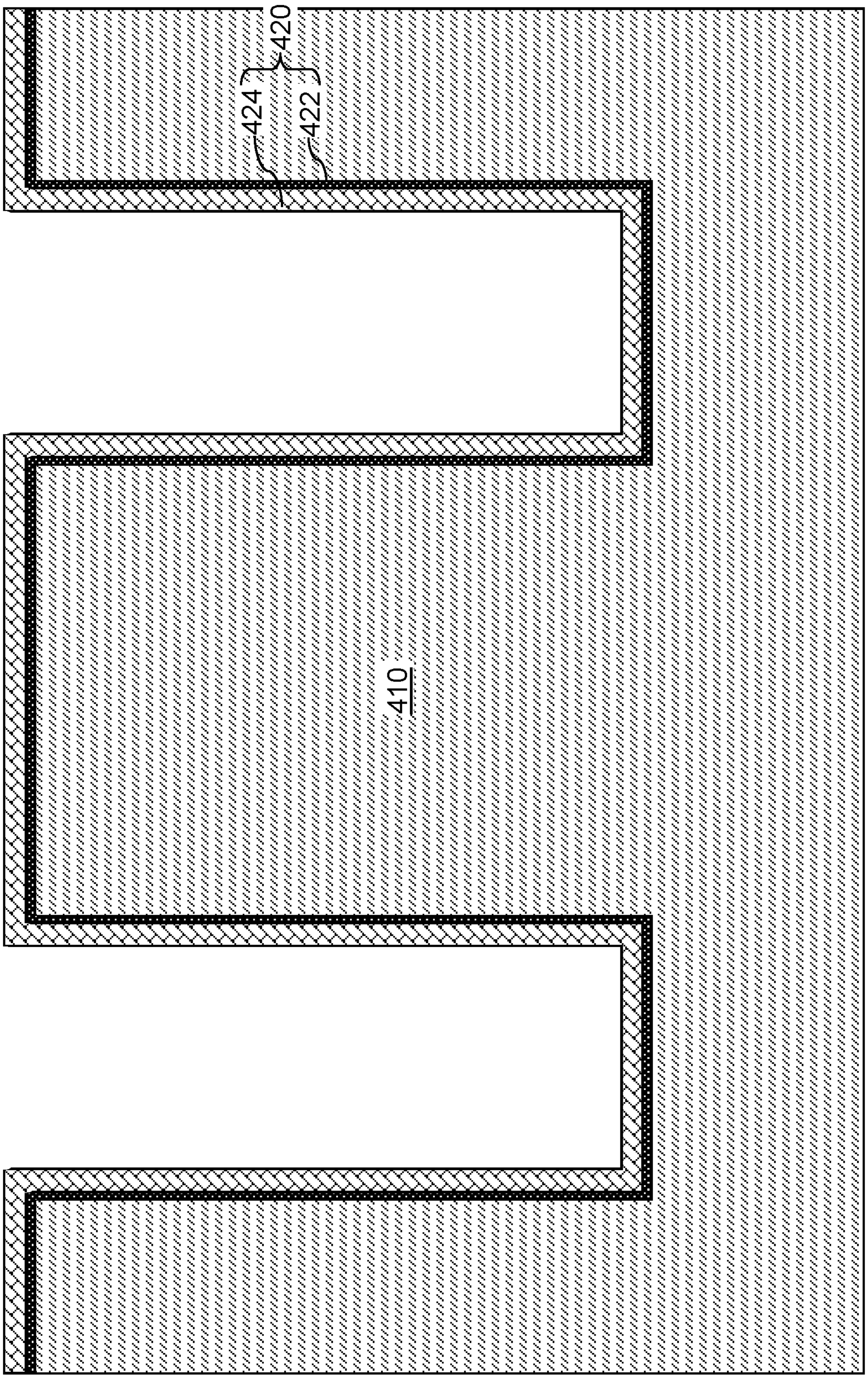

Referring to FIG. 2B, a front metallic shield layer 420 may be formed on the physically exposed surfaces of the trenches 409 and over the top surface of the silicon substrate 410. The front metallic shield layer 420 may be formed in first peripheral portions of the trenches 409 and on the top surface of the silicon substrate 410. In one embodiment, the front metallic shield layer 420 may include a front metallic barrier layer 422 comprising a metallic barrier material, and a front metal layer 424 comprising a high conductivity metal. The metallic barrier material comprises a metallic diffusion barrier material that blocks diffusion of the metal in the front metal layer 424 into the silicon substrate 410. For example, the metallic barrier material may comprise at least one material such as TiN, TaN, WN, MON, Ti, Ta, W, an alloy thereof, and/or a layer stack thereof. Other suitable metallic barrier materials are within the contemplated scope of disclosure. The thickness of the front metallic barrier layer 422 may be in a range from 10 nm to 100 nm, although lesser and greater thicknesses may also be used. The front metallic barrier layer 422 may be formed by chemical vapor deposition or physical vapor deposition. The front metal layer 424 may comprise Cu, W, Mo, Co, Ru, etc., and may be formed by chemical vapor deposition, physical vapor deposition, electroplating, electroless plating, or a combination thereof. Other suitable metal layer materials are within the contemplated scope of disclosure. The thickness of the front metal layer 424 may be in a range from 100 nm to 2 microns, although lesser and greater thicknesses may also be used.

Figure 2C:
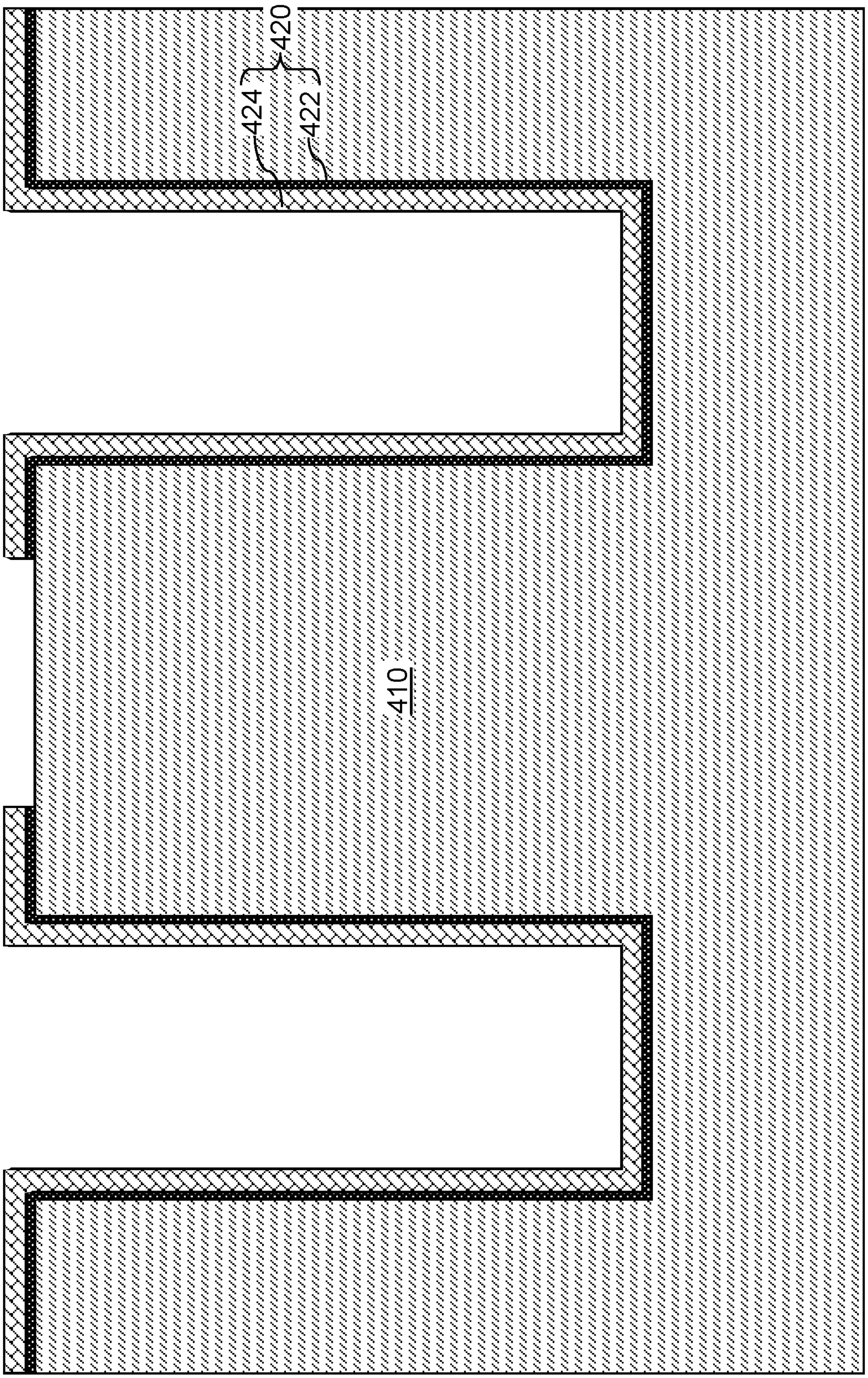

Referring to FIG. 2C, horizontally-extending portions of the front metallic shield layer 420 may be optionally patterned. The processing steps described with reference to FIG. 2C is optional, and may, or may not, be performed. In embodiments in which the processing steps described with reference to FIG. 2C is performed, a photoresist layer (not shown) may be applied over the top surface of the silicon substrate 410. The photoresist layer (not shown) may be lithographically patterned to form openings in areas overlying horizontally-extending portions of the front metallic shield layer 420. Each patterned portion of the photoresist layer may cover a respective set of at least one trench 409. In one embodiment, each patterned portion of the photoresist layer may cover a respective single trench 409. Alternatively, one or more patterned portions of the photoresist layer may cover a respective plurality of trenches 49. An etch process may be performed to remove unmasked portions of the front metallic shield layer 420. The front metallic shield layer 420 formed at the processing steps of FIG. 2B may be divided into a plurality of front metallic shield layers 420 that cover a respective subset of the trenches 409. The photoresist layer may be subsequently removed, for example, by ashing.

In embodiments in which the processing steps described with reference to FIG. 2C are omitted or in embodiments in which the patterned portions of the front metallic shield layer 420 extends between two or more trenches 409, a horizontally-extending portion of the front metallic shield layer 420 may continuously extend from a first vertically-extending cylindrical portion of the front metallic shield layer 420 located in a first trench 409 to a second vertically-extending cylindrical portion of the front metallic shield layer 420 located in a second trench 409.

Figure 2D:
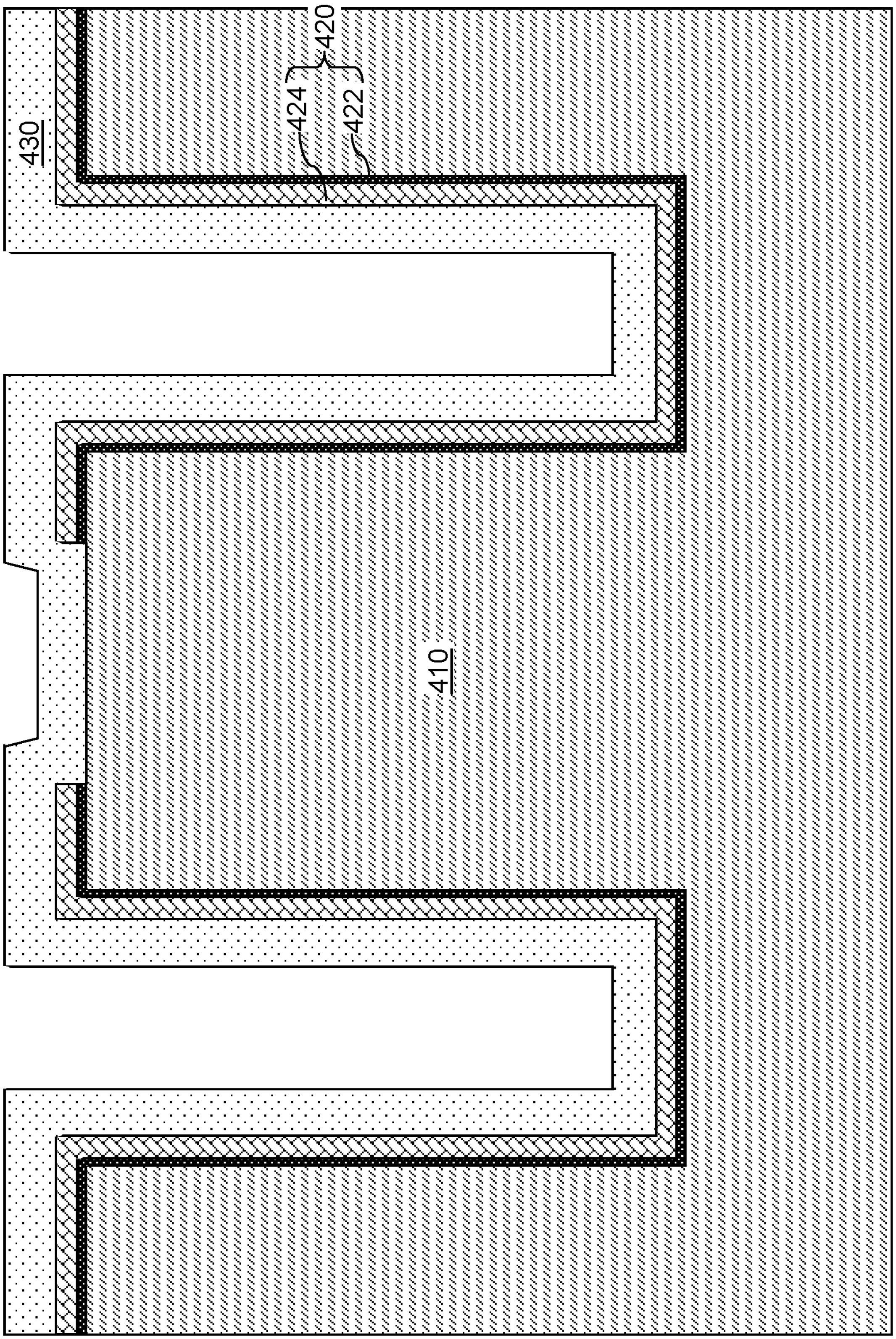

Referring to FIG. 2D, an insulating spacer layer 430 may be formed on the physically exposed surfaces of the front metallic shield layer 420. The insulating spacer layer 430 may be formed in second peripheral portions of the trenches 409 and on the top surface of each horizontally-extending portion of the front metallic shield layer(s) 420. The insulating spacer layer 430 may comprise at least one insulating material such as silicon oxide, silicon nitride, and/or a dielectric metal oxide material. Other insulating materials are within the contemplated scope of disclosure. The insulating spacer layer 430 may be deposited by a conformal deposition process such as a chemical vapor deposition process. Other deposition processes may be used. The thickness of the insulating spacer layer 430 may be in a range from 100 nm to 2 microns, although lesser and greater thicknesses may also be used. In some embodiments, the insulating spacer layer 430 may contact a segment of a top surface of the silicon substrate 410.

Figure 2E:
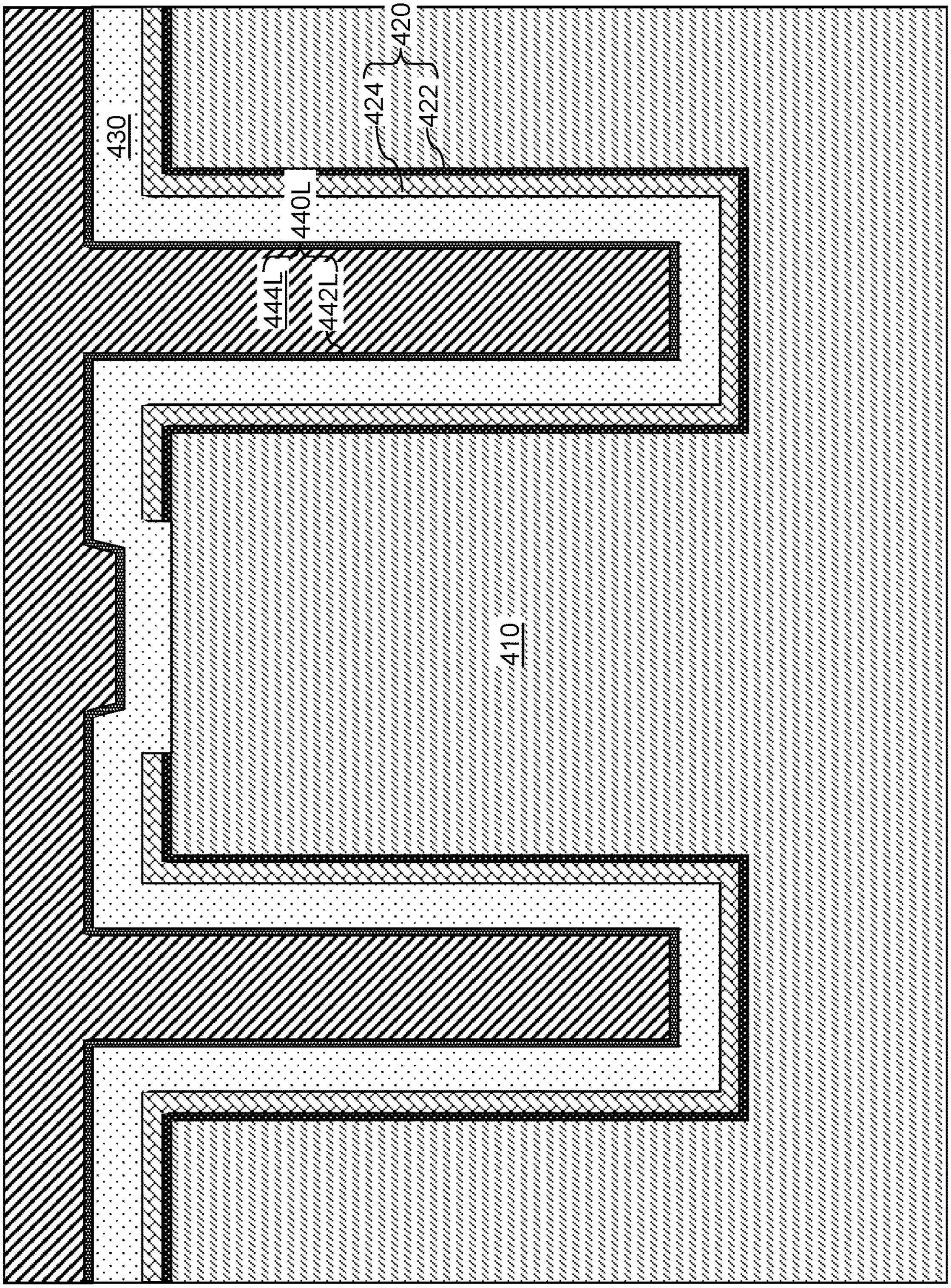

Referring to FIG. 2E, a metallic fill material layer 440L may be formed in remaining unfilled volumes of the trenches 409 and over the horizontally-extending portion of the insulating spacer layer 430. In one embodiment, the metallic fill material layer 440L comprises a continuous metallic adhesion layer 442L comprising a metallic adhesion promotion material, and a continuous metal layer 444L comprising a high conductivity metal. The continuous metallic adhesion layer 442L may comprise a metallic diffusion barrier material such as TiN, TaN, WN, MON, Ti, Ta, W, an alloy thereof, and/or a layer stack thereof. Other suitable metallic diffusion materials are within the contemplated scope of disclosure. The thickness of the continuous metallic adhesion layer 442L may be in a range from 10 nm to 100 nm, although lesser and greater thicknesses may also be used. The material composition of the continuous metallic adhesion layer 442L may be the same as, or may be different from, the material composition of the front metallic barrier layer 422. The continuous metallic adhesion layer 442L may be formed by chemical vapor deposition or physical vapor deposition. The continuous metal layer 444L may comprise Cu, W, Mo, Co, Ru, etc., and may be formed by chemical vapor deposition, physical vapor deposition, electroplating, electroless plating, or a combination thereof. The thickness of the horizontally-extending portion of the continuous metal layer 444L overlying the silicon substrate 410 may be in a range from 500 nm to 6 microns, although lesser and greater thicknesses may also be used.

Figure 2F:
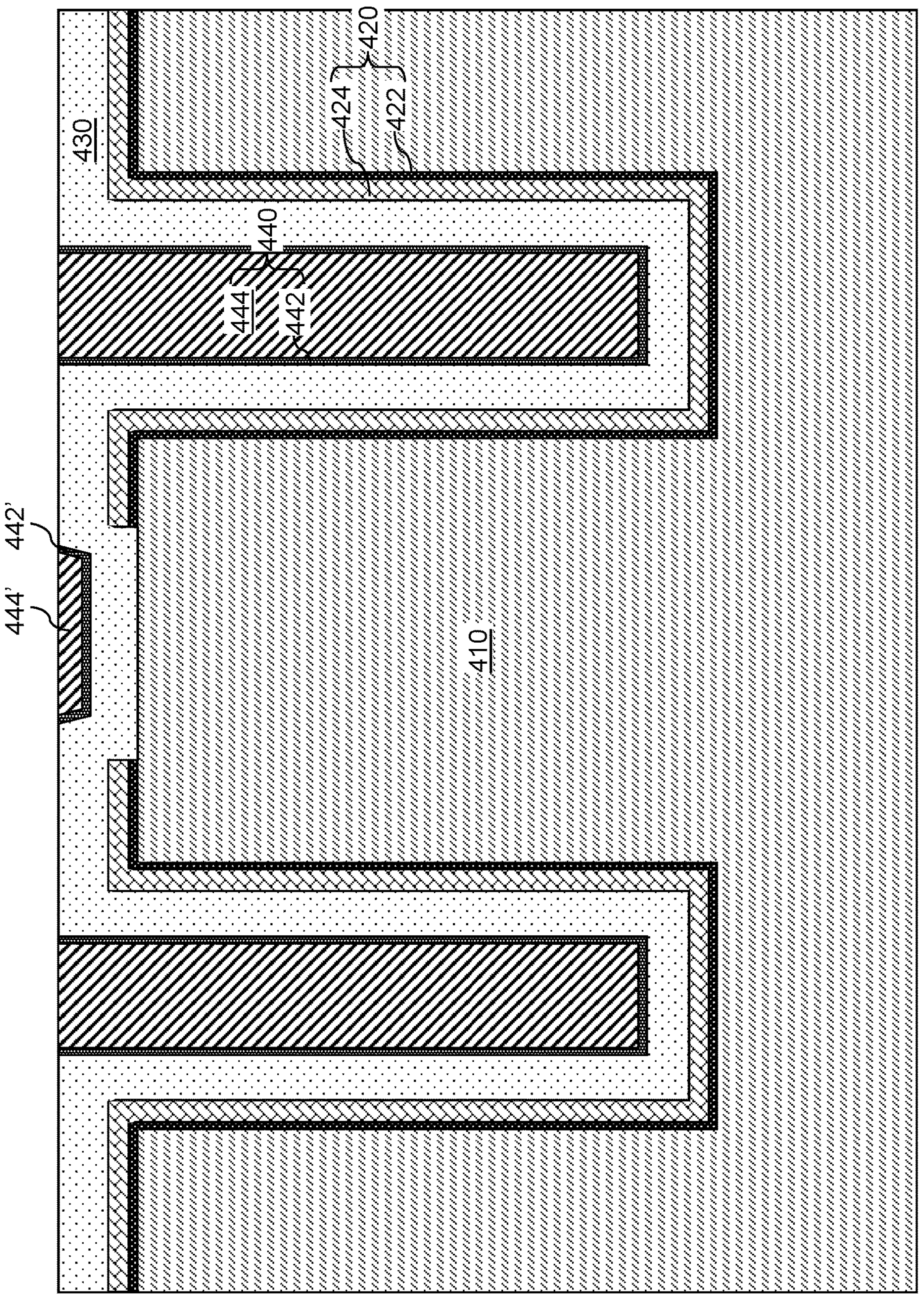

Referring to FIG. 2F, the horizontally-extending portion of the metallic fill material layer 440L may be removed from above the top surface of the horizontally-extending portion of the insulating spacer layer 430 by a planarization process. For example, a chemical mechanical polishing (CMP) process or a recess etch process may be performed. In embodiments in which a CMP process is used to remove the horizontally-extending portion of the metallic fill material layer 440L from above the top surface of the horizontally-extending portion of the insulating spacer layer 430, combinations of a metallic adhesion material portion 442' and a metal portion 444' may be optionally formed in areas in which the top surface of the insulating spacer layer 430 is vertically recessed. Each remaining portion of the continuous metallic adhesion layer 442L that is laterally surrounded by a respective cylindrical vertically-extending portion of the insulating spacer layer 430 constitutes a metallic liner, which is herein referred to as a through-substrate via (TSV) liner 442. Each remaining portion of the continuous metal layer 444L that is that is laterally surrounded by a respective cylindrical vertically-extending portion of the insulating spacer layer 430 constitutes a metallic fill material portion, which is herein referred to as a through-substrate via (TSV) core portion 444. Each contiguous combination of a TSV liner 442 and a TSV core portion 444 constitutes a through-substrate via (TSV) structure 440.

Figure 2G:
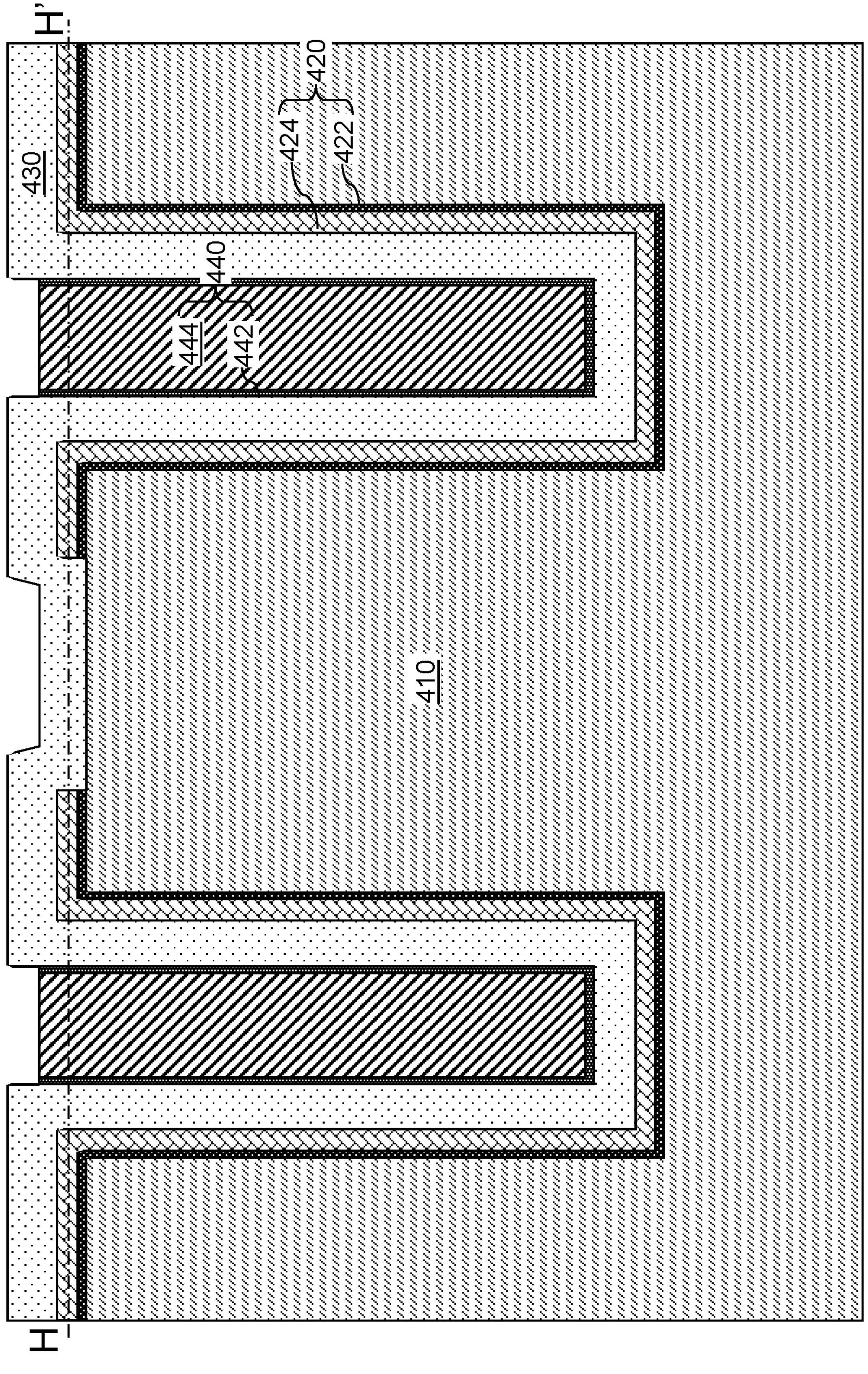

Referring to FIG. 2G, in embodiments in which metallic adhesion material portions 442' and metal portions 444' are present over the insulating spacer layer 430, a recess etch process may be performed to remove the metallic adhesion material portions 442' and the metal portions 444' selective to the insulating spacer layer 430. In one embodiment, the recess etch process may comprise a selective isotropic etch process or a selective anisotropic etch process that etches materials of the metallic adhesion material portions 442' and the metal portions 444' selective to the material of the insulating spacer layer 430. In this embodiment, the top surfaces of the TSV structures 440 may be vertically recessed below the horizontal plane including the topmost surface of the insulating spacer layer 430. In one embodiment, top surfaces of the TSV structures 440 may be formed above the horizontal plane including the top surface of the silicon substrate 410, and below the horizontal plane including the topmost surface of the insulating spacer layer 430. Generally, through-substrate via (TSV) structures 440 may be formed by removing horizontally-extending portions of the metallic fill material layer 440L from above a horizontally-extending portion of the insulating spacer layer 430. The TSV structures 440 may be formed in remaining volumes of the trenches 409 after formation of the insulating spacer layer 430.

Figure 2H:
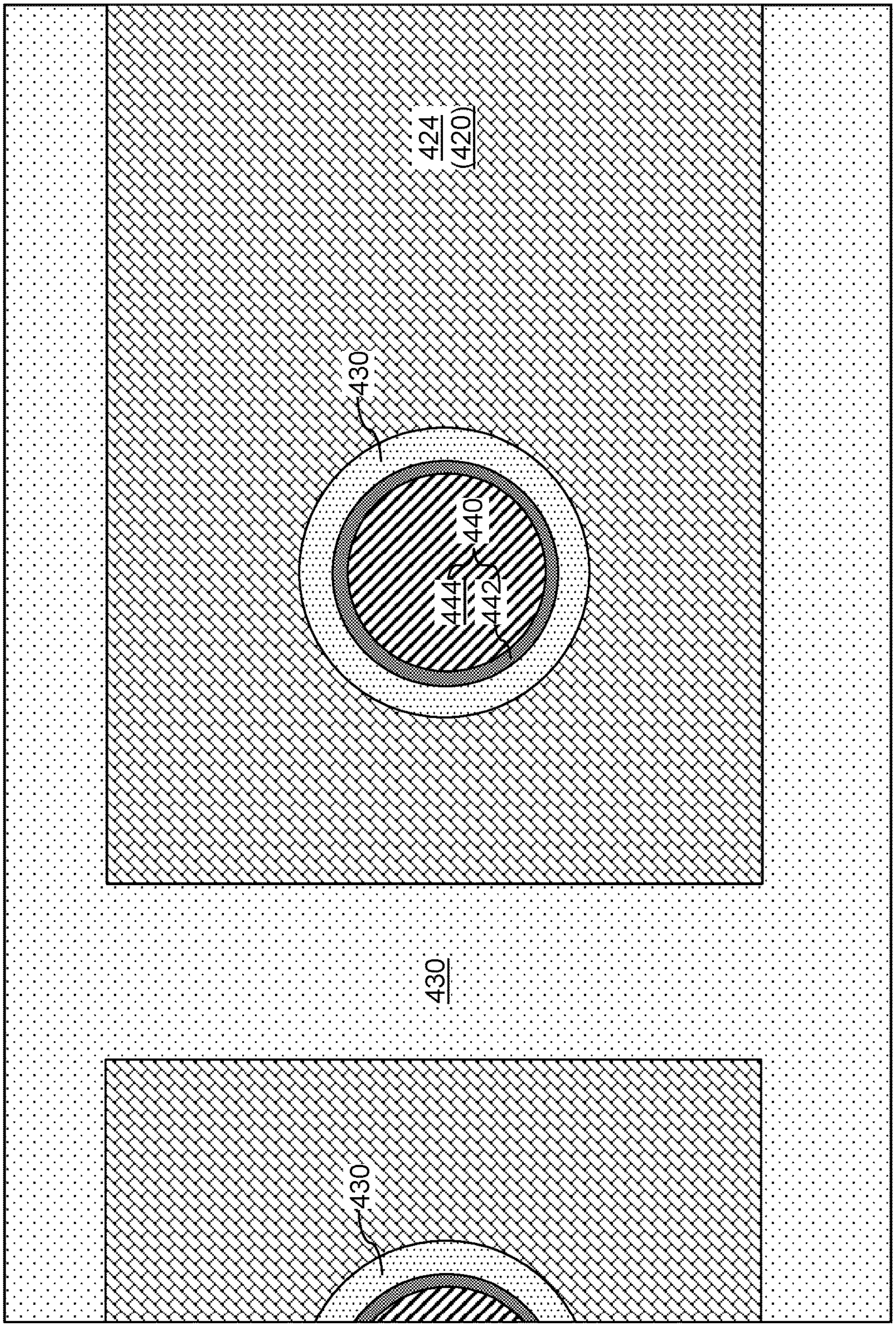
FIGS. 2H-2J are horizontal cross-sectional views of a region of various configurations of the embodiment structure along the horizontal plane H-H' of FIG. 2G.
Figure 2I:
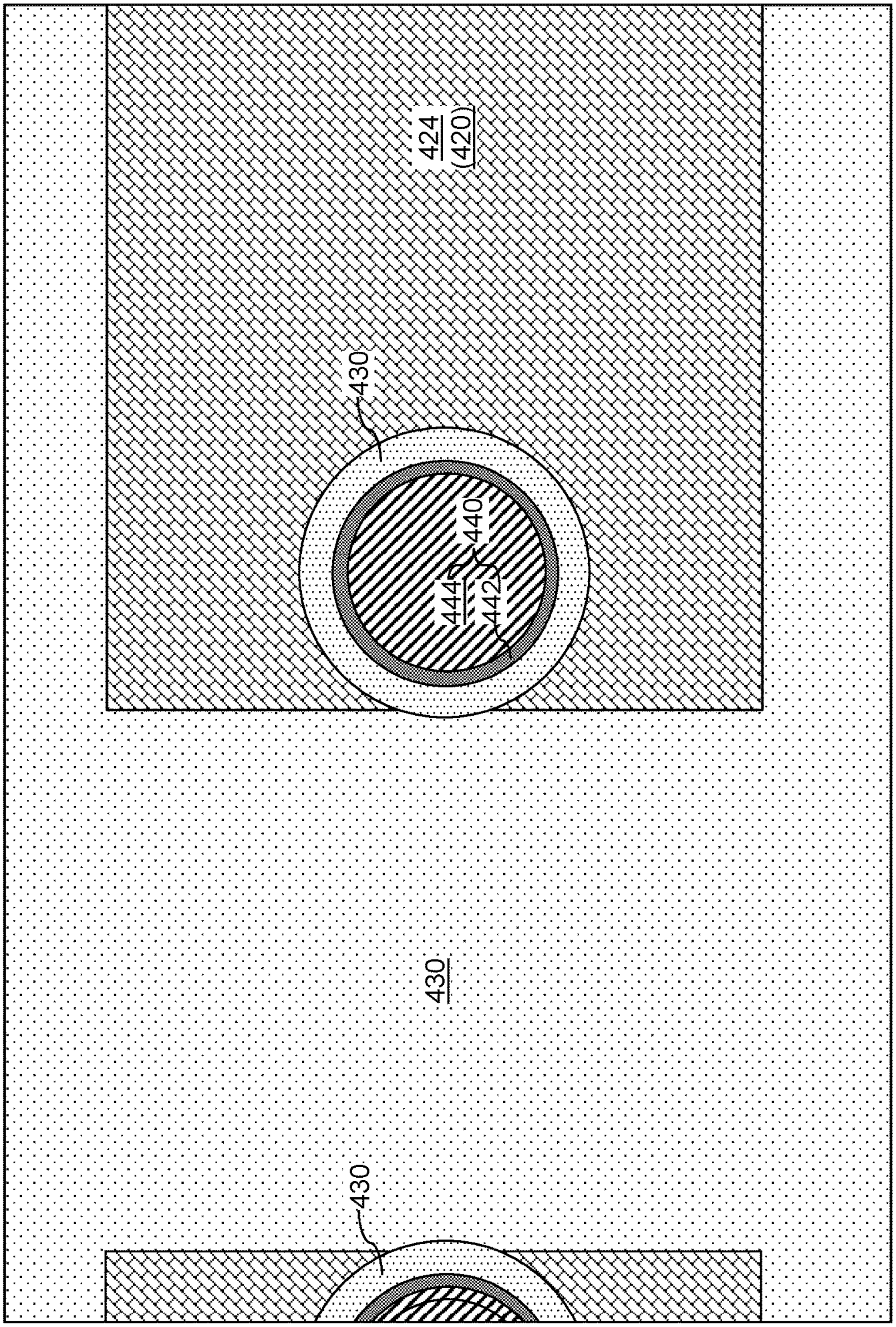
Figure 2J:
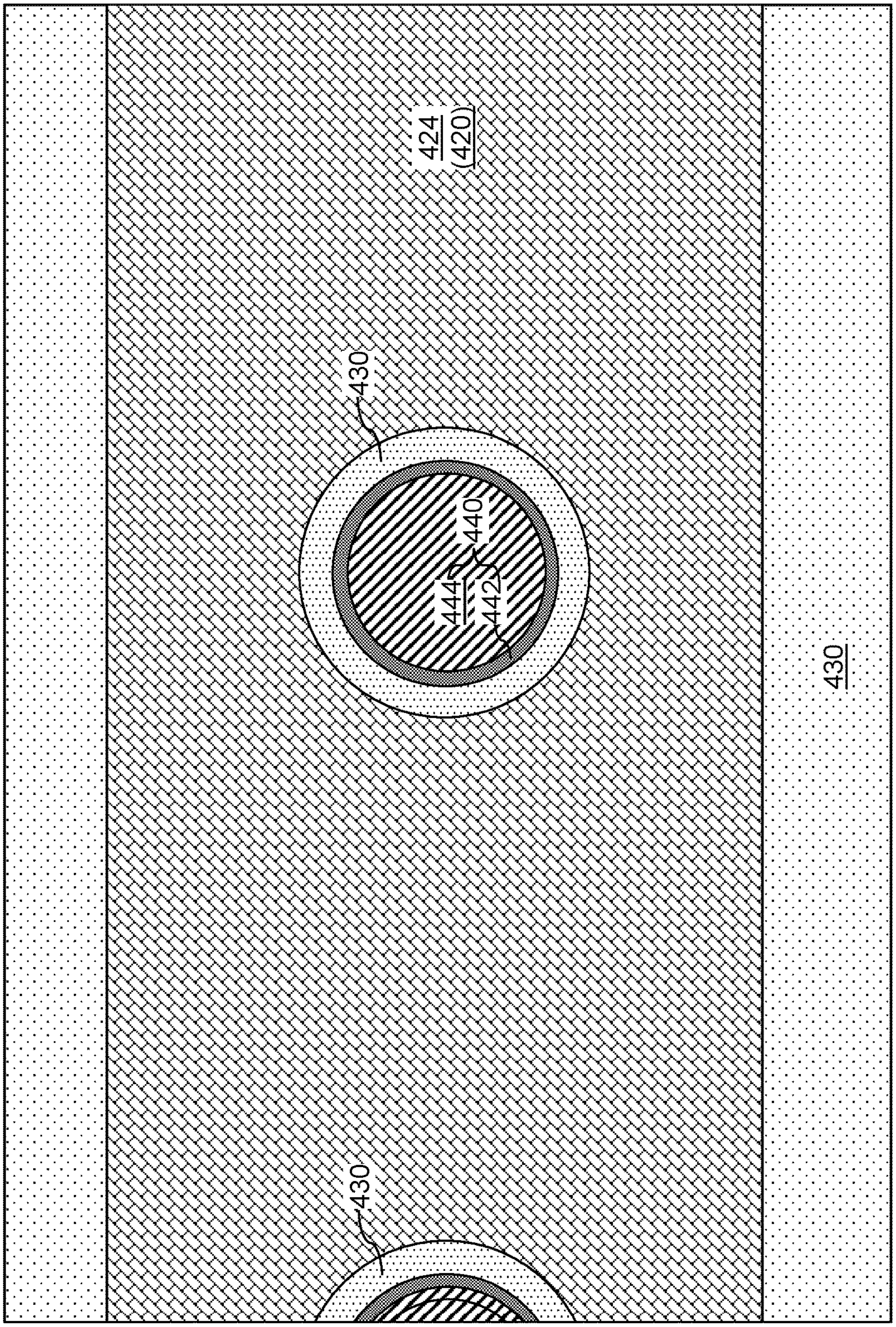

FIGS. 2H-2J are horizontal cross-sectional views of a region of various configurations of the embodiment structure along the horizontal plane H-H' of FIG. 2G. A neighboring pair of front metallic shield layers 420 may be laterally spaced from each other and may fully encircle a respective cylindrical vertically-extending portion of the insulating spacer layer 430 as illustrated in FIG. 2H. Alternatively, a neighboring pair of front metallic shield layers 420 may be laterally spaced from each other and may partially encircle a respective cylindrical vertically-extending portion of the insulating spacer layer 430 as illustrated in FIG. 2I. Yet alternatively, a front metallic shield layer 420 may encircle a plurality of cylindrical vertically-extending portions of the insulating spacer layer 430 as illustrated in FIG. 2J.

FIGS. 3A-3F are sequential vertical cross-sectional views of the embodiment structure of the present disclosure during formation of metal interconnect structures 480 embedded in dielectric material layers 460, thinning of the backside of the silicon substrate 410, and formation of a backside metallic shield layer 470.

Figure 3A:
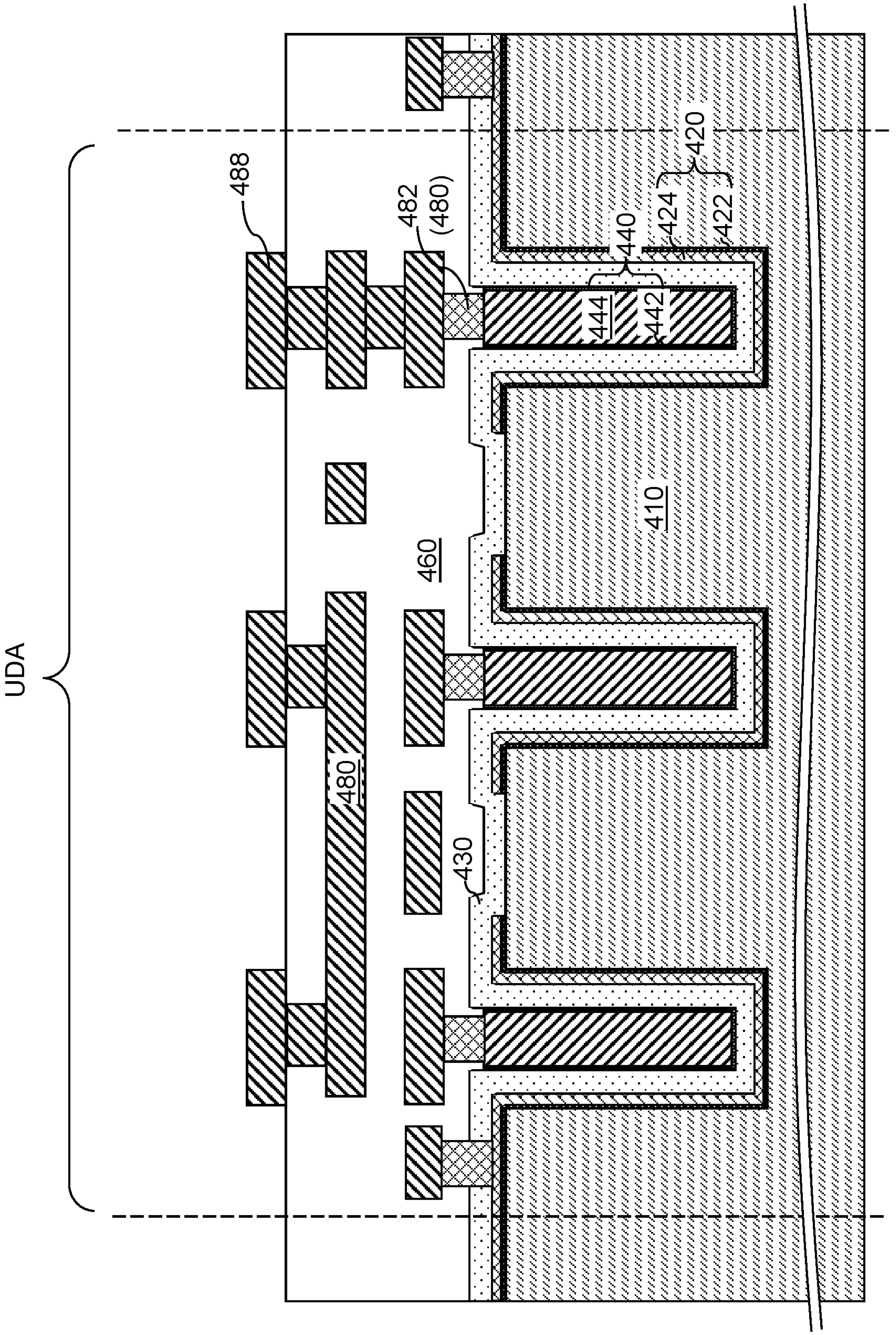
FIGS. 3A-3F are sequential vertical cross-sectional views of the embodiment intermediate structure of the present disclosure during formation of metal interconnect structures embedded in dielectric material layers, thinning of the backside of the silicon substrate, and formation of a backside metallic shield layer.

Referring to FIG. 3A, dielectric material layers 460 and metal interconnect structures 480 may be formed over the silicon substrate 410 and an array of TSV structures 440. The metal interconnect structures 480 may be embedded in the dielectric material layers 460, and comprise metal via structures 482 and various metal line structures (not expressly labeled). The dielectric material layers 460 may comprise silicon oxide-based interlayer dielectric materials such as undoped silicate glass, doped silicate glass, and/or organosilicate glass. Other suitable dielectric materials are within the contemplated scope of disclosure. Generally, the dielectric material layers 460 comprise non-polymer materials, and thus, differs from redistribution dielectric layers used in redistribution structures and containing a polymer dielectric material. The metal interconnect structures 480 may comprise copper-based metallic materials. Multiple wiring levels may be present in the metal interconnect structures 480. For example, at least one via level 482 and at least one line level, such as a plurality of via levels and a plurality of line levels, may be present in the metal interconnect structures 480. A via level refers to a level at which metal via structures 482 are present, and a line level refers to a level at which metal line structures are present. The total number of line levels in the metal interconnect structures 480 may be in a range from 1 to 10, although a greater number of line levels may also be used.

A subset of the metal via structures 482 may contact a top surface of a respective one of the TSV structures 440. Optionally, another subset of the metal via structures 482 may contact a horizontally-extending portion of a respective front metallic shield layer 420, and may be electrically connected to a respective subset of the metal interconnect structures 480. Metal pads may be formed at the topmost level of the metal interconnect structures 480. The metal pads are subsequently used to provide electrical contact to a respective silicon interconnect die, and thus, are herein referred to as interconnect-die metal pads 488. A first subset of the interconnect-die metal pads 488 may be interconnected to one another to facilitate signal transmission between different semiconductor dies to be subsequently connected to a same silicon interconnect die. A second subset of the interconnect-die metal pads 488 may be electrically connected to a respective one of the TSV structures through a respective subset of the metal interconnect structures 480. Optionally, another subset of the interconnect-die metal pads 488 may be electrically connected to a respective front metallic shield layer 420 so that the front metallic shield layers 420 may be electrically grounded during operation.

Figure 3B:
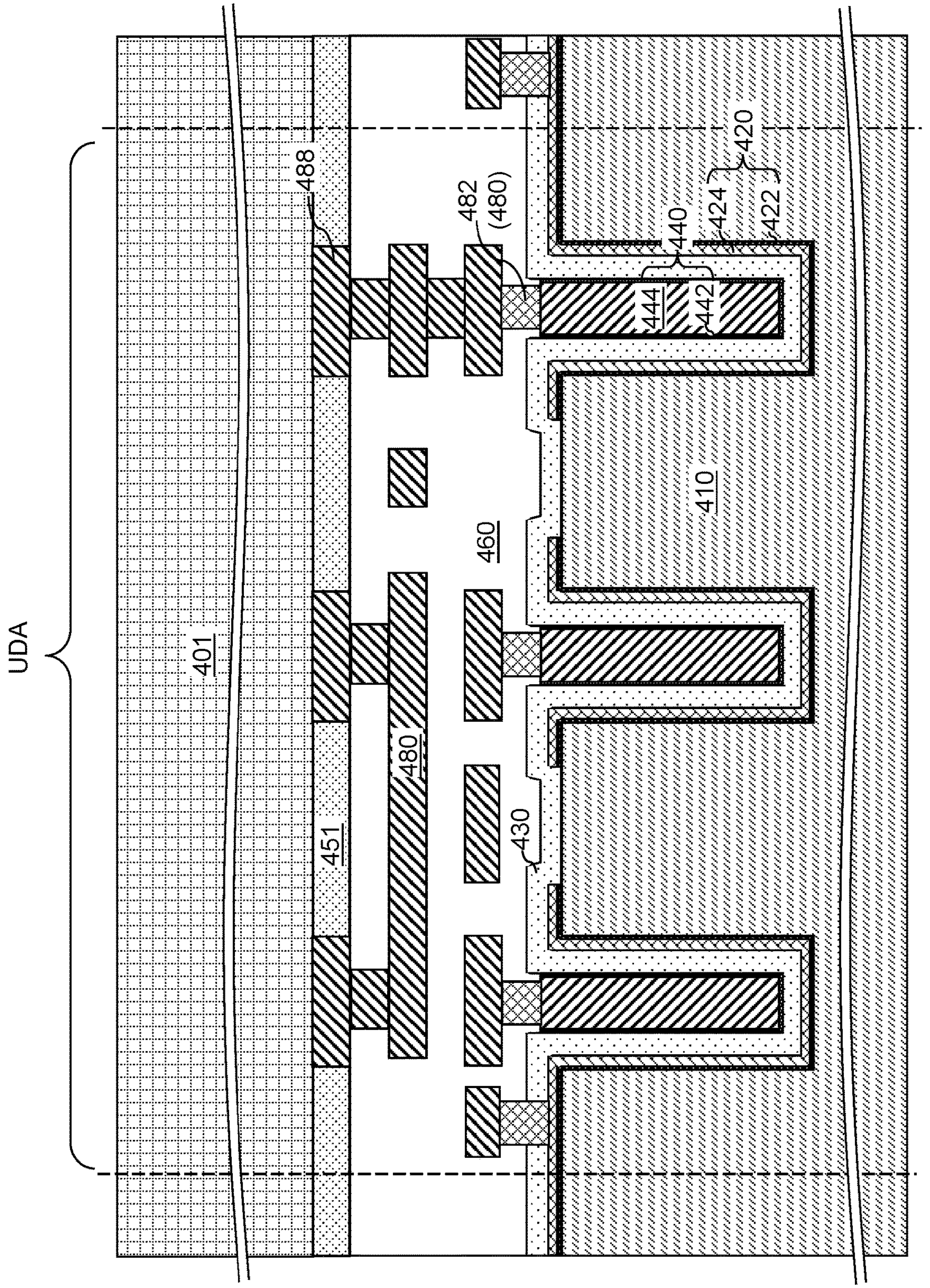

Referring to FIG. 3B, an adhesive layer 451 may be applied over the topmost surface of the dielectric material layers 460, for example, around the interconnect-die metal pads 488. A carrier wafer, which is herein referred to as a silicon interconnect carrier wafer 401 can be attached to the top side of a semiconductor device wafer (i.e., a wafer including semiconductor devices) including the semiconductor substrate 410, the arrays of TSV structures 440, the metal interconnect structures 480 embedded in the dielectric material layers 460, and the interconnect-die metal pads 488. The silicon interconnect carrier wafer 401 may comprise a semiconductor wafer, an insulator layer, a conductive wafer, or a composite wafer provided that the silicon interconnect carrier wafer 401 provides sufficient mechanical strength for subsequent handling of the semiconductor device wafer during thinning of the backside of the silicon substrate 410. The thickness of the silicon interconnect carrier wafer 401 may be in a range from 500 microns to 2 mm, although lesser and greater thicknesses may also be used.

Figure 3C:
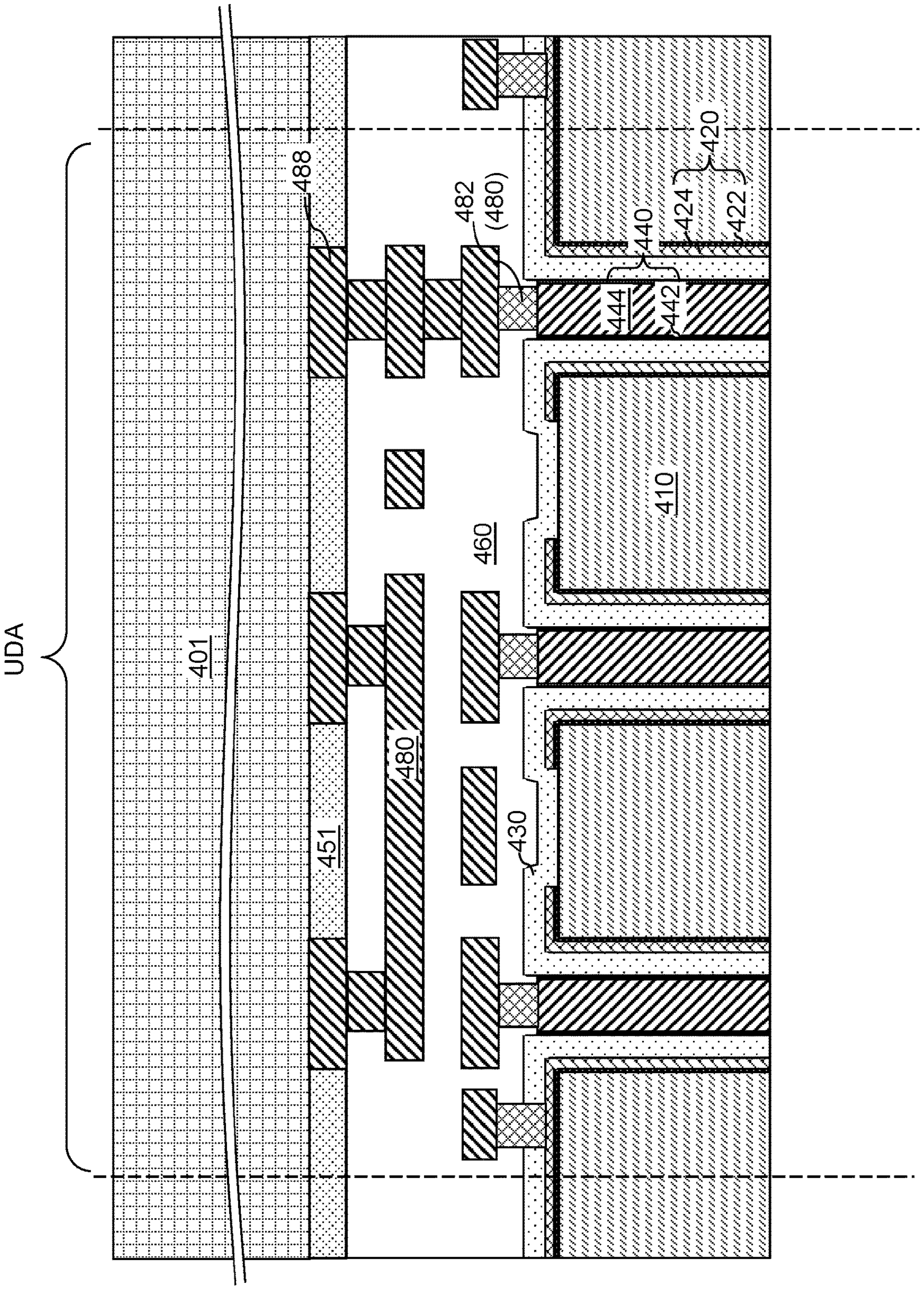

Referring to FIG. 3C, the backside of the silicon substrate 410 may be removed (e.g., thinned), for example, by grinding, polishing, an anisotropic etch process, and/or an isotropic etch process. Upon removal of a predominant portion of the silicon substrate 410 that underlies the bottommost surfaces of the trenches 409, a chemical mechanical polishing (CMP) process may be performed to remove bottom portions of the front metallic shield layer(s) 420 and bottom portions of the insulating spacer layers 430. In one embodiment, an overpolish step may be performed at a terminal step of the CMP process to remove bottom portions of the TSV structures 440. In one embodiment, horizontally-extending portions of the TSV liners 442 may be removed, and bottom surfaces of the TSV core portions 444 may be physically exposed after the CMP process.

Generally, bottom surfaces of the TSV structures 440 are exposed, and bottom capping portions of the front metallic shield layer(s) 420 and the insulating spacer layer 430 are removed upon thinning of the backside of the silicon substrate 410. In one embodiment, annular bottom surfaces of the front metallic shield layer(s) 420, annular bottom surfaces of the insulating spacer layer 430, bottom surfaces of the TSV structures 440, and a backside surface (i.e., a bottom surface) of the silicon substrate 410 may be formed within a same horizontal plane after the CMP process. Remaining portions of the trenches 409 are converted into openings that vertically extend through the silicon substrate 410 as thinned by the thinning process, which are hereafter referred to as through-substrate openings.

Figure 3D:
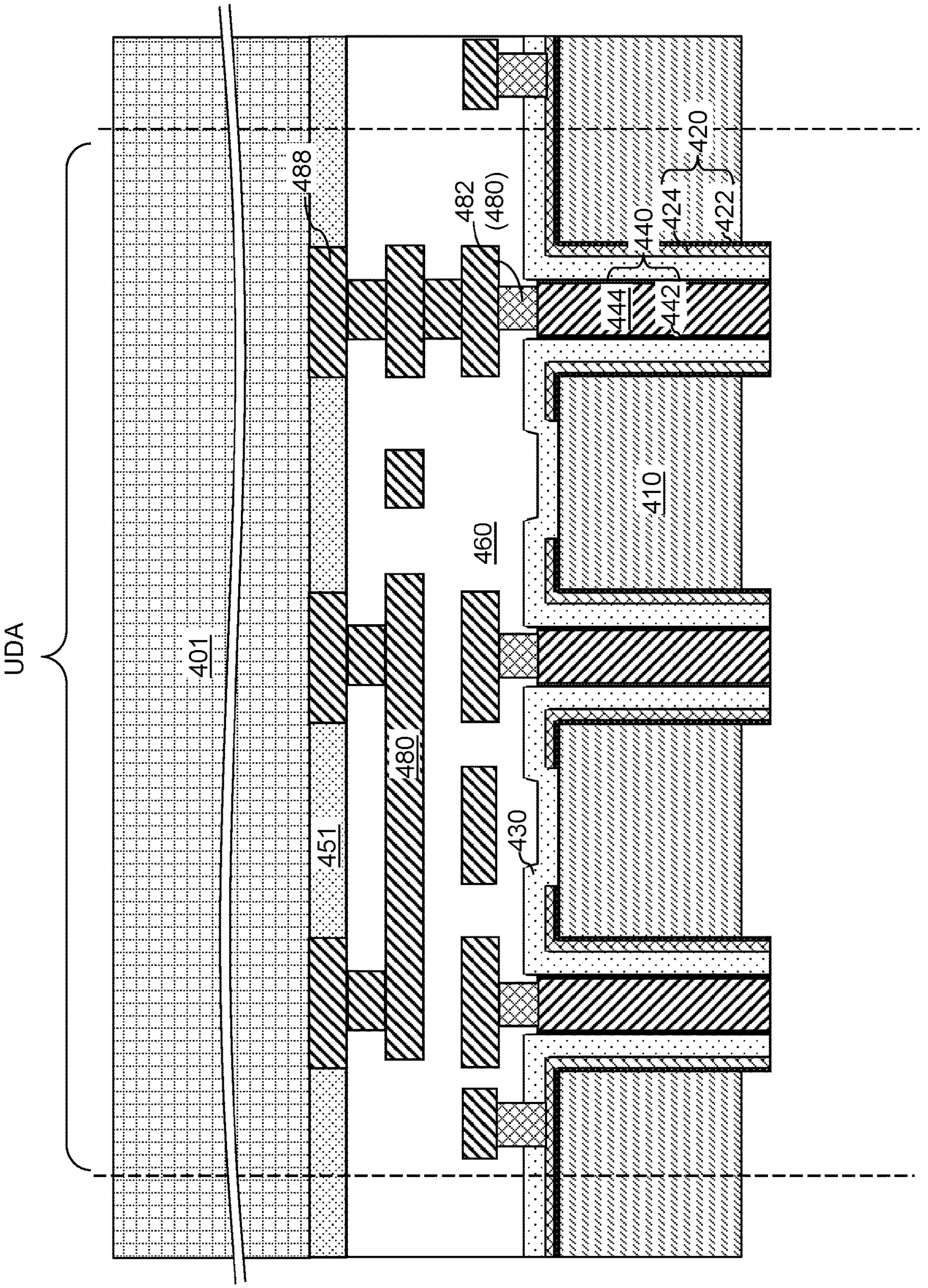

Referring to FIG. 3D, a bottom surface of the silicon substrate 410 may be selectively recessed vertically (i.e., upward in the illustrated orientation of FIG. 3D) after thinning the backside of the silicon substrate 410. For example, a wet etch process using tetramethylammonium hydroxide (TMAH) or potassium hydroxide (KOH) may be performed to etch the silicon material of the silicon substrate 410 selective to (i.e., without significantly etching) the materials of the front metallic shield layer(s) 420, the insulating spacer layer 430, and the TSV structures 440. The vertical recess distance of the silicon substrate 410 may be in a range from 200 nm to 5 microns, such as from 1 micron to 3 microns, although lesser and greater vertical recess distances may also be used. Generally, the bottom surface of the silicon substrate 410 may be vertically recessed upward with respect to bottom surfaces of the TSV structures 440. Cylindrical bottom segments of outer sidewalls of the vertically-extending cylindrical portions of the front metallic shield layers 420 may be physically exposed. In one embodiment, cylindrical bottom segments of outer sidewalls of the vertically-extending cylindrical portions of the front metallic barrier layers 422 may be physically exposed to the ambient.

Figure 3E:
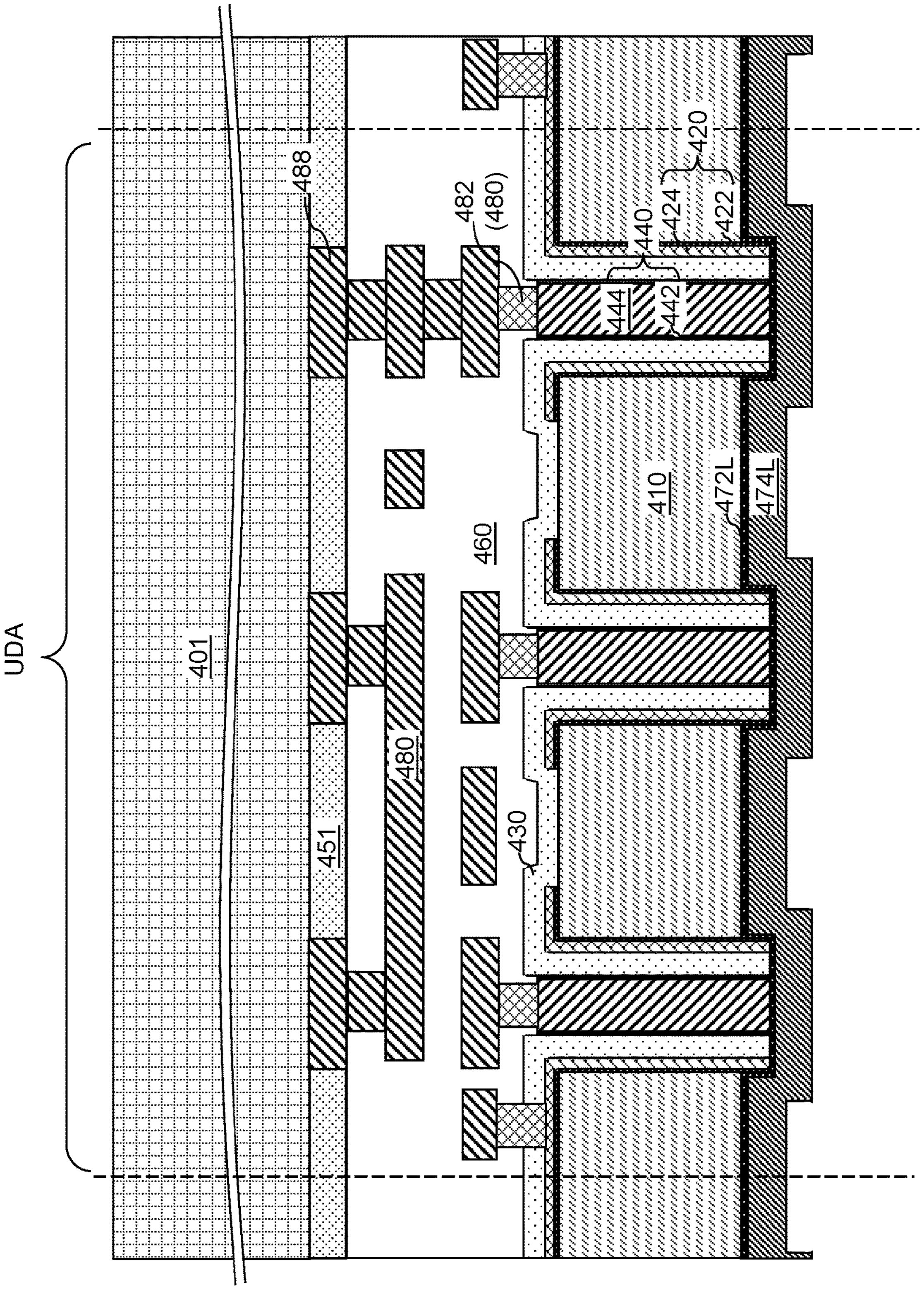

Referring to FIG. 3E, a backside metallic shield layer 470 may be formed on the backside surface of the silicon substrate 410 and around each protruding portions of the front metallic shield layer(s) 420, the insulating spacer layer 430, and the TSV structures 440. The backside metallic shield layer 470 (see FIG. 3F) may be formed directly on a planar bottom surface of the silicon substrate 410, directly on cylindrical surface segments of the front metallic barrier layers 422, directly on annular bottom surfaces of the vertically-extending cylindrical portions of the front metallic shield layers 430, directly on annular bottom surfaces of vertically-extending cylindrical portions of the insulating spacer layer 430, and directly on bottom surfaces of the TSV structures 440. In one embodiment, the backside metallic shield layer 470 comprises a backside metallic barrier layer 472L comprising a metallic barrier material, and a backside metal layer 474L comprising a high conductivity metal. The metallic barrier material comprises a metallic diffusion barrier material that blocks diffusion of the metal in the backside metal layer 474L into the silicon substrate 410. For example, the metallic barrier material may comprise at least one material such as TIN, TaN, WN, MON, Ti, Ta, W, an alloy thereof, and/or a layer stack thereof. The thickness of the backside metallic barrier layer 472L may be in a range from 10 nm to 100 nm, although lesser and greater thicknesses may also be used. The backside metallic barrier layer 472L may be formed by chemical vapor deposition or physical vapor deposition. The backside metal layer 474L may comprise Cu, W, Mo, Co, Ru, etc., and may be formed by chemical vapor deposition, physical vapor deposition, electroplating, electroless plating, or a combination thereof. The thickness of the backside metal layer 474L may be in a range from 200 nm to 5 microns, although lesser and greater thicknesses may also be used.

Figure 3F:
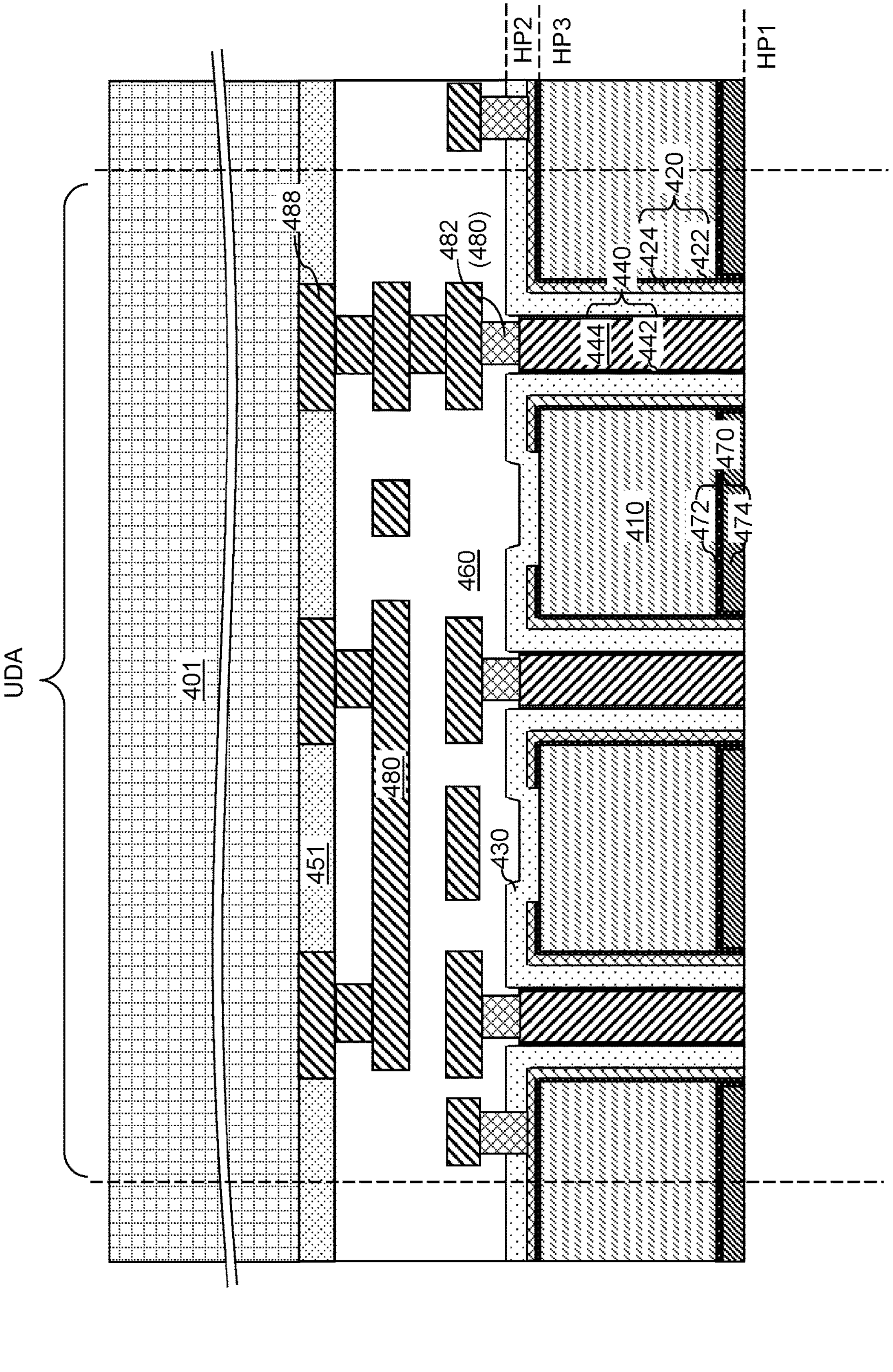

Referring to FIG. 3F, a chemical mechanical polishing (CMP) process may be performed to remove portions of the backside metallic shield layer 470 that underlie the horizontal plane including the annular bottom surfaces of the insulating spacer layer 430. The remaining portion of the backside metallic shield layer 470 (e.g., 472, 474) may be located entirely above a first horizontal plane HP1 including the annular bottom surfaces of the insulating spacer layer 430. In one embodiment, all bottom surfaces of the TSV structures 440, the annular bottom surfaces of cylindrical vertically-extending portions of the front metallic shield layer(s) 420, and the entirety of the bottom surface of the backside metallic shield layer 470 may be formed within the first horizontal plane HP1. In one embodiment, top surfaces of the TSV structures 440 may be located below a second horizontal plane HP2 including a topmost surface of the insulating spacer layer 430. In addition, top surfaces of the TSV structures 440 may be located above, at, or below a third horizontal plane HP3 including the top surface of the silicon substrate 410.

Generally, the backside metallic shield layer 470 may be formed such that the backside metallic shield layer 470 contacts regions of vertically-extending cylindrical portions of the front metallic shield layer 420. In one embodiment, the backside metallic shield layer 470 is formed directly on the bottom segments of the outer sidewalls of the vertically-extending cylindrical portions of each front metallic shield layer 420. In one embodiment, each of the TSV structures 440 is laterally spaced from the backside metallic shield layer 470 by a respective tubular vertically-extending portion of the insulating spacer layer 430. In one embodiment, the backside metallic shield layer 470 may be formed within a volume vertically bounded by the bottom surface of the silicon substrate 410 and the first horizontal plane HP1 which includes bottom surfaces of the TSV structures 440.

Figure 3G:
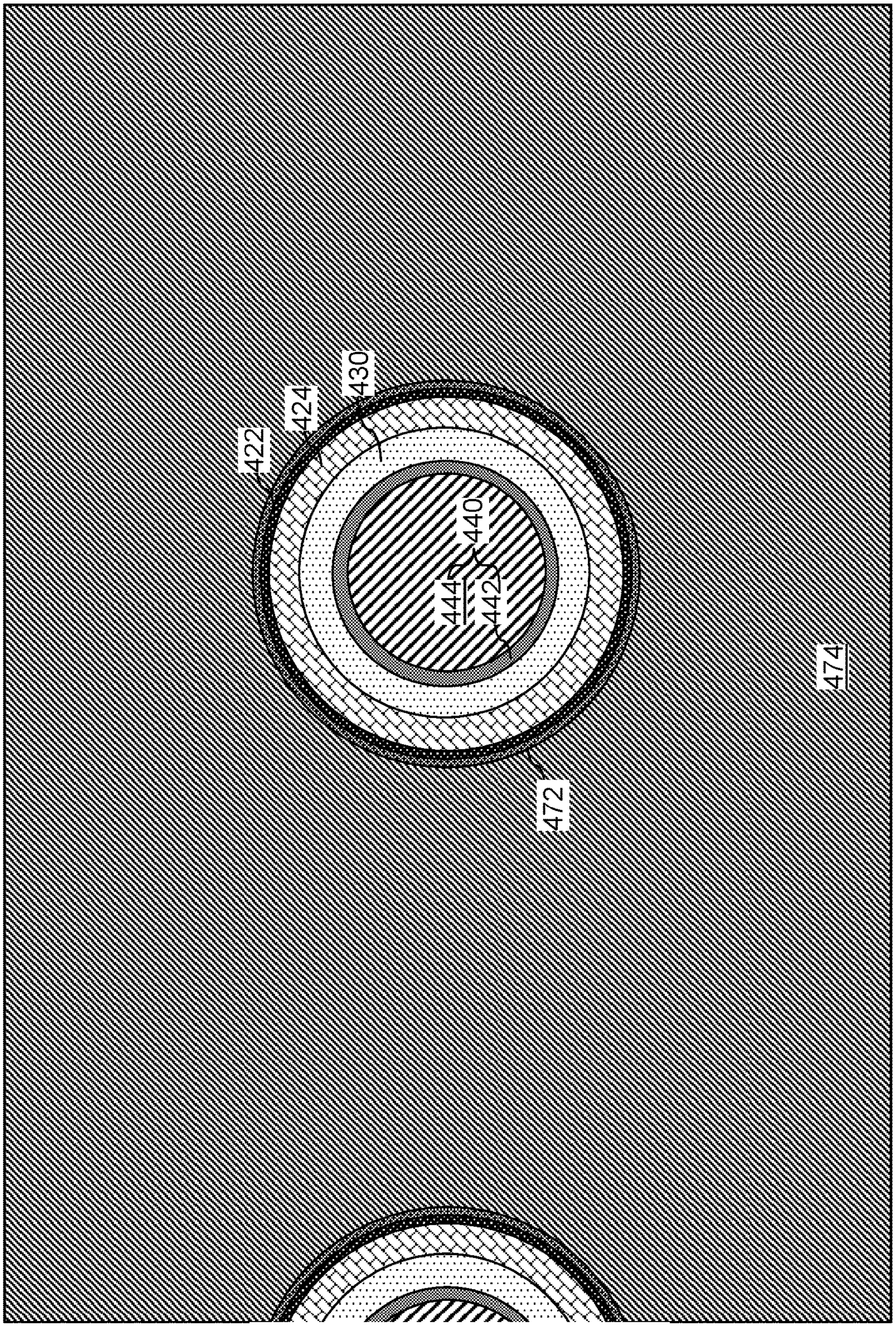
FIGS. 3G and 3H are bottom-up views of a region of the embodiment structure of FIG. 3F or an alternative configuration thereof.
Figure 3H:
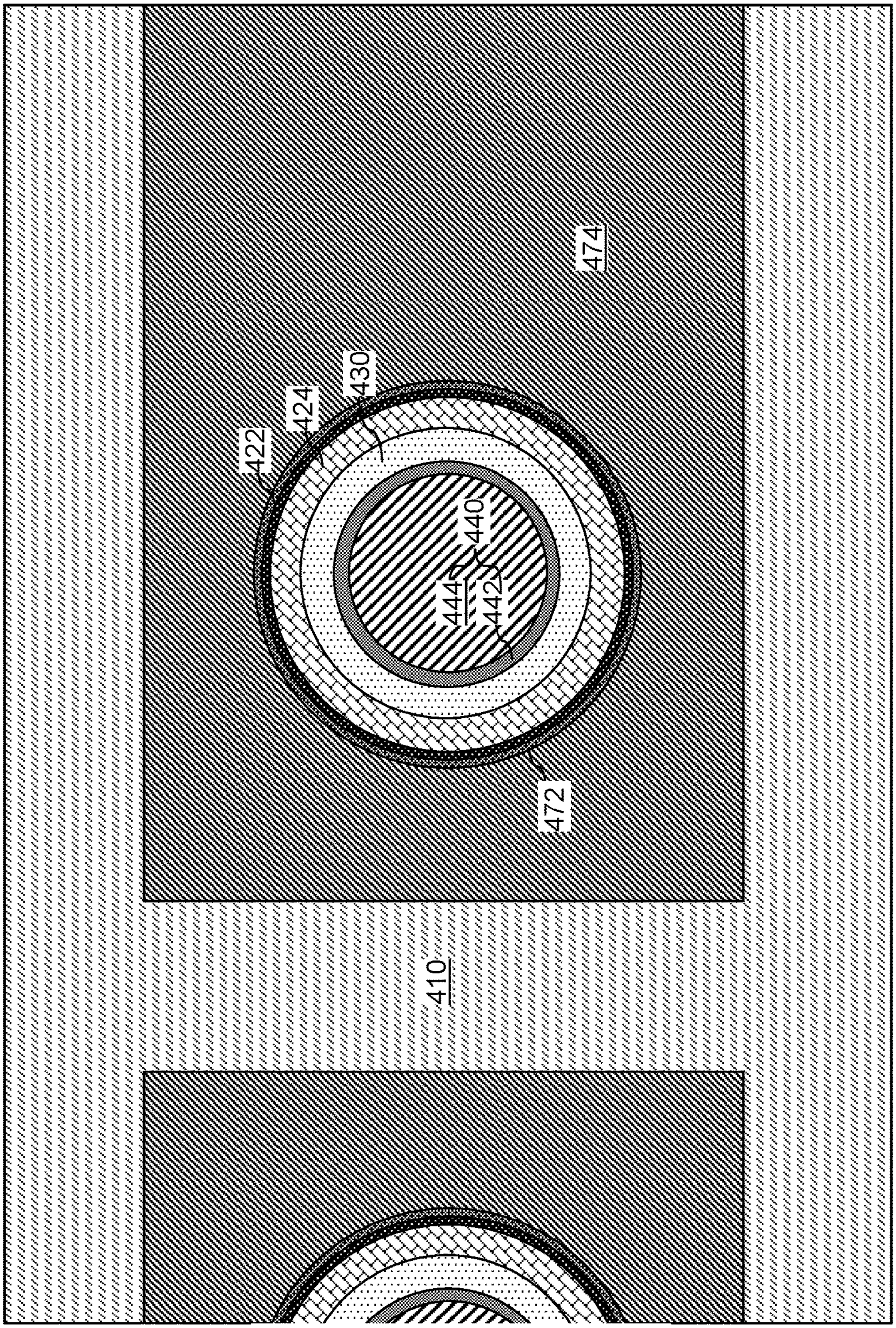

FIGS. 3G and 3H are bottom-up views of a region of the embodiment structure of FIG. 3F or an alternative configuration thereof. Specifically, FIG. 3G is a bottom-up view of a region of the embodiment structure of FIG. 3F. FIG. 3H is a bottom-up view of a region of an alternative configuration of the embodiment structure of FIG. 3F that may be formed by subsequently patterning the backside metallic shield layer 470 into a plurality of backside metallic shield layers 470 each laterally surrounding and contacting a respective subset of the cylindrical vertically-extending portions of the front metallic shield layer 420.

In one embodiment in which the processing steps of FIG. 2C are omitted or a front metallic shield layer 420 continuously extends between, and laterally surrounds, two or more trenches 409, the backside metallic shield layer 470 may continuously extends from a first vertically-extending cylindrical portion of a front metallic shield layer 420 laterally surrounding a first TSV structure 440 selected from the TSV structures 440 to a second vertically-extending cylindrical portion of the front metallic shield layer 420 laterally surrounding a second TSV structure 440 selected from the TSV structures 440.

Subsequently, the silicon interconnect carrier wafer 401 can be detached from the semiconductor device wafer by deactivating the adhesive layer 451. In one embodiment, the adhesive layer 451 may be deactivated by performing a thermal treatment. Alternatively, in embodiments in which the silicon interconnect carrier wafer 401 is transparent and if the adhesive layer 451 comprises an ultraviolet-sensitive material, the adhesive layer 451 may be deactivated by irradiating the adhesive layer 451 with ultraviolet radiation. A suitable clean process may be performed to remove residual portions of the adhesive layer 451 from the front side of the semiconductive device wafer.

Subsequently, a dicing process may be performed to singulate each silicon interconnect die from the two-dimensional array of silicon interconnect dies located within the semiconductor device wafer. The area of each silicon interconnect die corresponds to the area of a respective unit die area UDA.

FIGS. 4A-4D are vertical cross-sectional views of various configurations of a silicon interconnect die 405 of the present disclosure, which may be one of the silicon interconnect dies 405 obtained upon performing the singulation process.

Figure 4A:
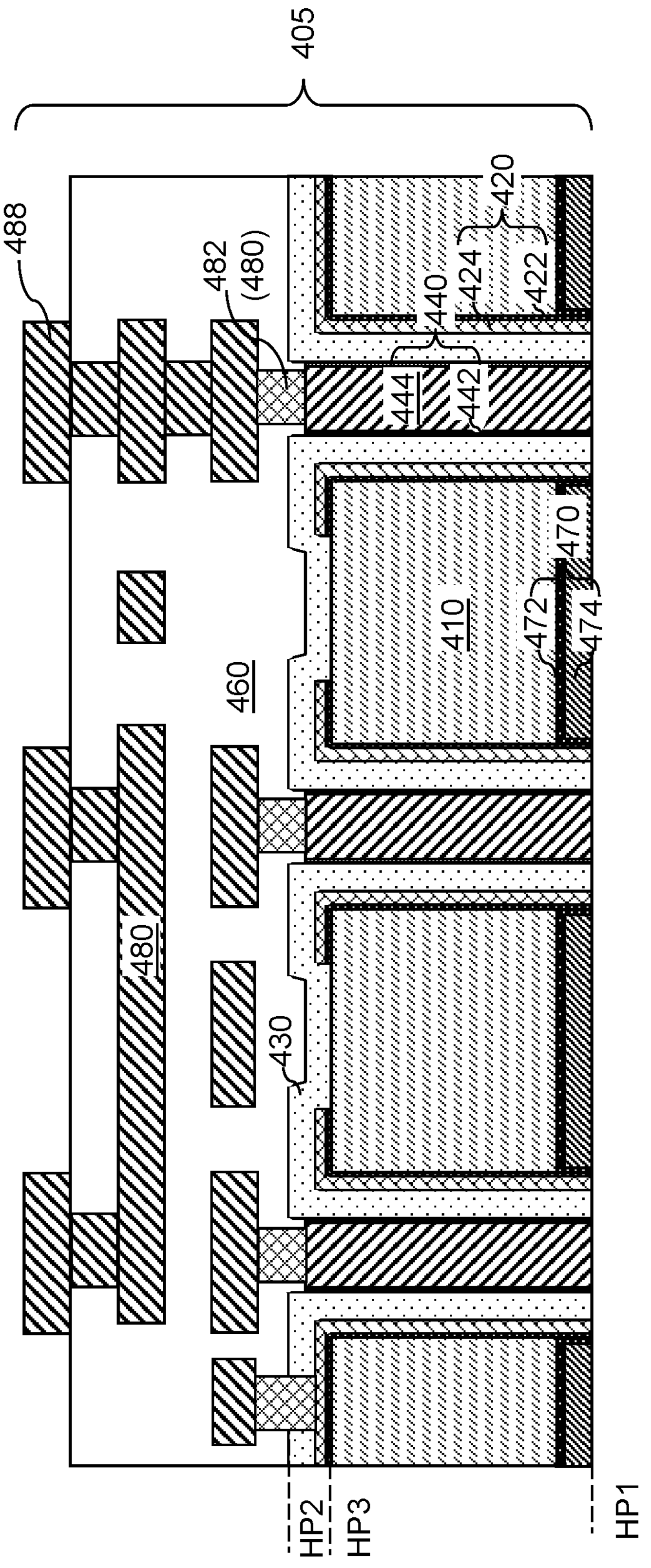
FIGS. 4A-4D are vertical cross-sectional views of various configurations of a silicon interconnect die of the present disclosure.

FIG. 4A illustrates a first configuration of an silicon interconnect die 405 according to an embodiment of the present disclosure, which may be obtained by singulating the semiconductor device wafer illustrated in FIG. 3F.

Figure 4B:
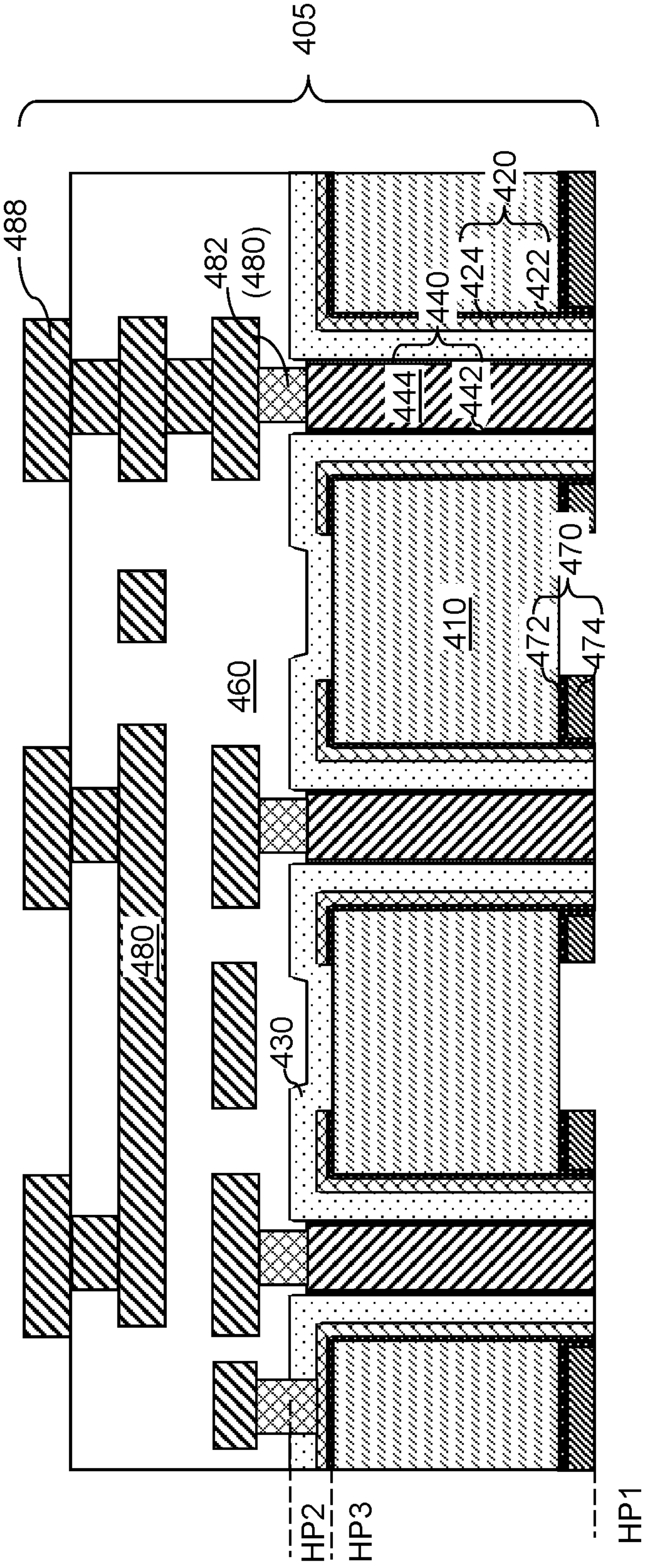

FIG. 4B illustrates a second configuration of an silicon interconnect die 405 according to an embodiment of the present disclosure, which may be obtained by patterning the backside metallic shield layer 470 after performing the processing steps described with reference to FIG. 3F and prior to singulating the semiconductor device wafer. In this embodiment, the backside metallic shield layer 470 may be divided into multiple backside metallic shield layers 470 that laterally encloses a respective subset of the TSV structures 440. Each backside metallic shield layer 470 may laterally surround one or more of the TSV structures 440.

Figure 4C:
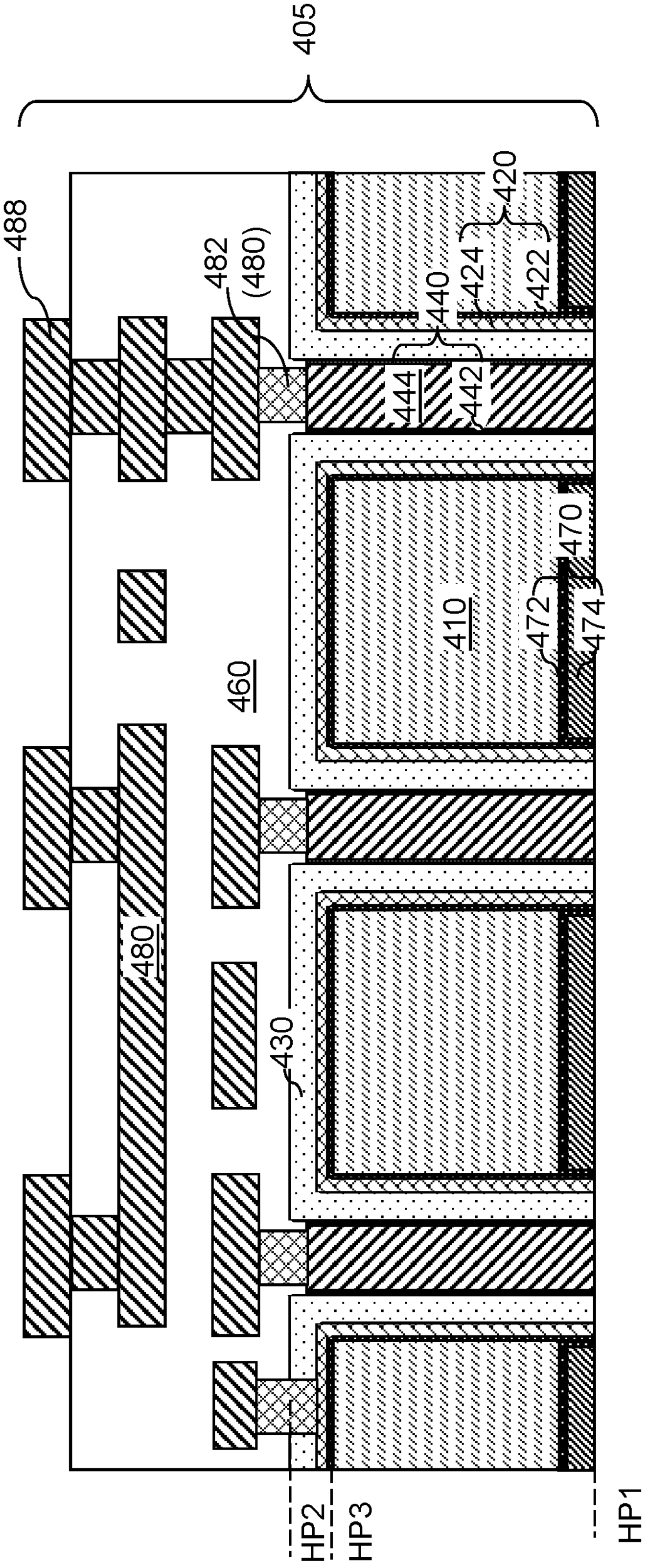

FIG. 4C illustrates a third configuration of an silicon interconnect die 405 according to an embodiment of the present disclosure, which may be obtained by omitting the processing steps described with reference to FIG. 2C. In this embodiment, the front metallic shield layer 420 may continuously extend over the entire top surface of the semiconductor substrate 410 between each opposing pair of sidewalls of the semiconductor substrate 410, i.e., from one end of the semiconductor substrate 410 to another end of the semiconductor substrate 410.

Figure 4D:
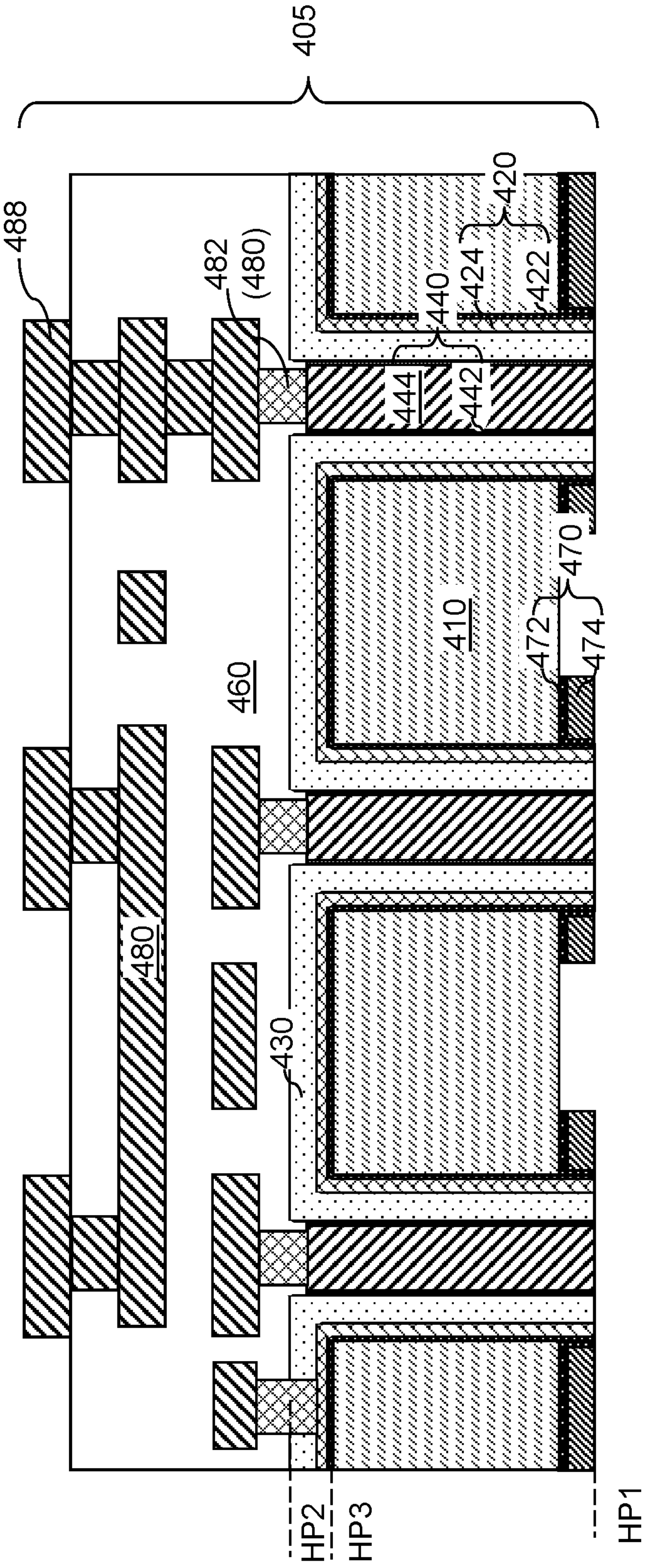

FIG. 4D illustrates a fourth configuration of an silicon interconnect die 405 according to an embodiment of the present disclosure, which may be derived from the second configuration of an silicon interconnect die 405 illustrated in FIG. 4B by omitting the processing steps described with reference to FIG. 2C.

Referring collectively to FIGS. 4A-4D and according to various embodiments of the present disclosure, a silicon interconnect die 405 is provided, which comprises: through-substrate via (TSV) structures 440 extending through a silicon substrate 410; an insulating spacer layer 430 including a horizontally-extending portion overlying a top surface of the silicon substrate 410 and a plurality of tubular insulating material portions vertically extending through a respective one of the through-substrate openings and laterally surrounding a respective one of the TSV structures 440;

and a front metallic shield layer 420 including a horizontally-extending metallic shield portion and at least one tubular metallic shield portion laterally surrounding a respective one of the tubular insulating material portions.

In one embodiment, each of the at least one tubular metallic shield portions is in contact with a respective cylindrical sidewall of the silicon substrate 410. In one embodiment, the horizontally-extending metallic shield portion contacts a top surface of the silicon substrate 410. In one embodiment, the silicon interconnect die 405 comprises a backside metallic shield layer 470 located on a backside surface of the silicon substrate 410 and contacting each of the at least one tubular metallic shield portion. In one embodiment, each of the at least one tubular metallic shield portion comprises a respective bottom surface located within a first horizontal plane HP1 that includes a backside surface of the backside metallic shield layer 470. In one embodiment, the TSV structures 440 have planar bottom surfaces located within the first horizontal plane HP1.

In one embodiment, each of the at least one tubular metallic shield portion comprises a respective outer cylindrical sidewall of which a bottom portion is in direct contact with a respective sidewall of the backside metallic shield layer 470. In one embodiment, each of the plurality of tubular insulating material portions has a respective annular bottom surface located within a first horizontal plane HP1 that includes a backside surface of the backside metallic shield layer 470. In one embodiment, the TSV structures 440 have top surfaces located below a horizontal plane including a top surface of the horizontally-extending portion of the insulating spacer layer 430. In one embodiment, the at least one tubular metallic shield portion comprises an inner cylindrical sidewall that contacts an outer cylindrical sidewall of a respective tubular insulating material portion selected from the plurality of tubular insulating material portions.

Figure 5:
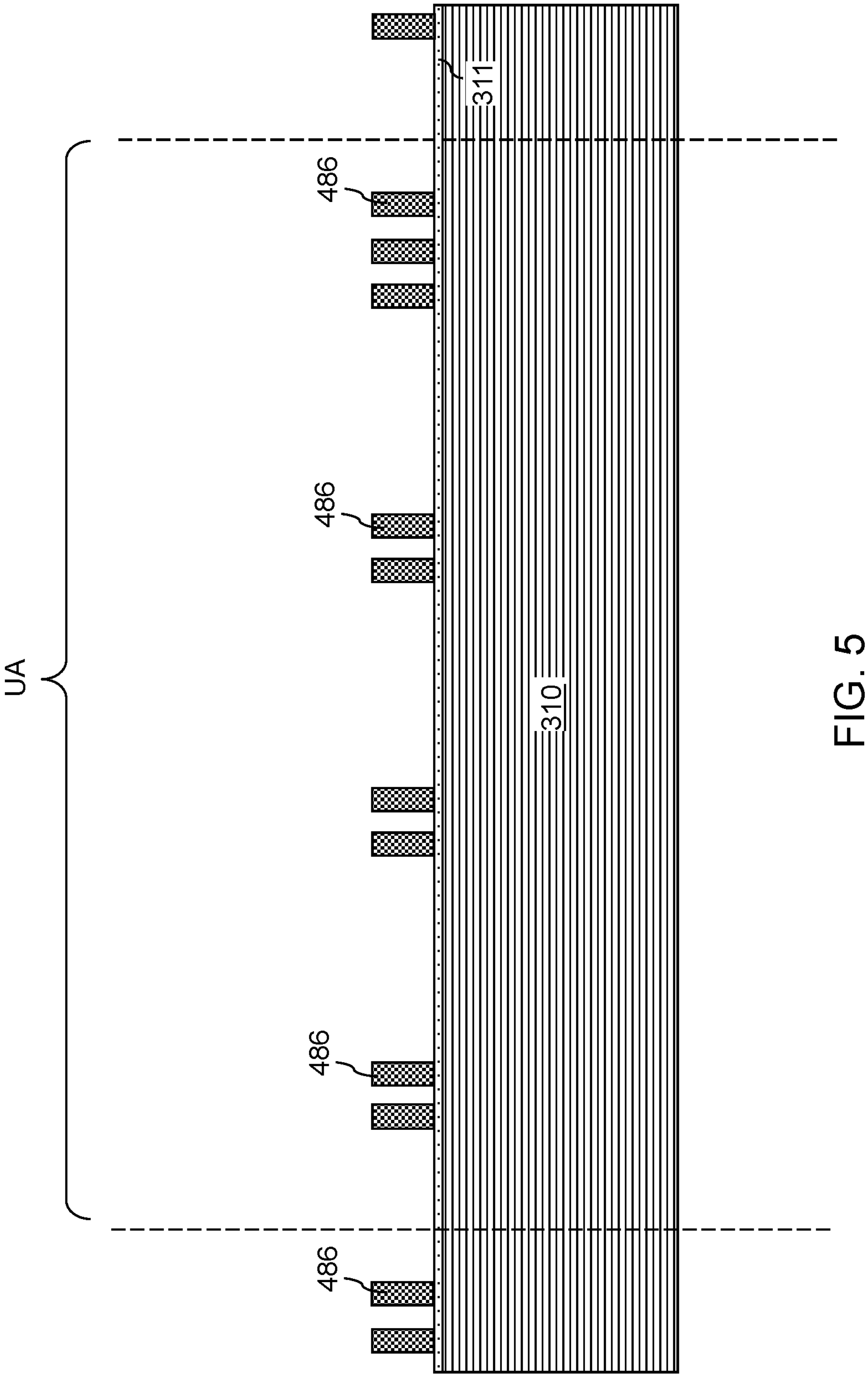
FIG. 5 is a vertical cross-sectional view of an embodiment intermediate structure of the present disclosure for forming an interposer after disposing through-interposer via structures over a first carrier wafer.

Referring to FIG. 5, an embodiment intermediate structure of the present disclosure for forming a composite interposer is illustrated after disposing through-interposer via structures 486 over a first carrier wafer 310. The first carrier wafer 310 may include an optically transparent substrate such as a glass substrate or a sapphire substrate, or may comprise a semiconductor substrate such as a silicon substrate. The diameter of the first carrier wafer 310 may be in a range from 150 mm to 450 mm, although lesser and greater diameters may be used. The thickness of the first carrier wafer 310 may be in a range from 500 microns to 2,000 microns, although lesser and greater thicknesses may also be used. Alternatively, the first carrier wafer 310 may be provided in a rectangular panel format. A first adhesive layer 311 may be applied to a front-side surface of the first carrier wafer 310. In one embodiment, the first adhesive layer 311 may be a light-to-heat conversion (LTHC) layer. Alternatively, the first adhesive layer 311 may include a thermally decomposing adhesive material.

A two-dimensional repetition of a unit via assembly may be formed over a first carrier wafer 310. Each instance of the unit via assembly may be formed within a respective unit area UA having a rectangular area. Multiple instances of the unit via assembly may be repeated along a first horizontal direction and along a second horizontal direction that is perpendicular to the first horizontal direction. The unit area UA corresponds to the area of an interposer die to be subsequently formed. For example, each unit area UA may have a rectangular shape having a first side length along the first horizontal direction and having a second side length along the second horizontal direction. The first side length may be the length of a pair of first sides of the rectangular shape. The second side length may be the length of a pair of second sides of the rectangular shape. The first side length and the second side length may be independently in a range from 300 microns to 6 cm, although lesser and greater dimensions may also be used.

Each instance of the unit via assembly may be formed within a respective unit area UA of repetition, and comprises a respective set of through-interposer-via (TIV) structures 486. The TIV structures 486 may be conductive via structures that provide vertical electrical connections within an interposer, i.e., an interposer that includes redistribution structures that provide a fan-out configuration such that bonding pads on one side of the interposer and bonding pads on another side of the interposer have different pitches.

Generally, the TIV structures 486 may be formed over the first adhesive layer 311 by deposition and patterning of a conductive material, or by transfer from another carrier wafer. In an illustrative example, a sacrificial matrix layer (not shown) may be formed over the first adhesive layer 311. The sacrificial matrix layer comprises a sacrificial material such as amorphous carbon, diamond-like carbon (DLC), a semiconductor material (such as amorphous silicon or a silicon-germanium alloy), or a dielectric material such as silicate glass or organosilicate glass. The thickness of the sacrificial matrix layer may be in a range from 3 microns to 60 microns, although lesser and greater thicknesses may also be used. A photoresist layer (not shown) may be applied over the sacrificial matrix layer. The photoresist layer may be lithographically pattered to form openings having a same pattern as the TIV structures 486 to be subsequently formed in a top-down view. An anisotropic etch process may be formed to transfer the pattern of the openings in the photoresist layer. Cylinder cavities may be formed through the sacrificial matrix layer underneath the openings in the photoresist layer. The photoresist layer may be removed for example, by ashing. At least one conductive material, such as at least one metallic material, may be deposited in the cylindrical cavities. For example, the at least one conductive material may comprise a conducive metallic barrier material (such as TiN, TaN, WN, or MoN) and a metallic fill material (such as W, Ti, Ta, Mo, Ru, Co, etc.). Excess portions of the at least one conductive material it may be removed from above the horizontal plate including the sacrificial matrix layer. Remaining portions of the at least one conductive material that fill the cylindrically cavities comprise the TIV structures 486. Subsequently, the sacrificial matrix layer may be removed selective to the TIV structures 486 and selective to the adhesive material layer 311.

Alternatively, at least one conductive material layer may be deposited as a blanket material layer, i.e., as an unpatterned material layer having a uniform thickness throughout. For example, the at least one conductive material layer may comprise a conducive metallic barrier material (such as TiN, TaN, WN, or MoN) and a metallic fill material (such as W, Ti, Ta, Mo, Ru, Co, etc.). The thickness of the at least one conductive material layer may be in a range from 3 microns to 60 microns, although lesser and greater thicknesses may also be used. A photoresist layer (not shown) may be applied over the at least one conductive material layer. The photoresist layer may be lithographically pattered to form discrete photoresist material portions having a same pattern as the TIV structures 486 to be subsequently formed in a top-down view. An anisotropic etch process may be formed to transfer the pattern of the discrete photoresist material portions through the at least one conductive material layer. Patterned portions of the at least one conductive material layer comprise the TIV structures 486.

In a further alternative embodiment, the TIV structures 486 may be formed on another carrier wafer, and may be attached to the top surface of the adhesive layer 311. The TIV structures 486 may be subsequently detached from the additional carrier wafer.

Figure 6:
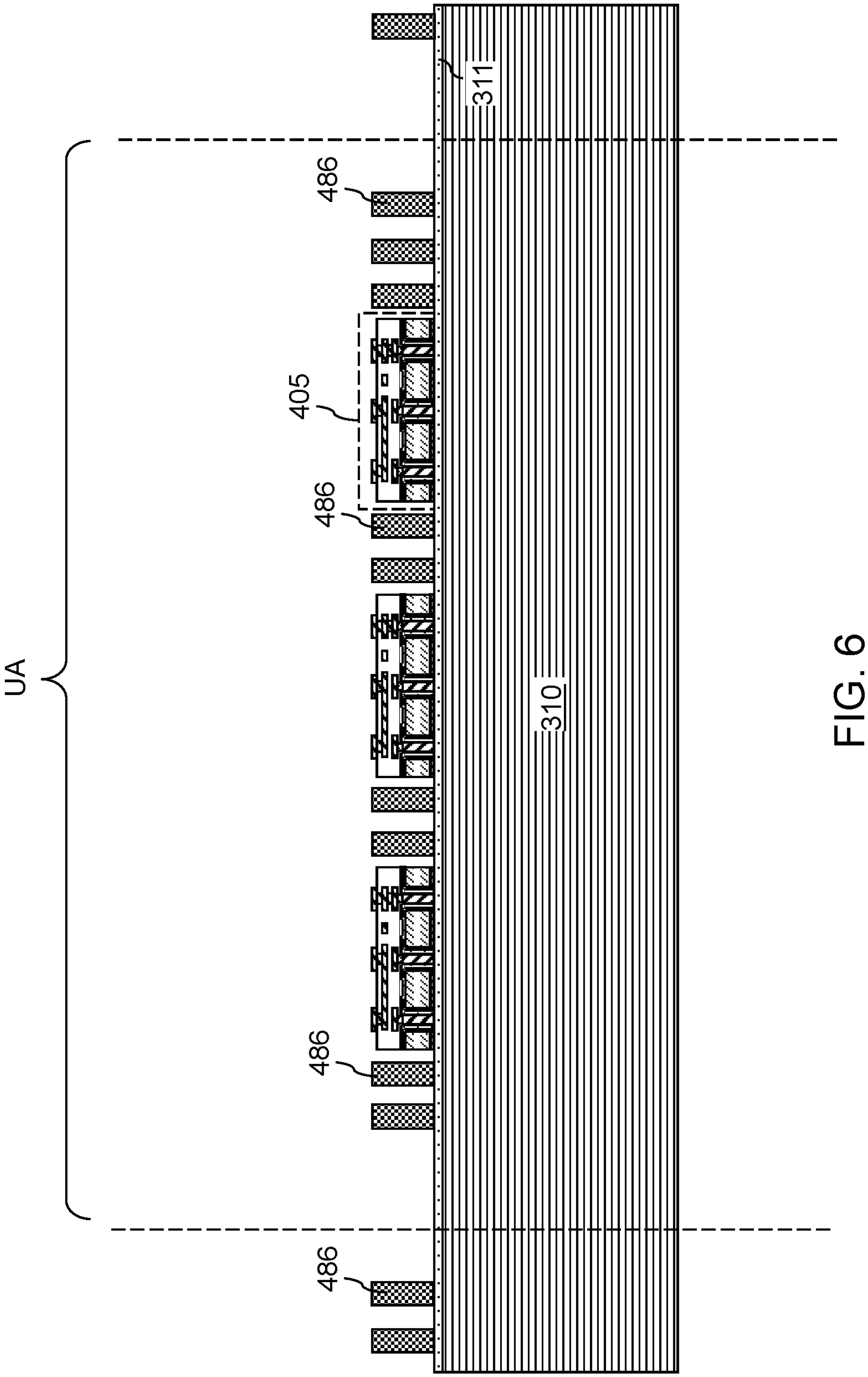
FIG. 6 is a vertical cross-sectional view of the embodiment intermediate structure of the present disclosure after placement of silicon interconnect dies over the carrier wafer.

Referring to FIG. 6, a plurality of silicon interconnect dies 405 may be provided. Each silicon interconnect die 405 may be as described above with reference to FIGS. 4A-4D. The silicon interconnect dies 405 may be placed within openings in the arrays of the TIV structures 486 on the top surface of the first adhesive layer 311. Generally, a pick and place tool may be used to place at least one silicon interconnect die 405 within each unit area UA. At least one silicon interconnect die 405 may be placed within each unit area UA of repetition using the pick and place tool. In one embodiment, a plurality of silicon interconnect dies 405 may be placed within each unit area UA of repetition using the pick and place tool. In one embodiment, the silicon interconnect dies 405 may be placed such that the backside metallic shield layers 470 and bottom surfaces of the TSV structures 440 contact the first adhesive layer 311, and the interconnect-die metal pads 488 face up.

Figure 7:
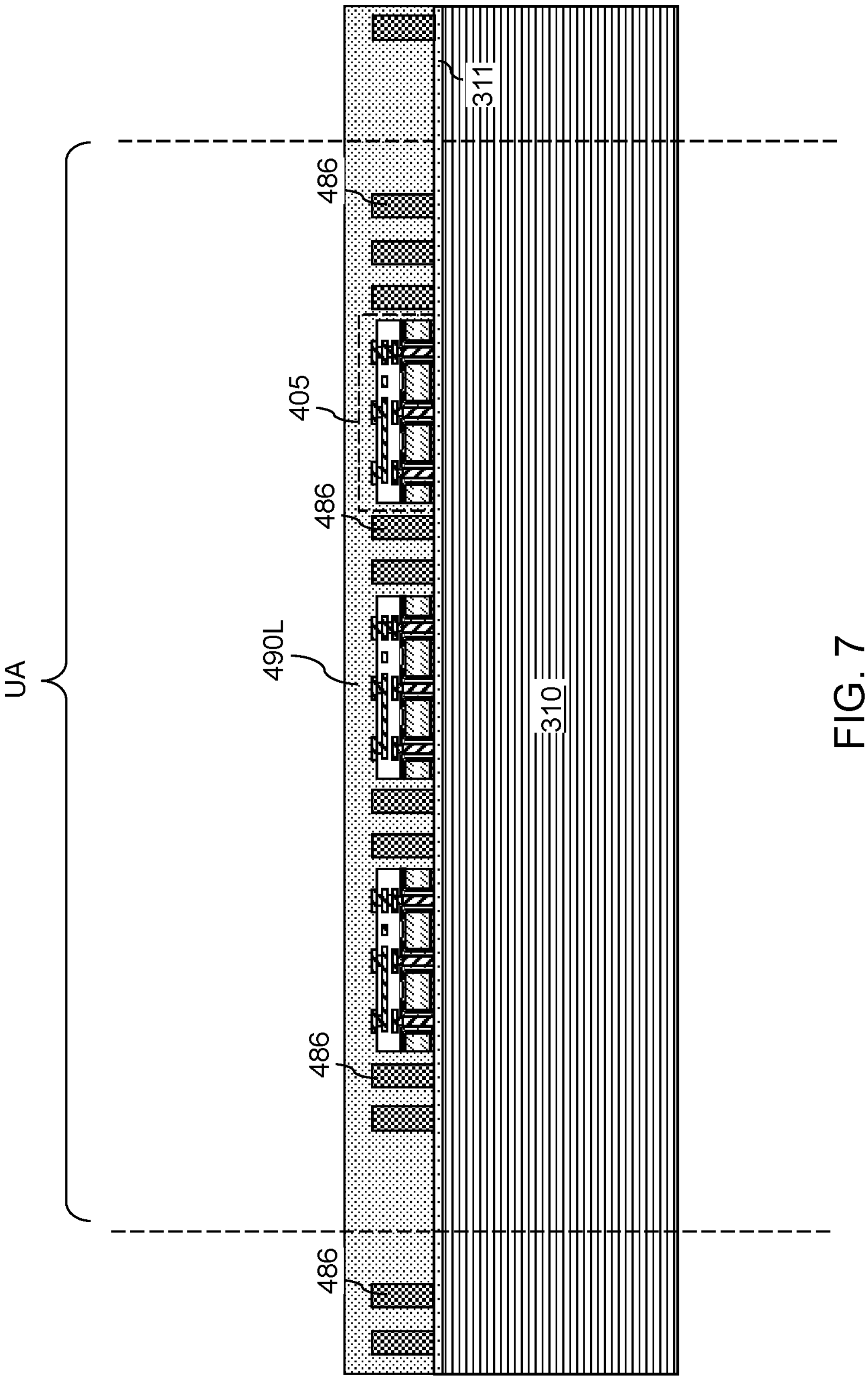
FIG. 7 is a vertical cross-sectional view of the embodiment intermediate structure of the present disclosure after formation of an interposer-level molding compound material layer.

Referring to FIG. 7, an encapsulant, such as a molding compound (MC) may be applied to the gaps within the assembly of the silicon interconnect dies 405 and the TIV structures 486. The MC includes an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability.

The MC may be cured at a curing temperature to form an MC matrix, which is herein referred to as a first molding compound (MC) material layer or an interposer-level molding compound (MC) material layer 490L. The interposer-level MC material layer 490L laterally encloses each of the silicon interconnect dies 405 and the TIV structures 486. The interposer-level MC material layer 490L may be a continuous material layer that extends across the entirety of the area of a reconstituted wafer overlying the first carrier wafer 310.

Figure 8:
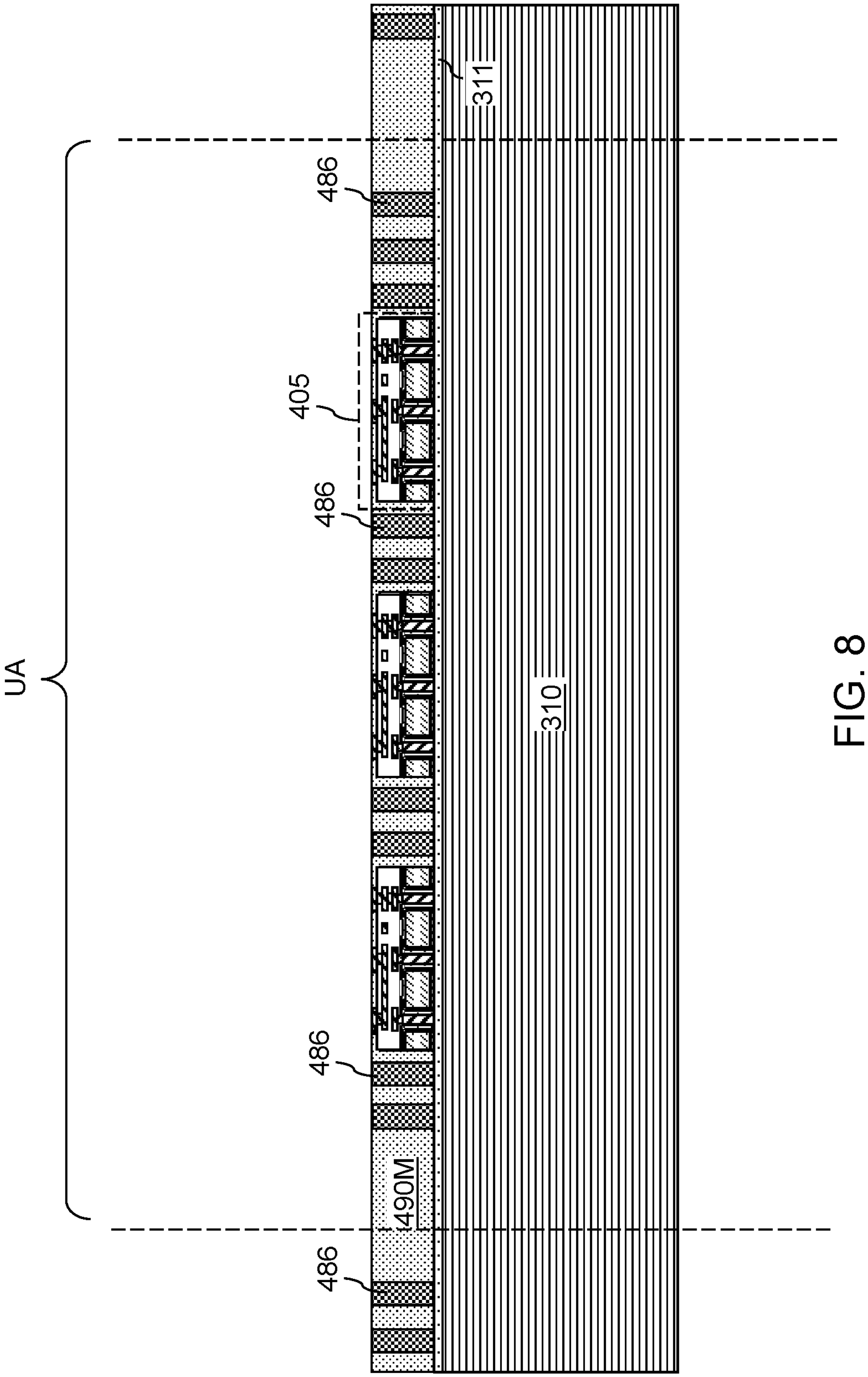
FIG. 8 is a vertical cross-sectional view of the embodiment intermediate structure of the present disclosure after formation of an interposer-level molding compound matrix.

Referring to FIG. 8, excess portions of the interposer-level MC material layer 490L may be removed from above the horizontal plane including the top surfaces of the silicon interconnect die 405 and the TIV structures 486 by a planarization process, which may use chemical mechanical planarization (CMP). Surfaces of the TIV structures 486 may be physically exposed after the planarization process. The remaining portion of the interposer-level MC material layer 490L is herein referred to as an interposer-level molding compound (MC) matrix 490M, or an MC matrix 490M.

The interposer-level MC matrix 490M includes a plurality of molding compound (MC) interposer frames located within a respective unit area UA and are laterally adjoined to one another. Each MC interposer frame corresponds to a portion of the interposer-level MC matrix 490M located within a unit area UA, i.e., an area of a single interposer to be subsequently formed. Each MC interposer frame laterally surrounds a respective set of at least one silicon interconnect die 405 and a respective array of TIV structures 486.

Figure 9A:
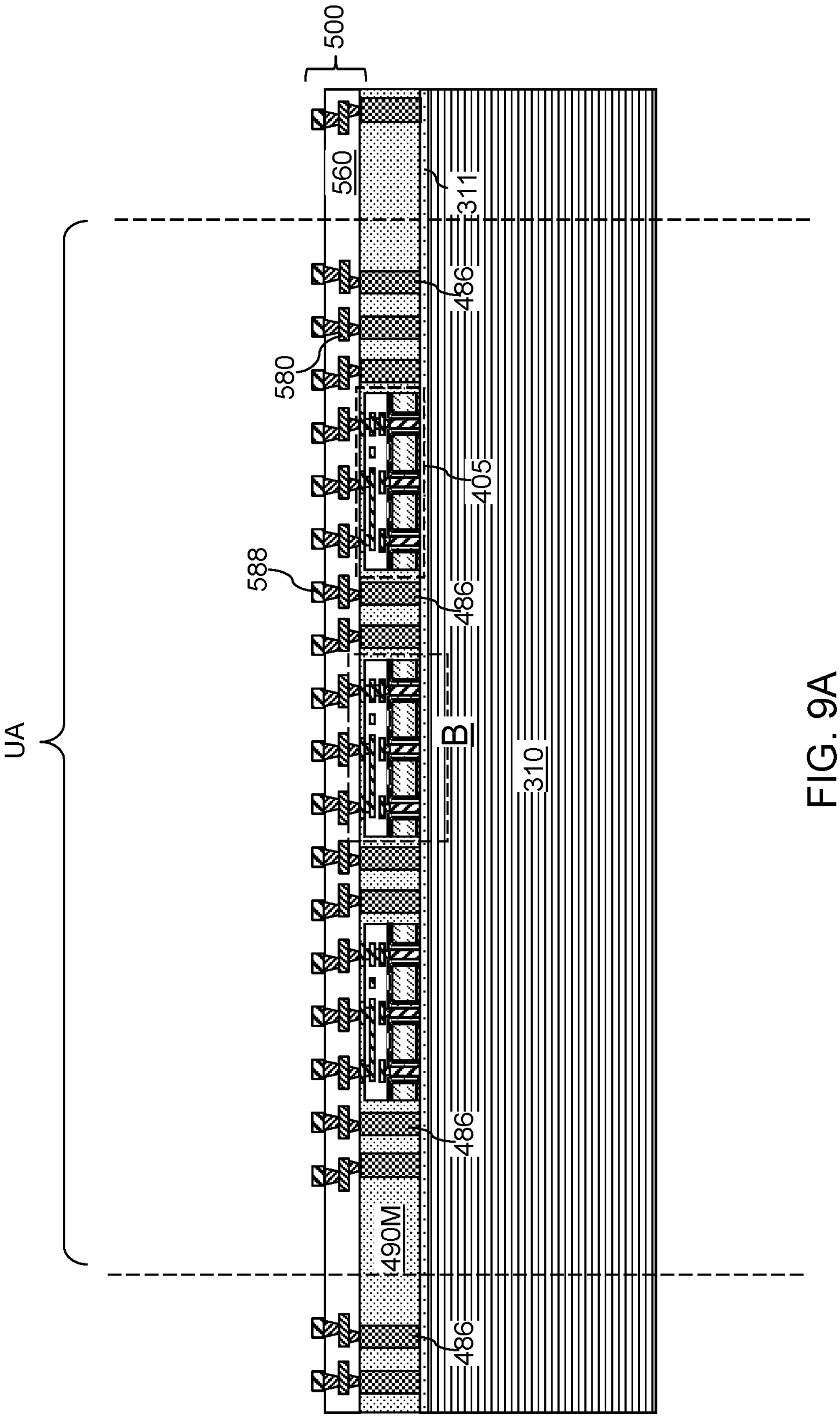
FIG. 9A is a vertical cross-sectional view of the embodiment intermediate structure of the present disclosure after formation of a first redistribution structure.
Figure 9B:
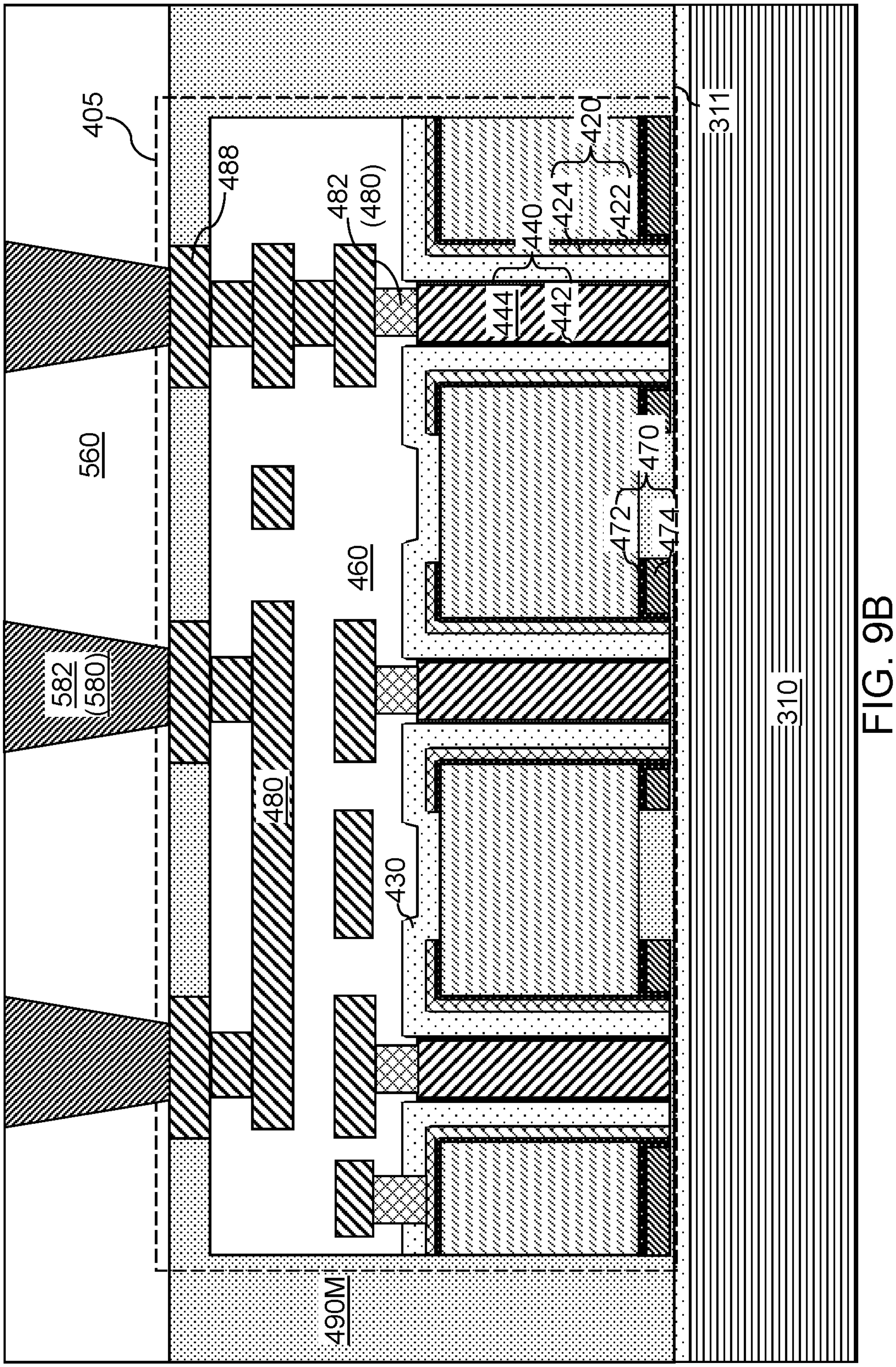
FIG. 9B is a magnified view of area B of FIG. 9A.

Referring to FIGS. 9A and 9B, a first redistribution structure 500 may be formed on a top side of the two-dimensional repetition of the unit via assembly and the interposer-level MC matrix 490M. The first redistribution structure 500 comprises first redistribution wiring interconnects 580, first redistribution dielectric layers 560, and first bonding structures 588.

The first redistribution dielectric layers 560 include a respective dielectric polymer material such as polyimide (PI), benzocyclobutene (BCB), or polybenzobisoxazole (PBO). Each first redistribution dielectric layer 560 may be formed by spin coating and drying of the respective dielectric polymer material. The thickness of each first redistribution dielectric layer 560 may be in a range from 2 microns to 40 microns, such as from 4 microns to 20 microns. Each first redistribution dielectric layer 560 may be patterned, for example, by applying and patterning a respective photoresist layer thereabove, and by transferring the pattern in the photoresist layer into the first redistribution dielectric layer 560 using an etch process such as an anisotropic etch process. The photoresist layer may be subsequently removed, for example, by ashing.

Each of the first redistribution wiring interconnects 580 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the first redistribution wiring interconnects 580 may include copper, nickel, or copper and nickel. The thickness of the metallic fill material that is deposited for each first redistribution wiring interconnect 580 may be in a range from 2 microns to 40 microns, such as from 4 microns to 10 microns, although lesser or greater thicknesses may also be used. The total number of levels of wiring in the first redistribution structure 500 (i.e., the levels of the first redistribution wiring interconnects 580) may be in a range from 1 to 10.

In one embodiment, the first redistribution wiring interconnects 580 may comprise redistribution via structures 582 contacting a top surface of a respective one of the interconnect-die bonding pads 488 of a respective silicon interconnect die 405. The first bonding structures 588 may comprise microbump structures that may be subsequently used to attach semiconductor dies. The metallic fill material for the microbump structures may include copper. The first bonding structures 588 may have horizontal cross-sectional shapes of rectangles, rounded rectangles, or circles. Other horizontal cross-sectional shapes may be within the contemplated scope of disclosure. Typically, the first bonding structures 588 may be configured for microbump bonding, and may have a thickness in a range from 5 microns to 100 microns, although lesser or greater thicknesses may also be used. In one embodiment, the first bonding structures 588 within each unit area UA may be formed as at least one array of microbumps (such as copper pillars). Each of the microbumps may have a lateral dimension in a range from 10 microns to 50 microns, and may have a pitch in a range from 20 microns to 100 microns.

Figure 10:
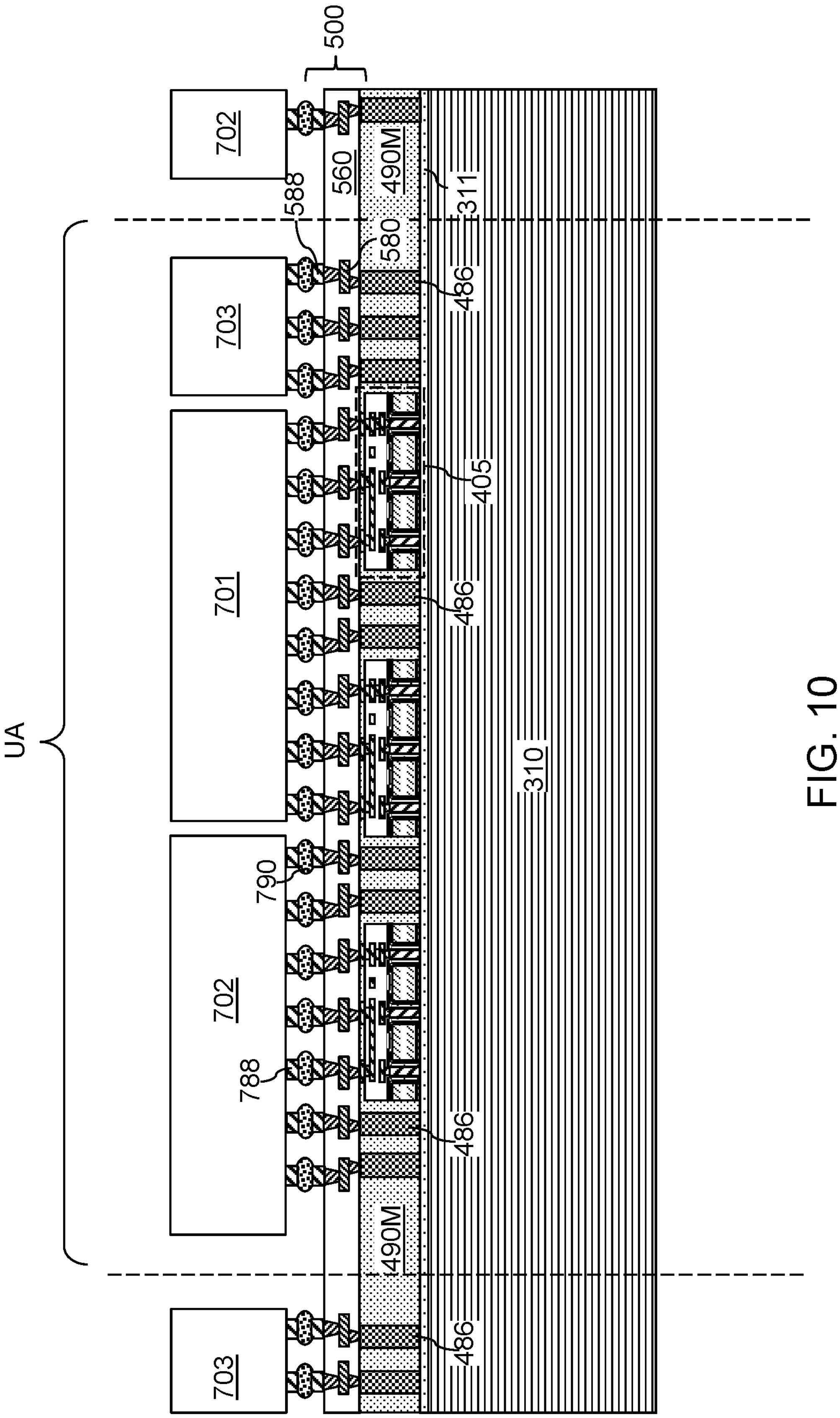
FIG. 10 is a vertical cross-sectional view of the embodiment intermediate structure of the present disclosure after attaching semiconductor dies to the first redistribution structure.

Referring to FIG. 10, a set of at least one semiconductor die (701, 702, 703) may be bonded to a respective set of first bonding structures 588 within each unit area UA. Each set of at least one semiconductor die (701, 702, 703) includes at least one semiconductor die, and may comprise a plurality of semiconductor dies (701, 702, 703). For example, each set of at least one semiconductor die (701, 702, 703) may include at least one system-on-chip (SoC) die (701, 702) and/or at least one memory die 703.

Each SoC die (701, 702) may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the at least one semiconductor die (701, 702, 703) may include at least one system-on-chip (SoC) die (701, 702) and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die (701, 702, 703) may comprise a respective array of on-die bump structures 788. Solder material portions may be applied to the on-die bump structures 788 of the semiconductor dies (701, 702, 703), or may be applied to the first bonding structures 588. The solder material portions are herein referred to as die-interposer-bonding (DIB) solder material portions 790, or as first solder material portions. Each of the semiconductor dies (701, 702, 703) may be positioned in a face-down position such that on-die bump structures 788 face the first bonding structures 588. Placement of the semiconductor dies (701, 702, 703) may be performed using a pick and place apparatus such that each of the on-die bump structures 788 may face a respective one of the first bonding structures 588. Each set of at least one semiconductor die (701, 702, 703) may be placed within a respective unit area. A DIB solder material portion 790 is attached to one of the on-die bump structure 788 and the first bonding structure 588 for each facing pair of an on-die bump structure 788 and a first bonding structure 588.

In one embodiment, the on-die bump structures 788 and the first bonding structures 588 may be configured for microbump bonding. In this embodiment, each of the on-die bump structures 788 and the first bonding structures 588 may be configured as copper pillar structures having a diameter in a range from 10 microns to 50 microns, and may have a respective height in a range from 5 microns to 100 microns. The pitch of the microbumps in the direction of periodicity may be in a range from 20 microns to 100 microns, although lesser and greater pitches may also be used. Upon reflow, the lateral dimensions of each DIB solder material portion 790 may be in a range from 100% to 150% of the lateral dimension (such as a diameter) of the adjoined on-die bump structure 788 or of the adjoined first bonding structure 588.

Figure 11:
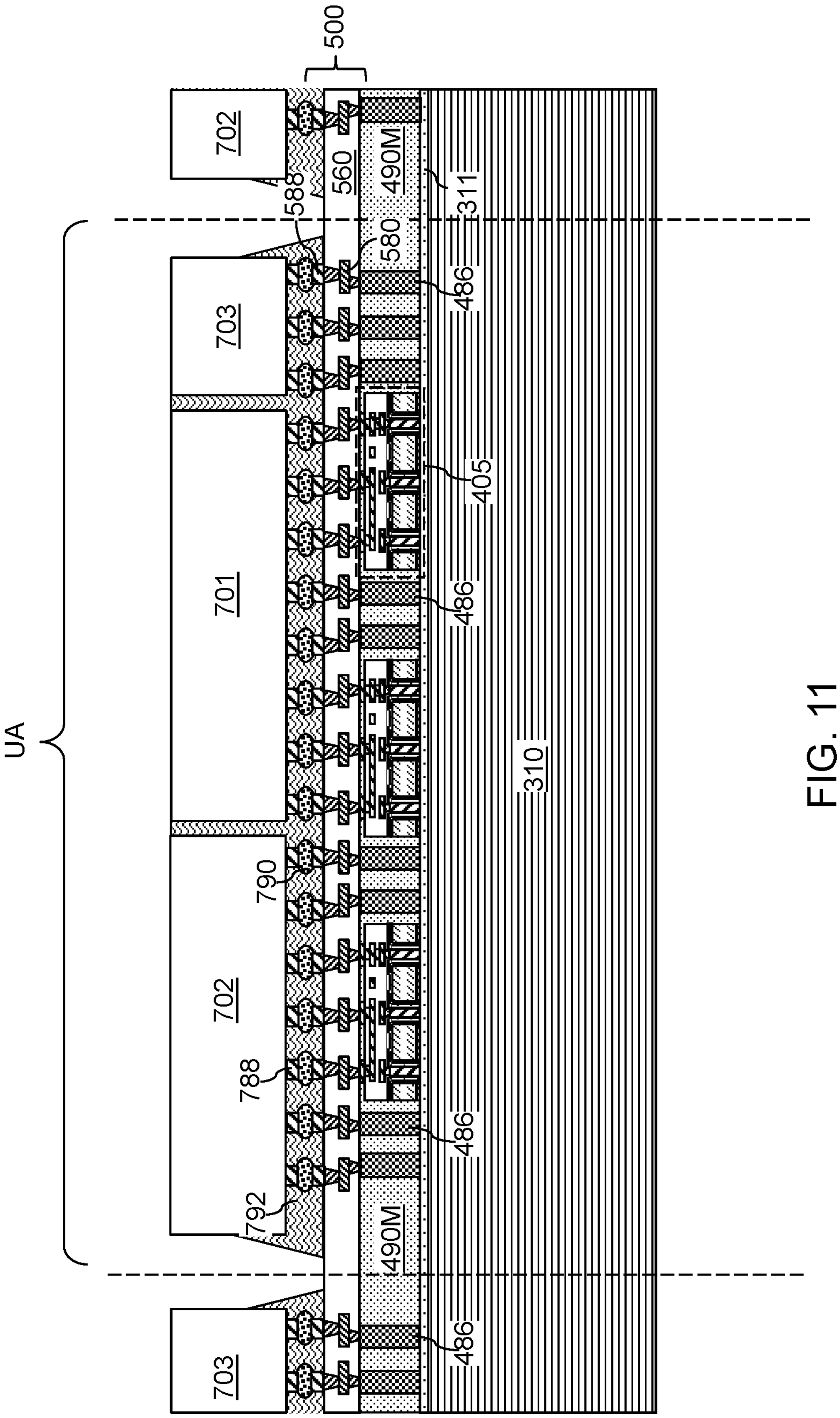
FIG. 11 is a vertical cross-sectional view of the embodiment intermediate structure of the present disclosure after formation of die-side underfill material portions.

Referring to FIG. 11, a die-side underfill material may be applied into each gap between the first redistribution structure 500 and a respective set of at least one semiconductor die (701, 702, 703). The die-side underfill material may comprise any underfill material known in the art. A die-side underfill material portion 792 may be formed within each unit area UA between the first redistribution structure 500 and the respective set of at least one semiconductor die (701, 702, 703). The die-side underfill material portions 792 may be formed by injecting the die-side underfill material around a respective array of DIB solder material portions 790 in a respective unit area UA. Any known underfill material application method may be used, which may be, for example, the capillary underfill method, the molded underfill method, or the printed underfill method.

A die-side underfill material portion 792 may laterally surround, and contact, a respective set of the DIB solder material portions 790 within the unit area UA. The die-side underfill material portion 792 may be formed around, and contact, the DIB solder material portions 790, the first bonding structures 588, and the on-die bump structures 788 in the unit area. Generally, at least one semiconductor die (701, 702, 703) comprising a respective set of on-die bump structures 788 is attached to the first redistribution structure 500 through a respective set of DIB solder material portions 790 within each unit area UA.

Figure 12:
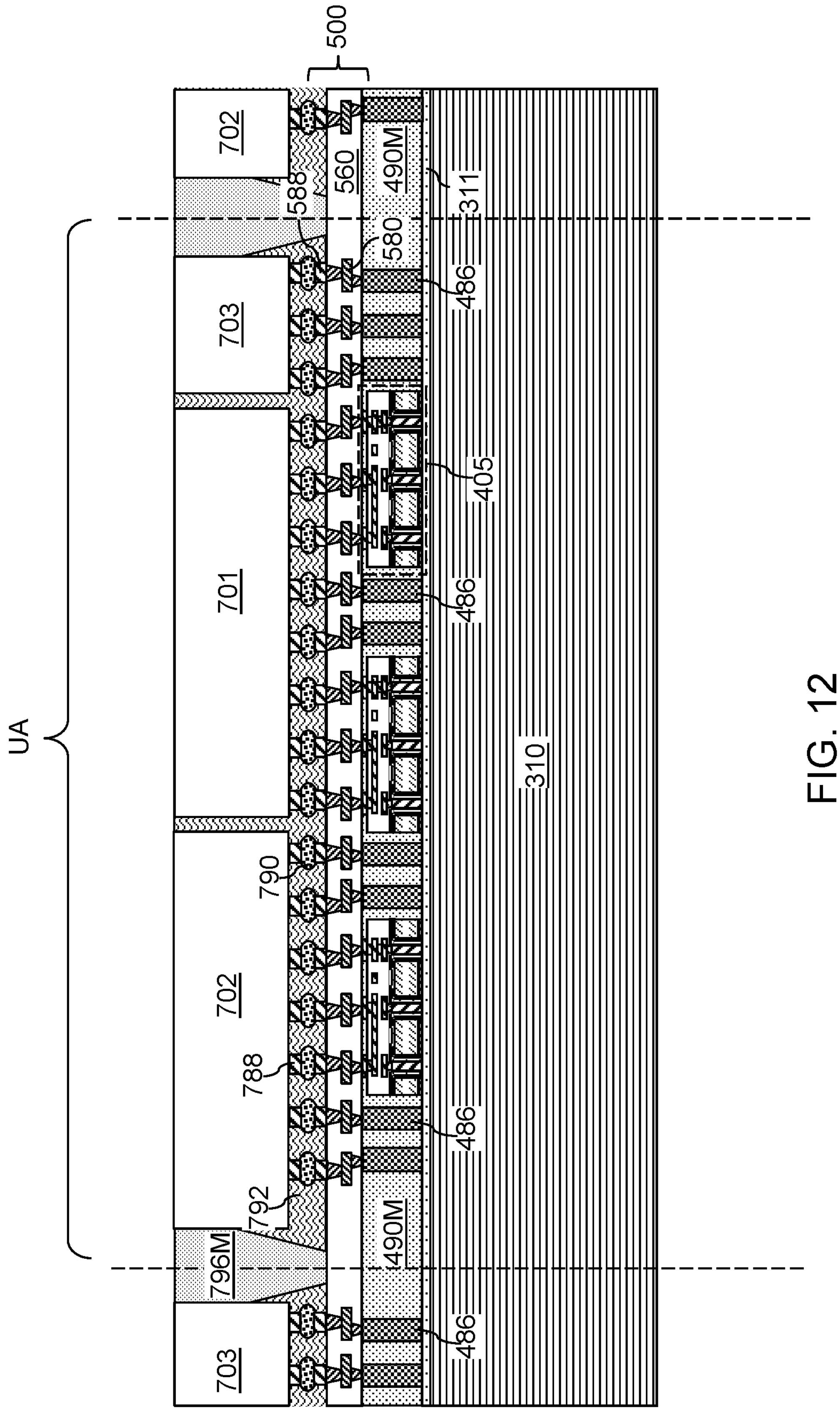
FIG. 12 is a vertical cross-sectional view of the embodiment intermediate structure of the present disclosure after formation of a die-level molding compound matrix.

Referring to FIG. 12, a molding compound (MC) may be applied to the gaps between assemblies of a respective set of semiconductor dies (701, 702, 703) and a respective die-side underfill material portion 792. The MC may include any material that may be used for the interposer-level MC matrix 490M discussed above. The MC may include epoxy resin, hardener, silica (as a filler material), and other additives. The MC may be cured at a curing temperature to form an MC matrix, which is herein referred to as a die-level MC matrix 796M or as a second MC matrix. The die-level MC matrix 796M laterally surrounds and embeds each assembly of a set of semiconductor dies (701, 702, 703) and a die-side underfill material portion 792. The die-level MC matrix 796M includes a plurality of molding compound (MC) die frames that are laterally adjoined to one another. Each MC die frame is a portion of the die-level MC matrix 796M that is located within a respective unit area UA. Thus, each MC die frame laterally surrounds, and embeds, a respective a set of semiconductor dies (701, 702, 703) and a respective die-side underfill material portion 792. Young's modulus of pure epoxy is about 3.35 GPa, and Young's modulus of the MC may be higher than Young's modulus of pure epoxy due to additives therein. Thus, Young's modulus of the die-level MC matrix 796M may be greater than 3.5 GPa.

Portions of the die-level MC matrix 796M that overlies the horizontal plane including the top surfaces of the semiconductor dies (701, 702, 703) may be removed by a planarization process. For example, the portions of the die-level MC matrix 796M that overlies the horizontal plane may be removed using a chemical mechanical planarization (CMP). The reconstituted wafer that overlies the first carrier wafer 310 comprises a combination of the die-level MC matrix 796M, the semiconductor dies (701, 702, 703), the die-side underfill material portions 792, the first redistribution structure 500, a two-dimensional array of combinations of at least one silicon interconnect die 405 and TIV structures 486. Each portion of the die-level MC matrix 796M located within a unit area UA constitutes an MC die frame.

Figure 13:
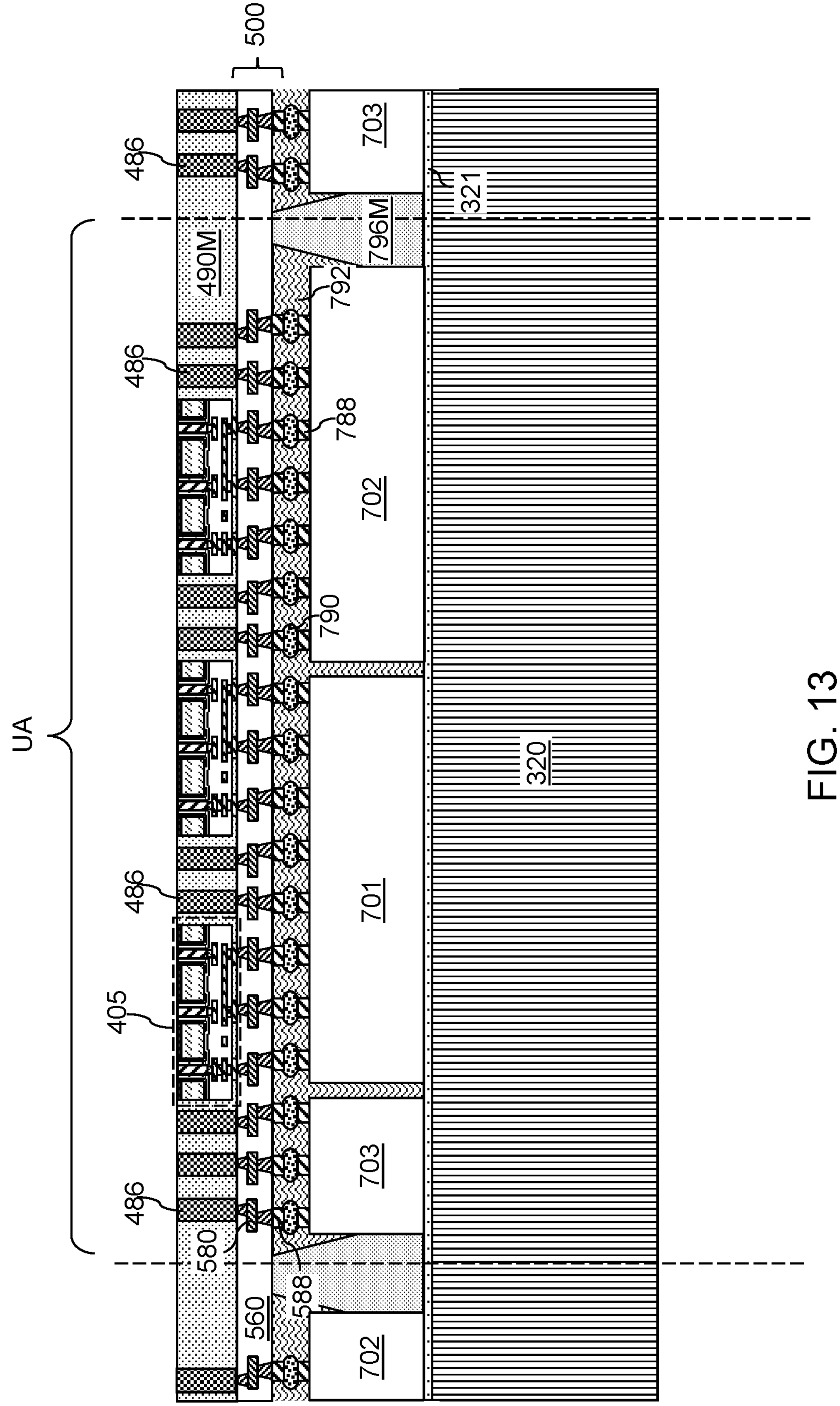
FIG. 13 is a vertical cross-sectional view of the embodiment intermediate structure of the present disclosure after attaching a second carrier wafer to a reconstituted wafer and detaching the first carrier wafer.

Referring to FIG. 13, a second adhesive layer 321 may be applied over the die-level MC matrix 796M and the semiconductor dies (701, 702, 703). The second adhesive layer 321 may comprise a light-to-heat conversion (LTHC) layer or a thermally decomposing adhesive material layer depending on the removal mechanism to be subsequently used. A second carrier wafer 320 may be attached to the die-level MC matrix 796M and the semiconductor dies (701, 702, 703) through the second adhesive layer 321. The second carrier wafer 320 may comprise any material that may be used for the first carrier wafer 310, and generally may have about the same thickness range as the first carrier wafer 310.

The first carrier wafer 310 may be detached from the reconstituted wafer. In some embodiments, the first carrier wafer 310 and the first adhesive layer 311 may be removed by backside grinding. Optionally, at least one selective etch process (such as a wet etch process or a reactive ion etch process) may be used in conjunction with the backside grinding process to minimize collateral removal of surface portions of the silicon interconnect dies 405 and the TIV structures 486. Alternatively or additionally, in embodiments in which the first carrier wafer 310 includes an optically transparent material and the first adhesive layer 311 comprises a light-to-heat conversion material, irradiation through the first carrier wafer 310 may be used to detach the first carrier wafer 310. In embodiments in which the first adhesive layer 311 comprises a thermally decomposable adhesive material, an anneal process or a laser irradiation may be used to detach the first carrier wafer 310. A suitable clean process may be performed to remove residual portions of the first adhesive layer 311.

Figure 14:
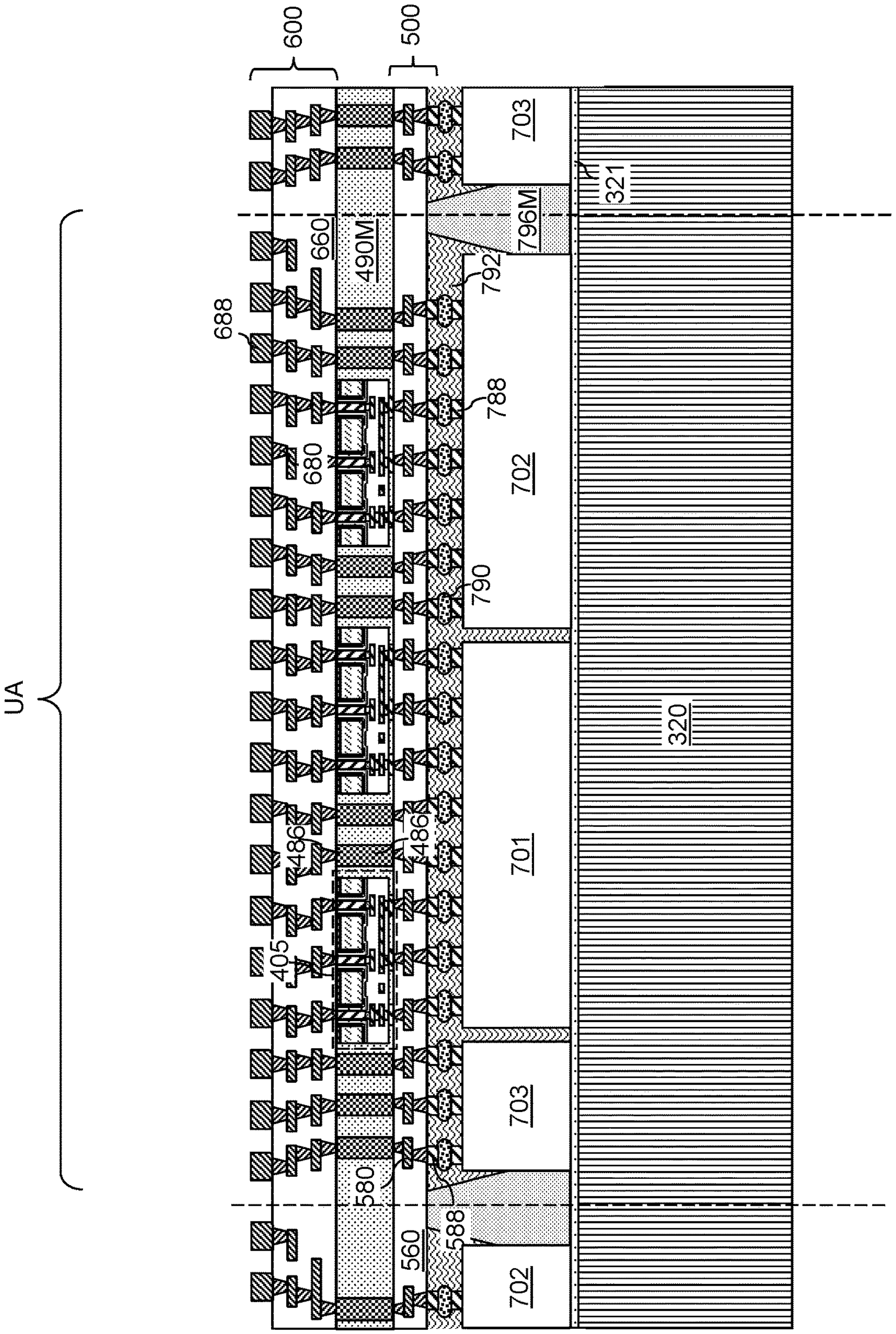
FIG. 14 is a vertical cross-sectional view of the embodiment intermediate structure of the present disclosure after formation of a second redistribution structure.

Referring to FIG. 14, a second redistribution structure 600 may be formed on a physically exposed side of the two-dimensional repetition of the unit via assembly and the interposer-level MC matrix 490M. The second redistribution structure 600 comprises second redistribution wiring interconnects 680, second redistribution dielectric layers 660, and second bonding structures 688. Generally, the second redistribution structure 600 may be formed in the same manner as the first redistribution structures 500 with suitable changes in the lithographic pattern and/or in the thicknesses and material compositions of material layers. The second bonding structures 688 may be formed as bonding pads that are configured for controlled collapse chip connection (C4) bonding.

Figure 15:
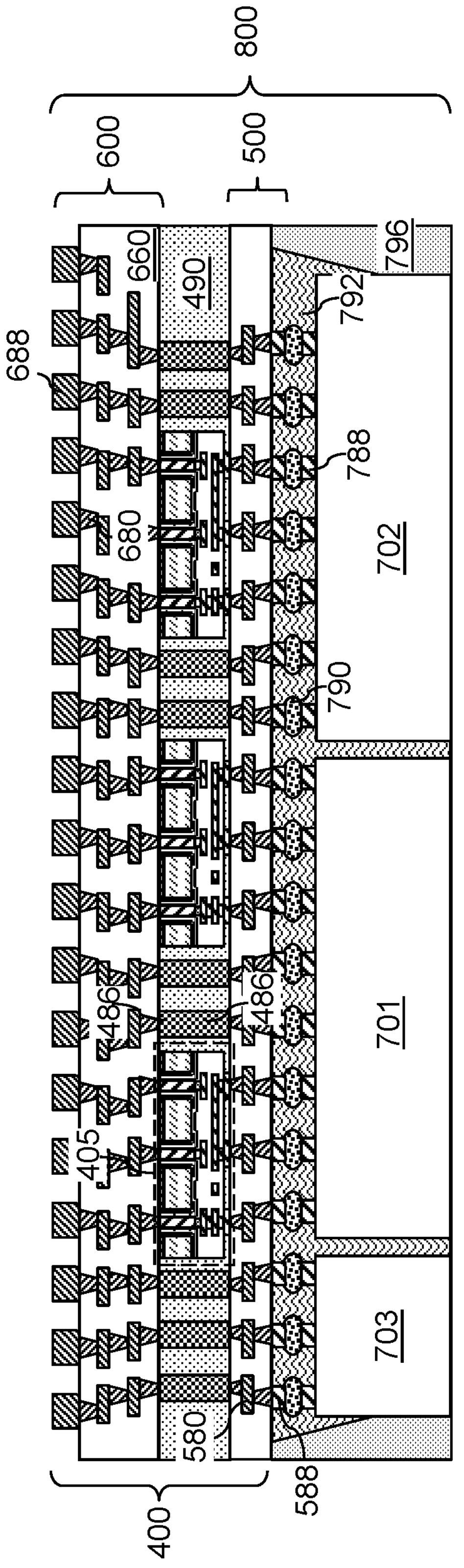
FIG. 15 is a vertical cross-sectional view of an embodiment structure of the present disclosure comprise a composite interposer formed by dicing of a reconstituted wafer.

Referring to FIG. 15, the second carrier wafer 320 may be detached from the reconstituted wafer. In embodiments in which the second carrier wafer 320 includes an optically transparent material and the second adhesive layer 321 comprises a light-to-heat conversion material, irradiation through the second carrier wafer 320 may be used to detach the second carrier wafer 320. In embodiments in which the second adhesive layer 321 comprises a thermally decomposable adhesive material, an anneal process or a laser irradiation may be used to detach the second carrier wafer 320. A suitable clean process may be performed to remove residual portions of the second adhesive layer 321. A horizontal surface of the die-level MC matrix 796M may be physically exposed.

The reconstituted wafer includes a two-dimensional array of composite interposers 400, and further includes a two-dimensional array of sets of at least one semiconductor die (701, 702, 703) that are bonded to a respective composite interposer 400. The reconstituted wafer may be diced along dicing channels (which correspond to the dicing lines DL described above) by performing a dicing process. The dicing channels correspond to the boundaries between neighboring pairs of unit areas UA. Each diced unit from the reconstituted wafer comprises a fan-out package 800. Each diced portion of the die-level MC matrix 796M constitutes a die-level MC frame 796. Each diced portion of the interposer-level MC matrix 490M constitutes an interposer-level MC frame 490, which is also referred to as a molding compound frame 490 or an MC frame 490.

The diced portions of the reconstituted wafer comprise fan-out packages 800. Each fan-out package 800 comprises at least one semiconductor die (701, 702, 703), a composite interposer 400, a die-side underfill material portion 792, a die-level MC frame 796, and at least one array of DIB solder material portions 790. Each composite interposer 400 comprises TIV structures 486, at least one silicon interconnect die 405, an interposer-level MC frame 490, a first redistribution structure 500, and a second redistribution structure 600.

FIGS. 16A-16E are magnified views of various configurations of the composite interposer 400 of the present disclosure at the processing step of FIG. 15.

Figure 16A:
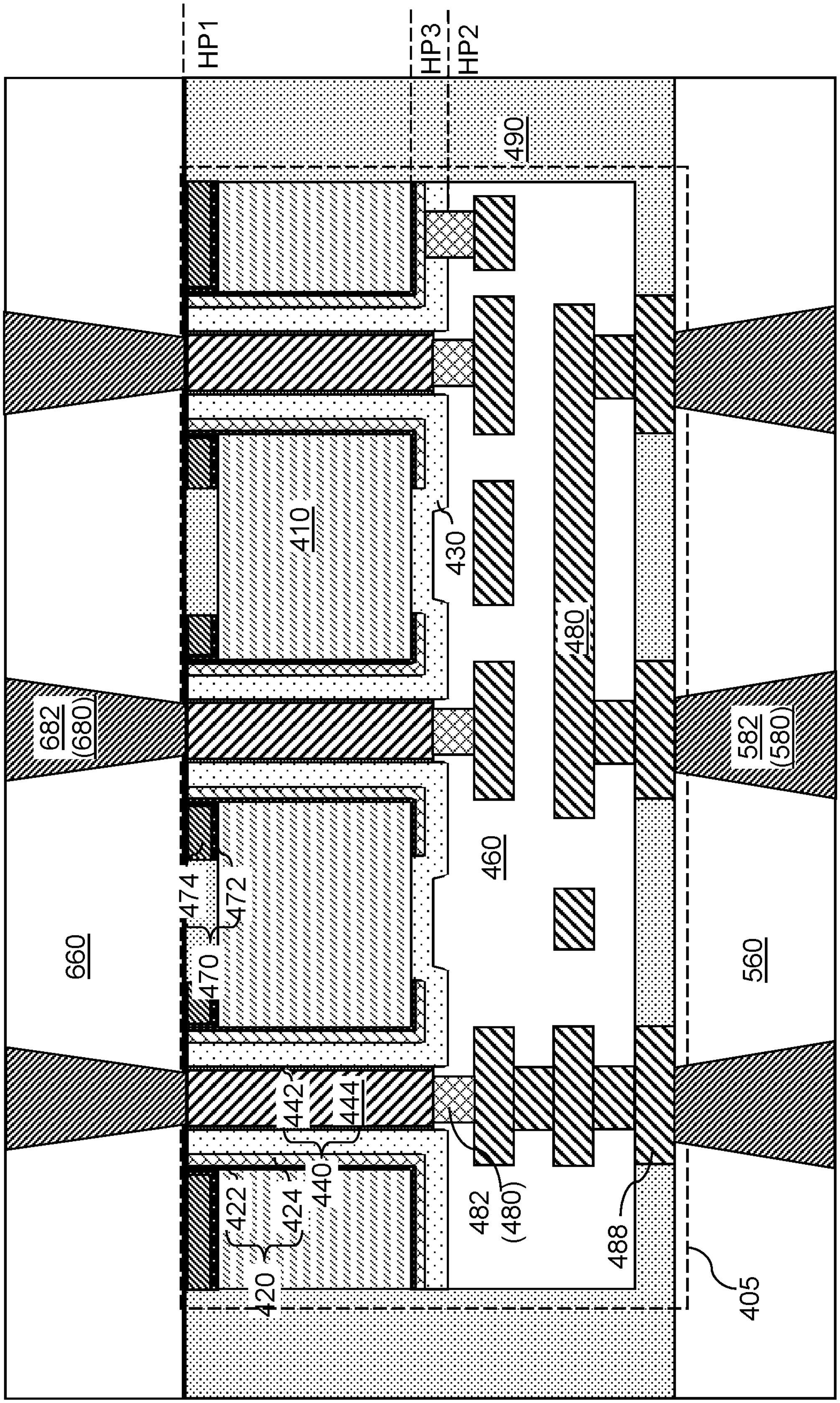
FIGS. 16A-16E are magnified views of various configurations of the composite interposer of the present disclosure.

Referring to FIG. 16A, a first configuration of the composite interposer 400 is illustrated, in which a subset of the first redistribution via structures 582 selected from the first redistribution wiring interconnects 580 contacts a respective interconnect-die metal pad, and a subset of the second redistribution via structures 682 selected from the second redistribution wiring interconnects 680 contacts bottom surfaces of a respective TSV structures 440.

Figure 16B:
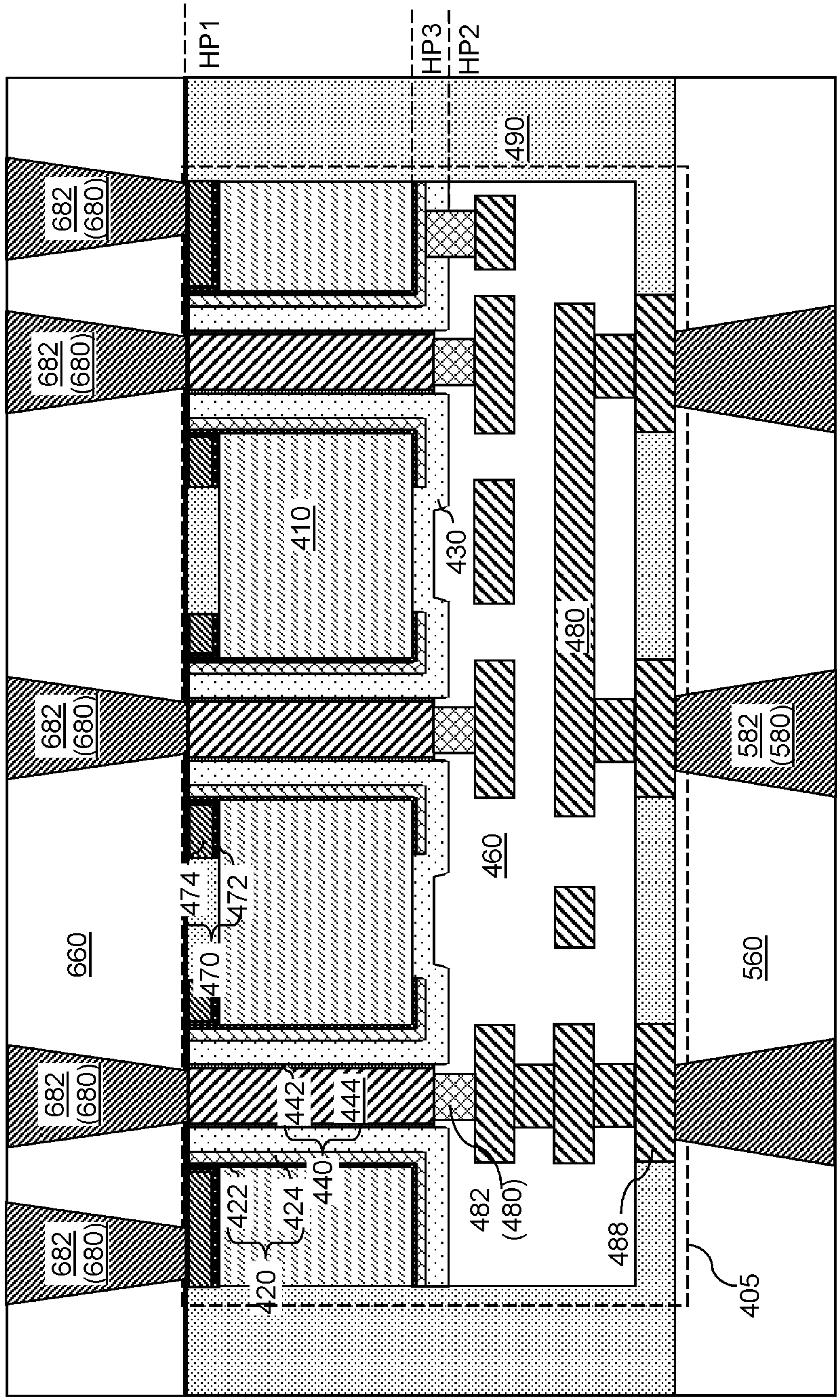

Referring to FIG. 16B, a second configuration of the composite interposer 400 can be derived from the first configuration of the composite interposer 400 by using a plurality of backside metallic shield layers 470 that are laterally spaced from one another, and by forming additional second redistribution via structures 682 that contact a bottom surface of a respective one of the backside metallic shield layers 470.

Figure 16C:
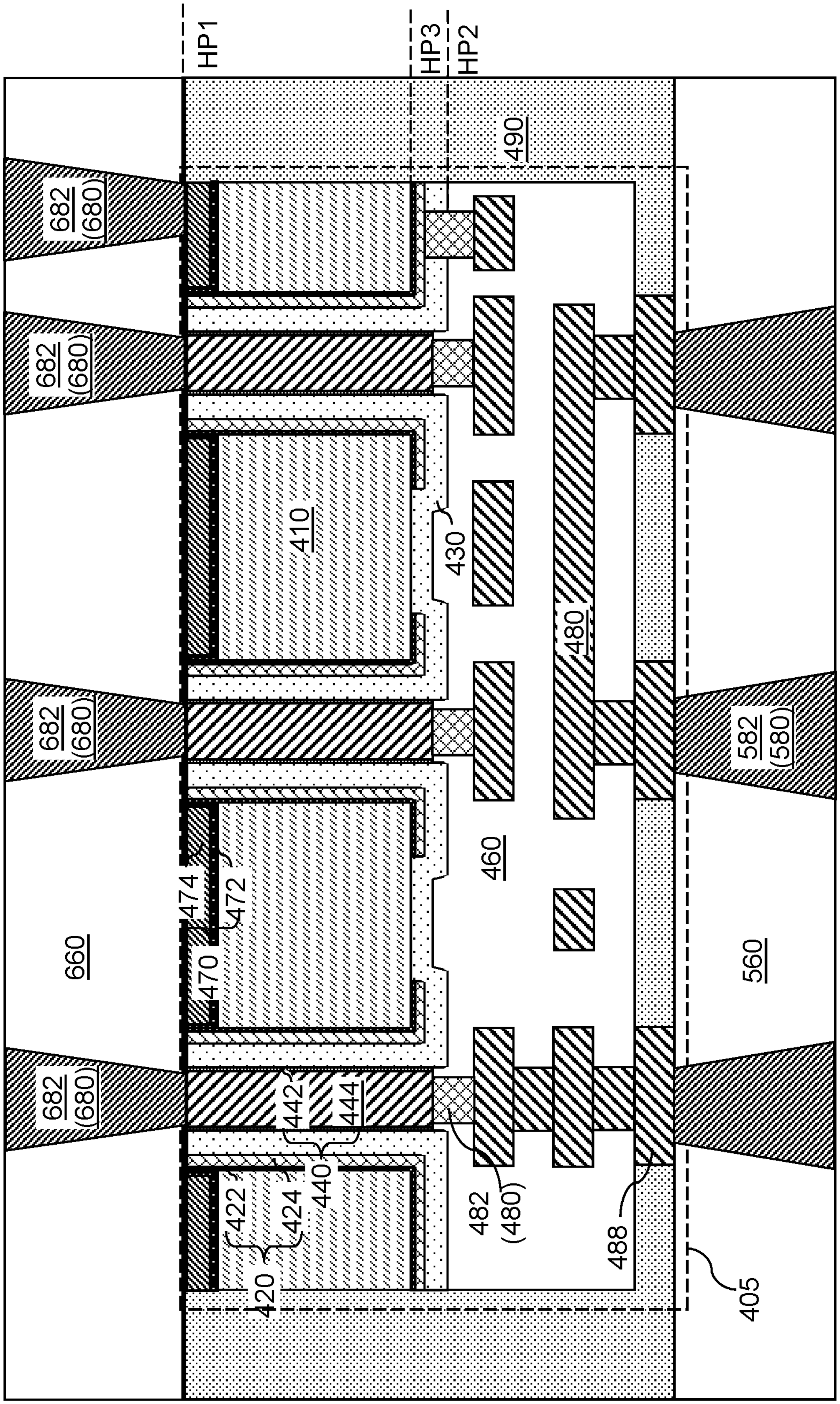

Referring to FIG. 16C, a third configuration of the composite interposer 400 can be derived from the second configuration of the composite interposer 400 by using a single backside metallic shield layer 470 that contacts an entirety of a backside surface of the silicon substrate 410 in lieu of a plurality of backside metallic shield layers 470.

Figure 16D:
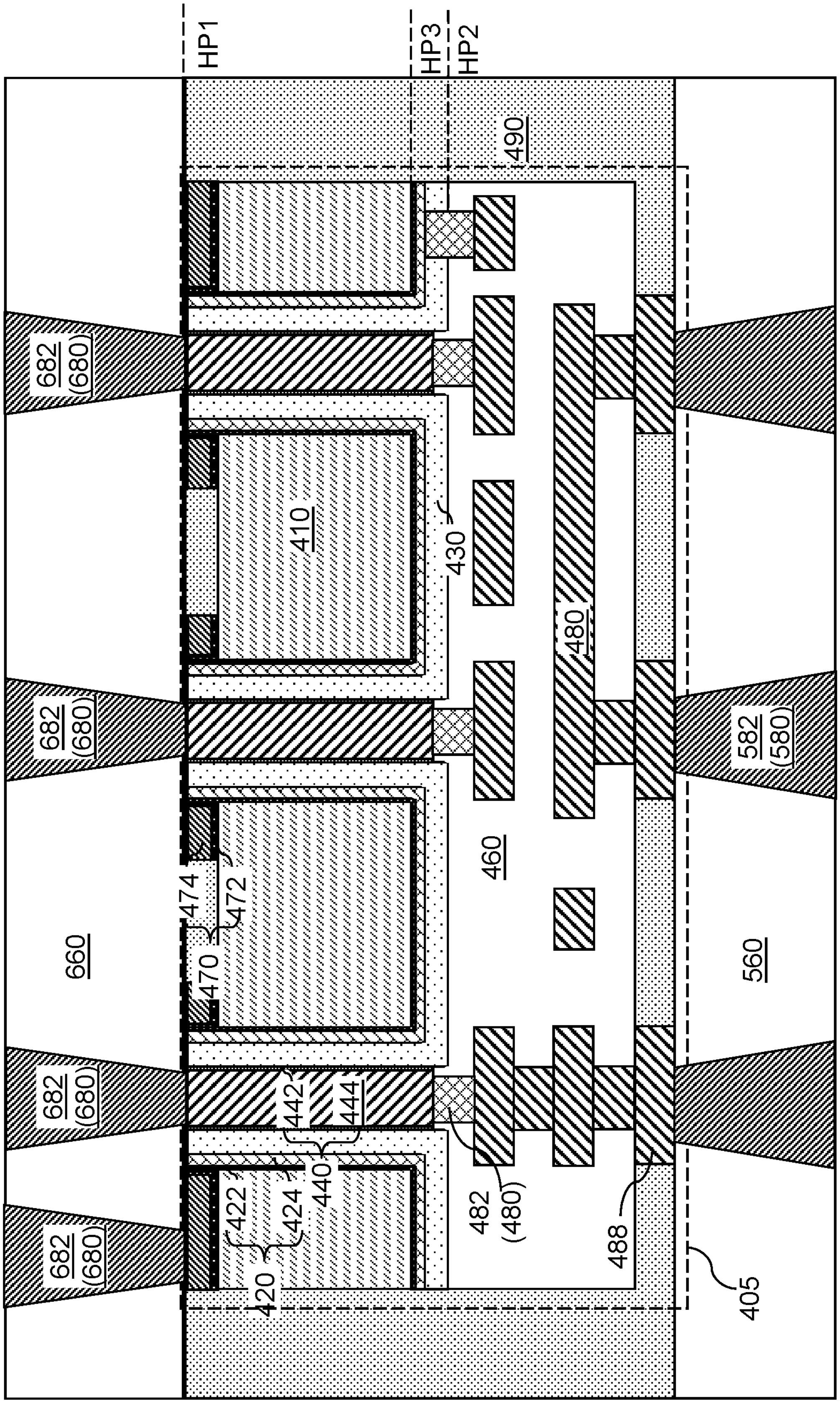

Referring to FIG. 16D, a fourth configuration of the composite interposer 400 can be derived from the first or second configuration of the composite interposer 400 by using a single front metallic shield layer 420 including a horizontally-extending portion that contacts an entirety of a front surface of the silicon substrate 410 in lieu of a plurality of front metallic shield layers 420.

Figure 16E:
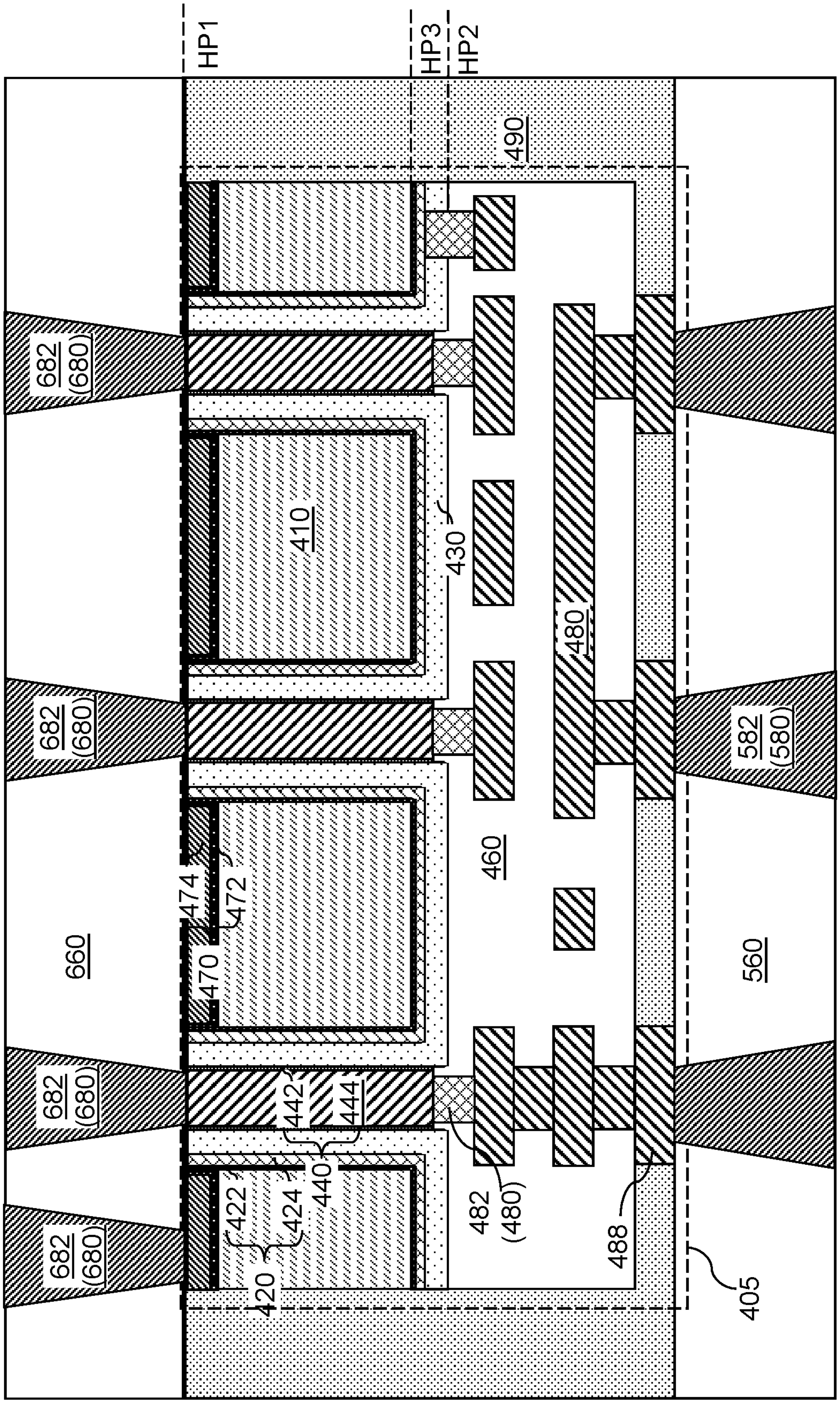

Referring to FIG. 16E, a fifth configuration of the composite interposer 400 can be derived from the third configuration of the composite interposer 400 by using a single front metallic shield layer 420 including a horizontally-extending portion that contacts an entirety of a front surface of the silicon substrate 410 in lieu of a plurality of front metallic shield layers 420.

Referring collectively to FIGS. 15 and 16A-16E and according to an aspect of the present disclosure, a fan-out package 800 is provided, which comprises: at least one silicon interconnect die 405 comprising through-substrate via (TSV) structures 440 extending through a silicon substrate 410, at least one front metallic shield layer 420 including at least one tubular metallic shield portion laterally surrounding a respective one of TSV structures 440, and metal interconnect structures 480 embedded in dielectric material layers 460 and overlying the at least one front metallic shield layer 420; and a first redistribution structure 500 comprising first redistribution wiring interconnects 580 embedded in first redistribution dielectric layers 560 and overlying the silicon interconnect die 405; and at least one semiconductor die (701, 702, 703) attached to the first redistribution structure 500 through at least one array of solder material portions 790.

Each front metallic shield layer 420 comprises a horizontally-extending metallic shield portion overlying a top surface of the silicon substrate 410. In one embodiment, the silicon interconnect die 405 comprises an insulating spacer layer 430 including a horizontally-extending portion overlying a top surface of the silicon substrate 410 and a plurality of tubular insulating material portions vertically extending laterally surrounding a respective one of the TSV structures 440. In one embodiment, the at least one tubular metallic shield portion comprises an inner cylindrical sidewall that contacts an outer cylindrical sidewall of a respective tubular insulating material portion among the plurality of tubular insulating material portions.

In one embodiment, the composite interposer 400 comprises a molding compound (MC) composite interposer frame 490 laterally surrounding the silicon interconnect die 405 and contacting a bottom surface of the first redistribution structure 500. In one embodiment, the composite interposer 400 comprises a second redistribution structure 600 comprising second redistribution wiring interconnects 680 embedded in second redistribution dielectric layers 660 and underlying the silicon interconnect die 405. The second redistribution structure 600 comprises second redistribution wiring interconnects 680 embedded in second redistribution dielectric layers 660. The second redistribution wiring interconnects 680 comprise second redistribution via structures 682 contacting bottom surfaces of the TSV structures 440.

Figure 17:
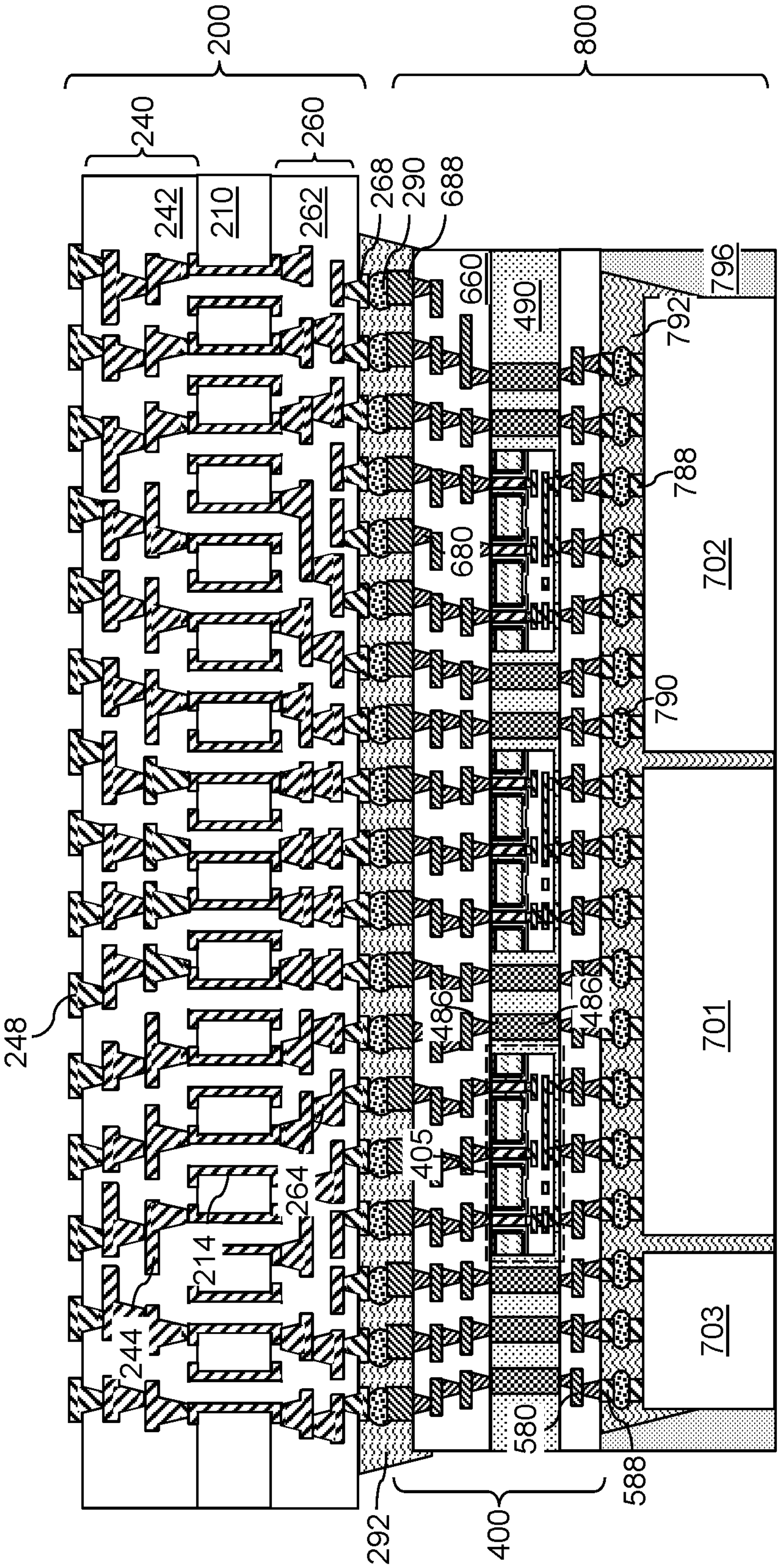
FIG. 17 is a vertical cross-sectional view of an assembly of a composite interposer and a packaging substrate according to an embodiment of the present disclosure.

Referring to FIG. 17, a packaging substrate 200 may be bonded to the fan-out package 800. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers, dielectric interlayers, and/or at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using a cored packaging substrate, it is understood that the scope of the present disclosure is not limited by any particular type of substrate package. For example, an SoIS may be used in lieu of a cored packaging substrate. In embodiments in which SoIS is used, the core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners (not illustrated) may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the chip-side surface laminar circuit 260 comprises chip-side wiring interconnects 264 that are connected to an array of substrate bonding pads 268. The array of substrate bonding pads 268 may be configured to allow bonding through C4 solder balls. The board-side surface laminar circuit 240 comprises board-side wiring interconnects 244 that are connected to an array of board-side bonding pads 248. The array of board-side bonding pads 248 is configured to allow bonding through solder joints having a greater dimension than the C4 solder balls. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The fan-out package 800 may be attached to the packaging substrate 200 using the second solder material portions, which are herein referred to interposer-substrate-bonding (ISB) solder material portions 290. Specifically, each of the ISB solder material portions 290 may be bonded to a respective one of the substrate bonding pads 268 and to a respective one of the second bonding structures 688 located on the composite interposer 800. A reflow process may be performed to reflow the ISB solder material portions 290 such that each ISB solder material portion 290 may be bonded to a respective one of the substrate bonding pads 268 and to a respective one of the second bonding structures 688.

An underfill material may be applied into a gap between the composite interposer 800 and the packaging substrate 200. The underfill material may comprise any underfill material known in the art. An underfill material portion may be formed around the ISB solder material portions 290 in the gap between the composite interposer 800 and the packaging substrate 200. This underfill material portion is herein referred to as an interposer-substrate underfill material portion 292, or as an IP underfill material portion 292.

A stiffener ring (not shown) may be optionally attached to the composite interposer 800 or the packaging substrate 200.

Figure 18:
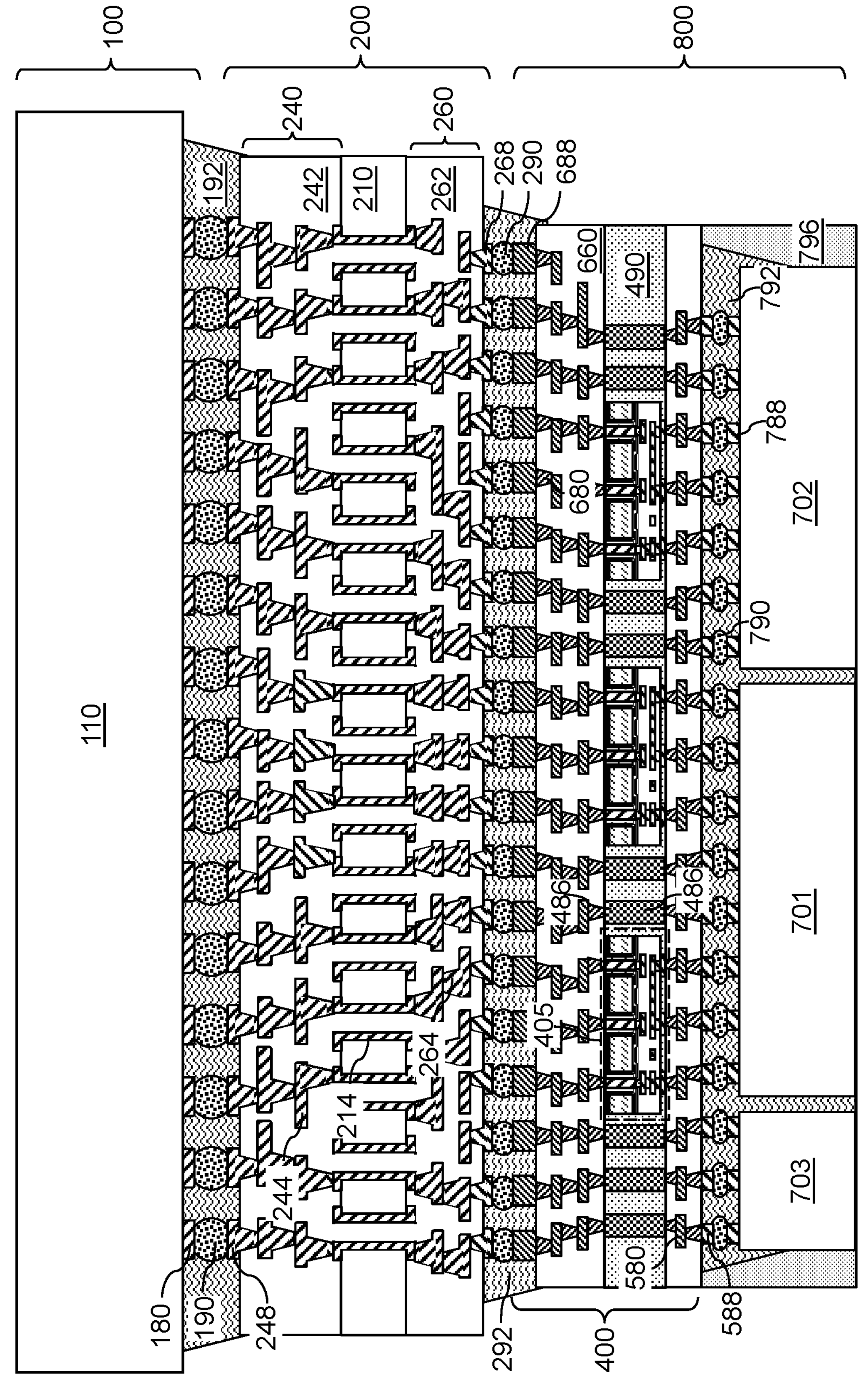
FIG. 18 is a vertical cross-sectional view of an assembly of a composite interposer, a packaging substrate, and a printed circuit board according to an embodiment of the present disclosure.

Referring to FIG. 18, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An additional underfill material portion, which is herein referred to as a board-substrate underfill material portion 192 or a board-side (BS) underfill material portion 192, may be formed around the solder joints 190 by applying and shaping an underfill material. The packaging substrate 200 is attached to the PCB 100 through the array of solder joints 190.

Figure 19:
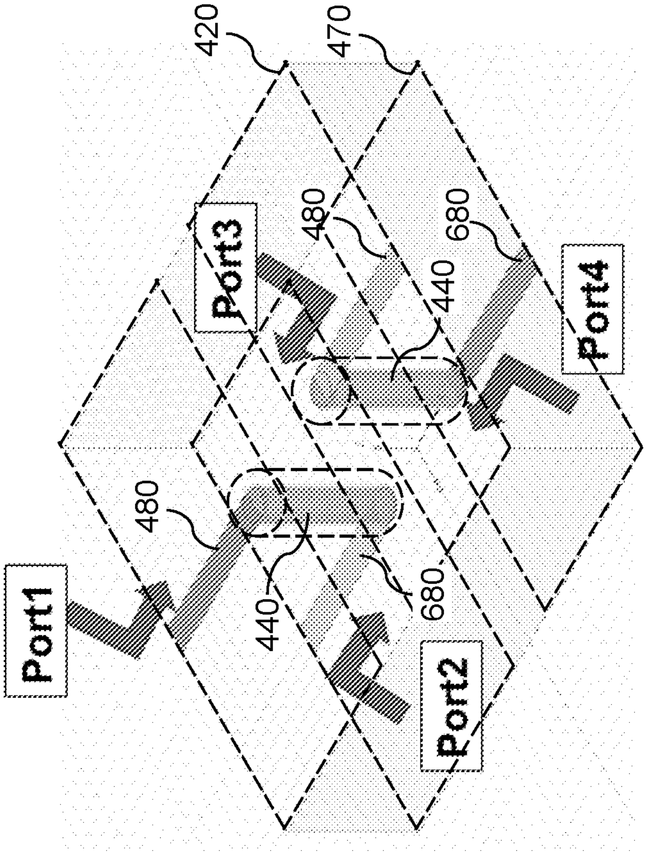
FIG. 19 is a schematic port connection diagram that may be implemented with an interposer of various embodiments of the present disclosure.

FIG. 19 is a schematic port connection diagram that may be implemented with a composite interposer 400 of various embodiments of the present disclosure. The two TSV structures 440 may be electrically connected to a pair of electrical ports through a respective subset of the metal interconnect structures 480 in an silicon interconnect die 405 and through a respective subset of the second redistribution wiring interconnects 680. In the absence of a front metallic shield layer 420 and a backside metallic shield layer 470, cross-talk between the two TSV structures 440 may be detrimental to the performance of the semiconductor die (701, 702, 703). According to an aspect of the present disclosure, the presence of a front metallic shield layer 420 and a backside metallic shield layer 470 mitigate against and decrease the cross-talk between the two TSV structures 440.

Figure 20:
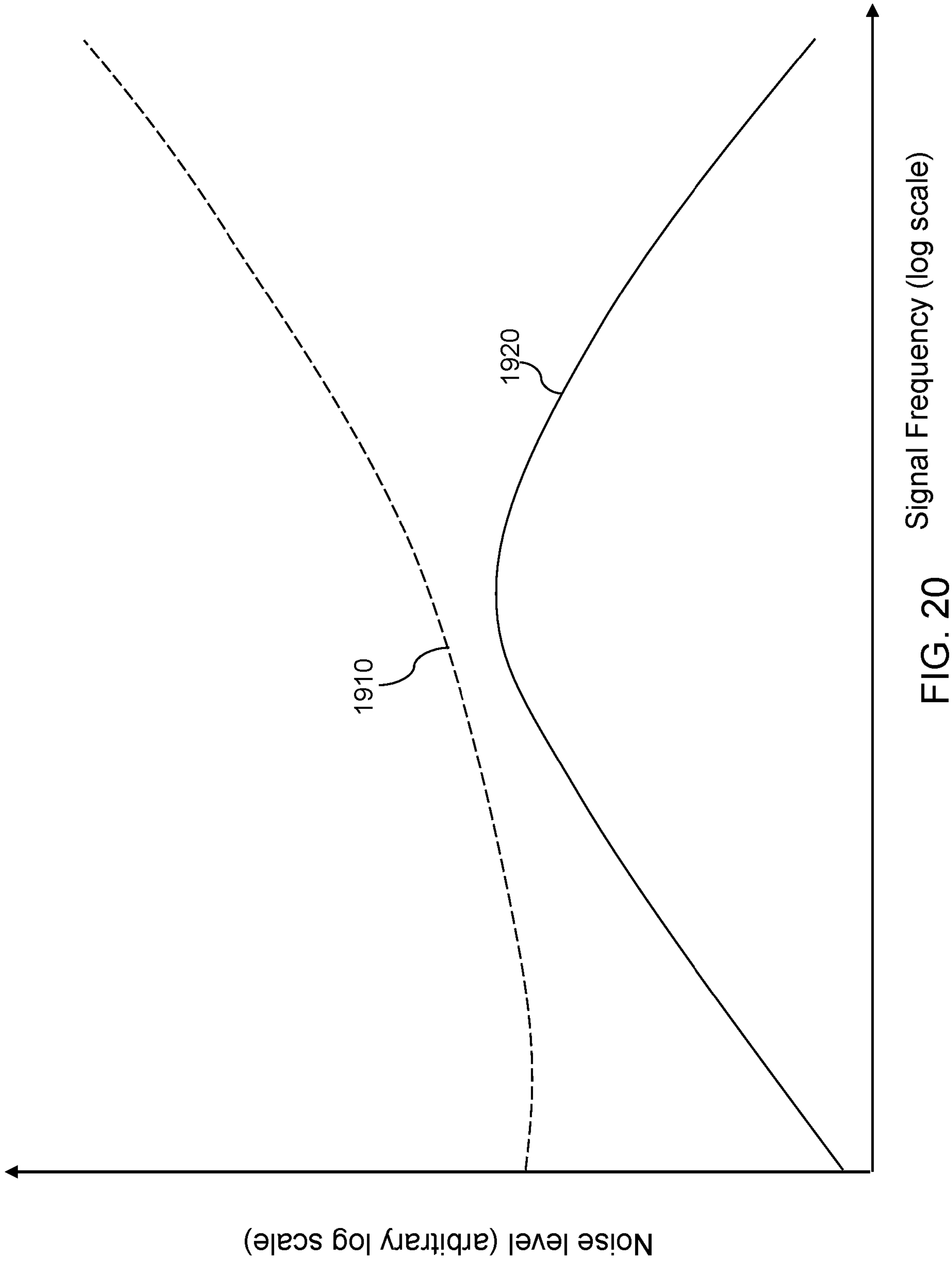
FIG. 20 is a schematic graph illustrating the dependence of noise level as a function of signal frequency for an unshielded through-substrate via structure and for a shielded through-substrate via structure.

Reduction in the cross-talk is schematically illustrated in FIG. 20, which is a schematic graph illustrating the dependence of noise level as a function of signal frequency for an unshielded through-substrate via structure and for a shielded through-substrate via structure. Curve 1910 represents the noise level of an unshielded through-substrate via structure. Curve 1920 represents the noise level of a shielded through-substrate via structure 440 that is positioned within a pair of a front metallic shield layer 420 and a backside metallic shield layer 470. Noise reduction in a range from 5 dB to 50 dB may be expected within the frequency range from 1 GHz to 100 GHz depending on the geometry of the combination of a TSV structure 440, a front metallic shield layer 420, and a backside metallic shield layer 470, and depending on the operational frequency.

Figure 21:
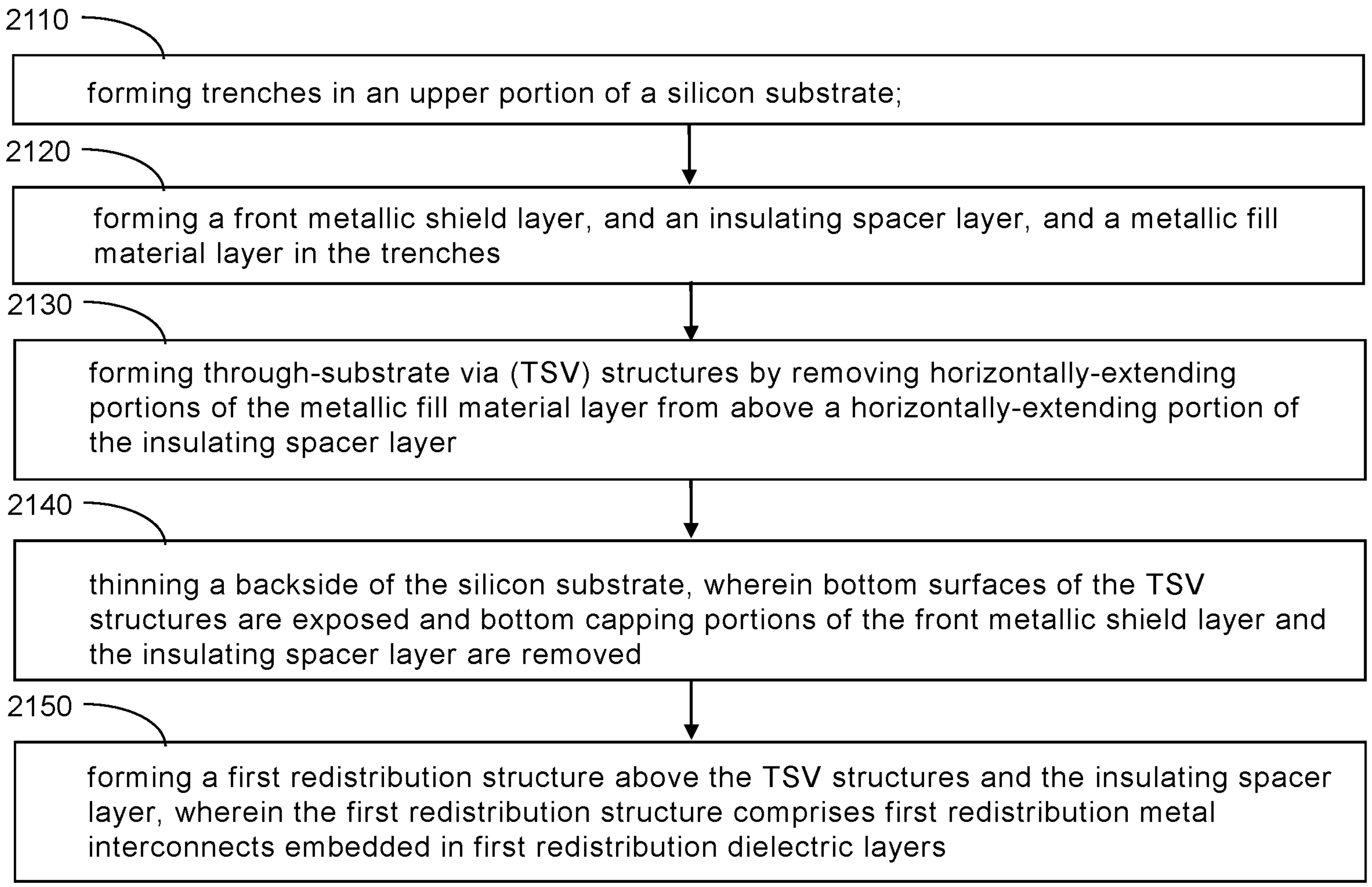
FIG. 21 is a first flowchart illustrating steps for forming a device structure according to an embodiment of the present disclosure.

FIG. 21 is a first flowchart illustrating steps for forming a device structure according to an embodiment of the present disclosure. In the method of the first flow chart, a backside of the silicon substrate 410 can be thinned.

Referring to step 2110 and FIGS. 1 and 2A, trenches 409 may be formed in an upper portion of a silicon substrate 410.

Referring to step 2120 and FIGS. 2A-2E, a front metallic shield layer 420, and an insulating spacer layer 430, and a metallic fill material layer 440L may be formed in the trenches 409.

Referring to step 2130 and FIGS. 2F-2J, 3A, and 3B, through-substrate via (TSV) structures 440 may be formed by removing horizontally-extending portions of the metallic fill material layer 440L from above a horizontally-extending portion of the insulating spacer layer 430.

Referring to step 2140 and FIGS. 3C-3H, 4A-4D, and 5-8, a backside of the silicon substrate 410 may be thinned. Bottom surfaces of the TSV structures 440 are exposed and bottom capping portions of the front metallic shield layer 420 and the insulating spacer layer 430 are removed. In one embodiment, a bottom surface of the silicon substrate 410 can be recessed after thinning the backside of the silicon substrate 410, whereby the bottom surface of the silicon substrate 410 is vertically recessed upward with respect to bottom surfaces of the TSV structures 440. A backside metallic shield layer 470 may be formed within a volume vertically bounded by the bottom surface of the silicon substrate 410 and a horizontal plane including the bottom surfaces of the TSV structures 440. In one embodiment, each of the TSV structures 440 is laterally spaced from the backside metallic shield layer 470 by a respective tubular vertically-extending portion of the insulating spacer layer 430.

Referring to step 2150 and FIGS. 9A-18, a first redistribution structure 500 may be formed above the TSV structures 440 and the insulating spacer layer 430, wherein the first redistribution structure 500 comprises first redistribution wiring interconnects 580 formed within first redistribution dielectric layers 560. At least one semiconductor die (701, 702, 703) can be attached to the first redistribution structure 500 through at least one array of first solder material portions 790. A die-level molding compound (MC) matrix can be formed around the at least one semiconductor die (701, 702, 703). A second redistribution structure 600 can be formed on the backside metallic shield layer 470 and bottom surfaces of the TSV structures 440. The second redistribution structure 600 comprises second redistribution wiring interconnects 680 formed within second redistribution dielectric layers 660.

Figure 22:
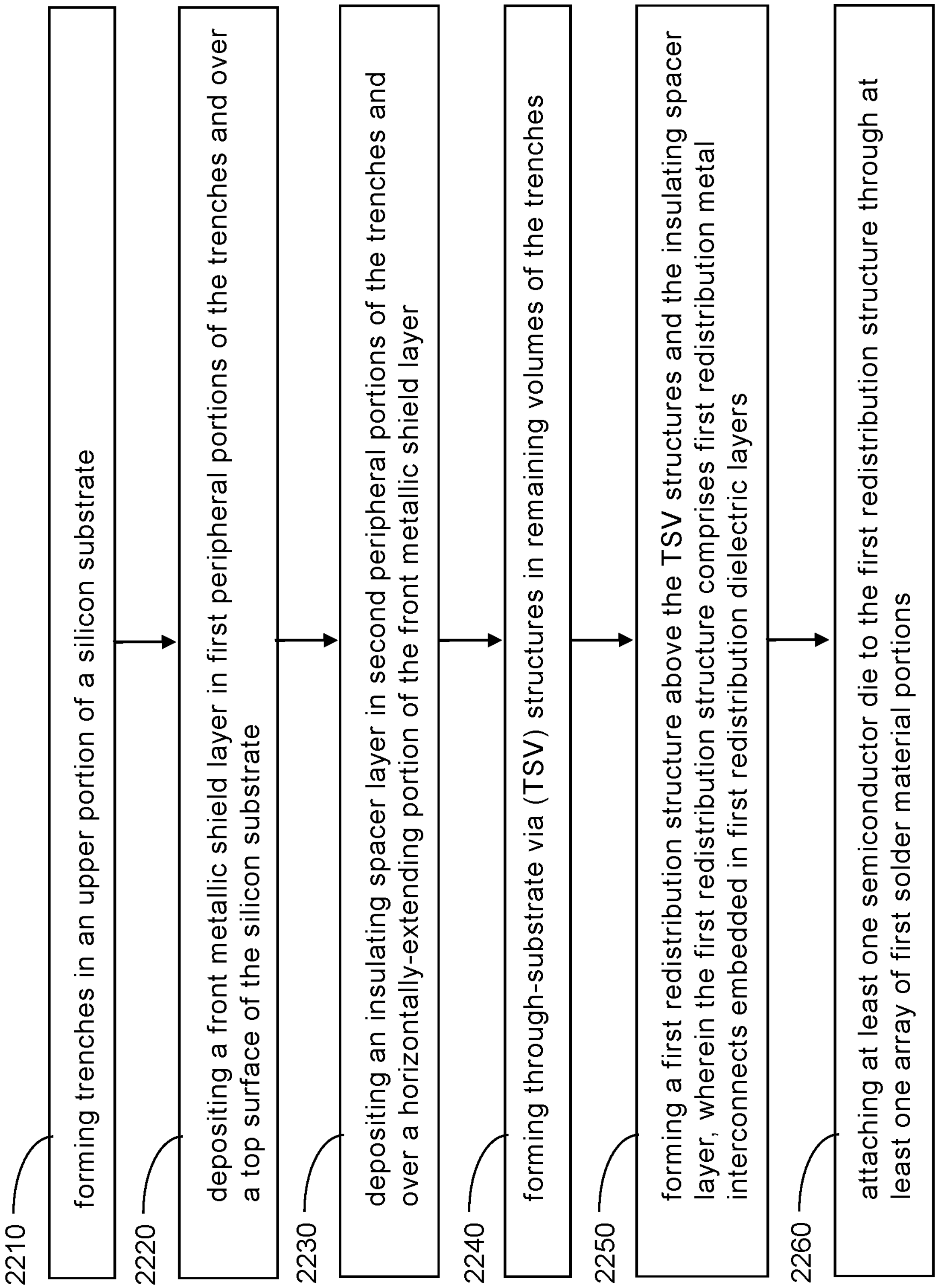
FIG. 22 is a second flowchart illustrating steps for forming a device structure according to an embodiment of the present disclosure.

FIG. 22 is a second flowchart illustrating steps for forming a device structure according to an embodiment of the present disclosure. In the method of the second flow chart, an insulating spacer layer 430 may be formed in second peripheral portions of the trenches 409 and over a horizontally-extending portion of the front metallic shield layer 420.

Referring to step 2210 and FIGS. 1 and 2A, trenches 409 may be formed in an upper portion of a silicon substrate 410.

Referring to step 2220 and FIG. 2B, a front metallic shield layer 420 may be deposited in first peripheral portions of the trenches 409 and over a top surface of the silicon substrate 410. In some embodiments, a horizontally-extending portion of the front metallic shield layer 420 continuously extends from a first vertically-extending cylindrical portion of the front metallic shield layer 420 laterally surrounding a first TSV structure 440 selected from the TSV structures 440 to a second vertically-extending cylindrical portion of the front metallic shield layer 420 laterally surrounding a second TSV structure 440 selected from the TSV structures 440.

Referring to step 2230 and FIG. 2C, an insulating spacer layer 430 may be deposited in second peripheral portions of the trenches 409 and over a horizontally-extending portion of the front metallic shield layer 420.

Referring to step 2240 and FIGS. 2D-2J, 3C-3H, 4A-4D, and 5-8, through-substrate via (TSV) structures 440 may be formed in remaining volumes of the trenches 409. Metal interconnect structures 480 embedded in dielectric material layers 460 can be formed over the TSV structures 440. The metal interconnect structures 480 comprise first metal via structures 482 contacting a top surface of a respective one of the TSV structures 440. In one embodiment, the metal interconnect structures 480 comprises additional first metal via structures 482 contacting a top surface of the horizontally-extending portion of the front metallic shield layer 420.

A backside of the silicon substrate 410 may be thinned. A bottom surface of the silicon substrate 410 can be recessed after thinning the backside of the silicon substrate 410, whereby the bottom surface of the silicon substrate 410 is vertically recessed upward with respect to bottom surfaces of the TSV structures 440. Bottom segments of outer sidewalls of the vertically-extending cylindrical portions of the front metallic shield layer 420 may be physically exposed. A backside metallic shield layer 470 can be formed such that the backside metallic shield layer 470 contacts regions of vertically-extending cylindrical portions of the front metallic shield layer 420. The backside metallic shield layer 470 may be formed within a volume vertically bounded by the bottom surface of the silicon substrate 410 and a horizontal plane including bottom surfaces of the TSV structures 440. In one embodiment, the backside metallic shield layer 470 is formed directly on the bottom segments of the outer sidewalls of the vertically-extending cylindrical portions of the front metallic shield layer 420. In one embodiment, the backside metallic shield layer 470 continuously extends from a first vertically-extending cylindrical portion of the front metallic shield layer 420 laterally surrounding a first TSV structure 440 selected from the TSV structures 440 to a second vertically-extending cylindrical portion of the front metallic shield layer 420 laterally surrounding a second TSV structure 440 selected from the TSV structures 440 (for example, as illustrated in FIGS. 3F and 3G).

Referring to step 2250 and FIGS. 9A and 9B, a first redistribution structure 500 may be formed above the TSV structures 440 and the insulating spacer layer 430. The first redistribution structure 500 comprises first redistribution wiring interconnects 580 embedded in first redistribution dielectric layers 560.

Referring to step 2260 and FIGS. 10-18, at least one semiconductor die (701, 702, 703) may be attached to the first redistribution structure 500 through at least one array of first solder material portions 790. A die-level molding compound (MC) matrix may be formed around the at least one semiconductor die (701, 702, 703). A second redistribution structure 600 may be formed on the bottom surfaces of the TSV structures 440. In one embodiment, the second redistribution structure 600 comprises second redistribution wiring interconnects embedded in second redistribution dielectric layers 660.

Figure 23:
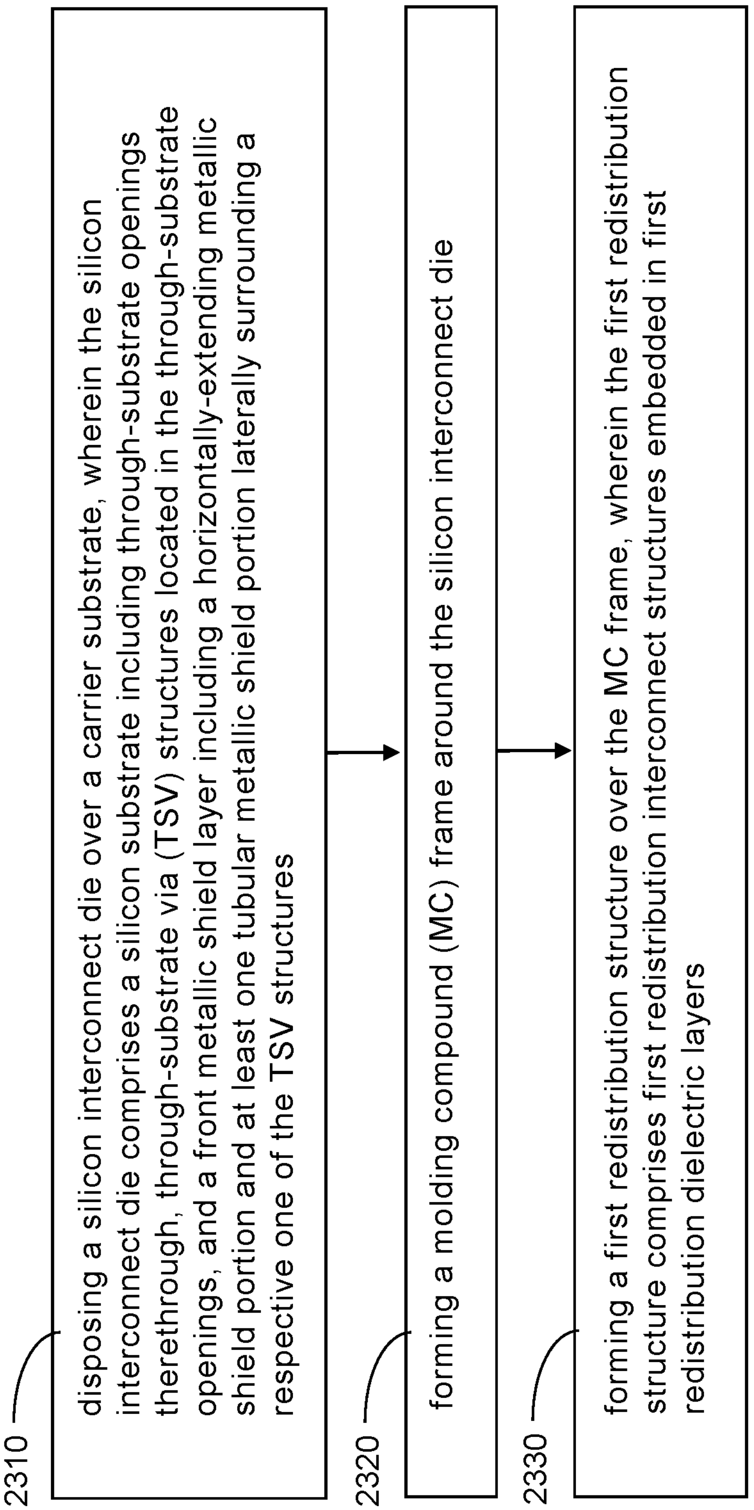
FIG. 23 is a third flowchart illustrating steps for forming a device structure according to an embodiment of the present disclosure.

FIG. 23 is a third flowchart illustrating steps for forming a device structure according to an embodiment of the present disclosure. In the method of third flow chart, an interposer-level molding compound (MC) frame is formed around an silicon interconnect die 405.

Referring to step 2310 and FIGS. 1-6, a silicon interconnect die 405 can be disposed over a carrier wafer 310. The silicon interconnect die 405 comprises a silicon substrate 410 including through-substrate openings therethrough, through-substrate via (TSV) structures 440 located in the through-substrate openings, and a front metallic shield layer 420 including a horizontally-extending metallic shield portion and at least one tubular metallic shield portion laterally surrounding a respective one of the TSV structures 440. In one embodiment, the silicon interconnect die 405 comprises a backside metallic shield layer 470 located on a backside surface of the silicon substrate 410 and contacting each of the at least one tubular metallic shield portion.

Referring to step 2320 and FIGS. 7 and 8, a molding compound (MC) frame 490 may be formed around the silicon interconnect die 405.

Referring to step 2330 and FIGS. 9A-18, a first redistribution structure 500 may be formed over the MC frame 490, wherein the first redistribution structure 500 comprises first redistribution wiring interconnects 580 formed within first redistribution dielectric layers 560. At least one semiconductor die (701, 702, 703) may be attached to the first redistribution structure 500 through at least one array of first solder material portions 790. A die-level molding compound (MC) frame 796 may be formed around the at least one semiconductor die (701, 702, 703). The carrier wafer 310 can be detached from an assembly including the silicon interconnect die 405, the MC frame 490, and the first redistribution structure 500. A second redistribution structure 600 may be formed on the backside metallic shield layer 470. The second redistribution structure 600 comprises second redistribution wiring interconnects 680 embedded in second redistribution dielectric layers 660, and the second redistribution wiring interconnects 680 comprises redistribution via structures 682 contacting a bottom surface of a respective one of the TSV structures 440.

Referring to all drawings and according to various embodiments of the present disclosure, a device structure comprising a silicon interconnect die 405 is provided. The silicon interconnect die 405 comprises: through-substrate via (TSV) structures 440 extending through a silicon substrate 410; an insulating spacer layer 430 including a horizontally-extending portion overlying a top surface of the silicon substrate 410 and a plurality of tubular insulating material portions laterally surrounding a respective one of the TSV structures 440; and a front metallic shield layer 420 including a horizontally-extending metallic shield portion and at least one tubular metallic shield portion laterally surrounding a respective one of the tubular insulating material portions.

In one embodiment, each of the at least one tubular metallic shield portions is in contact with a respective cylindrical sidewall of the silicon substrate 410. In one embodiment, the horizontally-extending metallic shield portion contacts a top surface of the silicon substrate 410. In one embodiment, the silicon interconnect die 405 comprises a backside metallic shield layer 470 located on a backside surface of the silicon substrate 410 and contacting each of the at least one tubular metallic shield portion. In one embodiment, each of the at least one tubular metallic shield portion comprises a respective bottom surface located within a first horizontal plane HP1 that includes a backside surface of the backside metallic shield layer 470. In one embodiment, the TSV structures 440 have planar bottom surfaces located within the first horizontal plane HP1. In one embodiment, each of the at least one tubular metallic shield portion comprises a respective outer cylindrical sidewall of which a bottom portion is in direct contact with a respective sidewall of the backside metallic shield layer 470. In one embodiment, each of the plurality of tubular insulating material portions has a respective annular bottom surface located within a first horizontal plane HP1 that includes a backside surface of the backside metallic shield layer 470.

In one embodiment, the TSV structures 440 have top surfaces located below a horizontal plane including a top surface of the horizontally-extending portion of the insulating spacer layer 430. In one embodiment, the silicon interconnect die 405 comprises metal interconnect structures 480 embedded in dielectric material layers 460; and the metal interconnect structures 480 comprises metal via structures 482 contacting a respective one of the TSV structures 440.

According to another aspect of the present disclosure, a device structure comprising an interposer 400 is provided. The interposer 400 comprises: a silicon interconnect die 405 comprising a through-substrate via (TSV) structures 440 extending through a silicon substrate 410, a front metallic shield layer 420 including a horizontally-extending metallic shield portion overlying a top surface of the silicon substrate 410 and at least one tubular metallic shield portion laterally surrounding a respective one of TSV structures 440, and metal interconnect structures formed in dielectric material layers and overlying the front metallic shield layer; and a first redistribution structure 500 comprising first redistribution wiring interconnects 580 formed in first redistribution dielectric layers 560 and overlying the silicon interconnect die 405.

In one embodiment, the silicon interconnect die 405 comprises an insulating spacer layer 430 including a horizontally-extending portion overlying a top surface of the silicon substrate 410 and a plurality of tubular insulating material portions laterally surrounding a respective one of the TSV structures 440. In one embodiment, the at least one tubular metallic shield portion comprises an inner cylindrical sidewall that contacts an outer cylindrical sidewall of a respective tubular insulating material portion selected from the plurality of tubular insulating material portions.

In one embodiment, the composite interposer 400 comprises a molding compound (MC) composite interposer frame 490 laterally surrounding the silicon interconnect die 405 and contacting a bottom surface of the first redistribution structure 500. In one embodiment, the composite interposer 400 comprises a second redistribution structure 600 comprising second redistribution wiring interconnects 680 embedded in second redistribution dielectric layers 660 and underlying the silicon interconnect die 405, wherein the second redistribution wiring interconnects 680 comprise second redistribution via structures 682 contacting bottom surfaces of the TSV structures 440.

According to yet another aspect of the present disclosure, a device structure comprising a fan-out package 800 is provided. The fan-out package 800 comprises: a silicon interconnect die 405 comprising through-substrate via (TSV) structures 440 extending through a silicon substrate 410, a front metallic shield layer 420 including at least one tubular metallic shield portion laterally surrounding a respective one of TSV structures 440, and metal interconnect structures embedded in dielectric material layers and overlying the front metallic shield layer; a first redistribution structure 500 comprising first redistribution wiring interconnects 580 embedded in first redistribution dielectric layers 560 and overlying the silicon interconnect die 405; and at least one semiconductor die (701, 702, 703) attached to the first redistribution structure 500 through at least one array of solder material portions 790.

In one embodiment, the front metallic shield layer 420 comprises a horizontally-extending metallic shield portion overlying a top surface of the silicon substrate 410. In one embodiment, the silicon interconnect die 405 comprises an insulating spacer layer 430 including a horizontally-extending portion overlying a top surface of the silicon substrate 410 and a plurality of tubular insulating material portions laterally surrounding a respective one of the TSV structures 440.

In one embodiment, the at least one tubular metallic shield portion comprises an inner cylindrical sidewall that contacts an outer cylindrical sidewall of a respective tubular insulating material portion selected from the plurality of tubular insulating material portions. In one embodiment, the composite interposer 400 comprises a molding compound (MC) composite interposer frame 490 laterally surrounding the silicon interconnect die 405 and contacting a bottom surface of the first redistribution structure 500.

The various embodiments of the present disclosure can be used to provide electrically shielded through-substrate via (TSV) structures 440 vertically extending through a silicon substrate 410 of a silicon interconnect die, which may be incorporated into an interposer to provide high speed electrically conductive paths that are less prone to electrical cross-talk and provide a lower interference noise level. The various embodiments of the present disclosure may be used to provide a fan-out package that provide excellent noise suppression in high frequency applications.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising a silicon interconnect die, wherein the silicon interconnect die comprises:
a through-substrate via (TSV) structure extending through a silicon substrate;
an insulating spacer layer including a horizontally-extending portion overlying a top surface of the silicon substrate and a tubular insulating material portion laterally surrounding the TSV structure; and
a front metallic shield layer including a horizontally-extending metallic shield portion and a tubular metallic shield portion laterally surrounding the tubular insulating material portion,
wherein the silicon interconnect die comprises a backside metallic shield layer located on a backside surface of the silicon substrate and contacting the tubular metallic shield portion.

2. The device structure of claim 1, wherein the tubular metallic shield portion is in contact with a respective cylindrical sidewall of the silicon substrate.

3. The device structure of claim 1, wherein the horizontally-extending metallic shield portion contacts a top surface of the silicon substrate.

4. The device structure of claim 1, wherein the tubular metallic shield portion comprises a bottom surface located within a first horizontal plane that includes a backside surface of the backside metallic shield layer.

5. The device structure of claim 4, wherein the TSV structure has a planar bottom surface located within the first horizontal plane.

6. The device structure of claim 1, wherein the tubular metallic shield portion comprises an outer cylindrical sidewall of which a bottom portion is in contact with a sidewall of the backside metallic shield layer.

7. The device structure of claim 1, wherein the tubular insulating material portion has a respective annular bottom surface located within a first horizontal plane that includes a backside surface of the backside metallic shield layer.

8. The device structure of claim 1, wherein the TSV structure has a top surface located below a horizontal plane including a top surface of the horizontally-extending portion of the insulating spacer layer.

9. The device structure of claim 1, wherein:
the silicon interconnect die comprises metal interconnect structures embedded in dielectric material layers; and
the metal interconnect structures comprises metal via structures contacting the TSV structure.

10. The device structure of claim 1, further comprising:
a first redistribution structure comprising first redistribution wiring interconnects formed in first redistribution dielectric layers and overlying the silicon interconnect die; and a second redistribution structure comprising second redistribution wiring interconnects embedded in second redistribution dielectric layers and underlying the silicon interconnect die, wherein the second redistribution wiring interconnects comprise redistribution via structures contacting bottom surfaces of the TSV structures.

11. A device structure comprising an interposer, wherein the interposer comprises:

a silicon interconnect die comprising a through-substrate via (TSV) structure extending through a silicon substrate, a front metallic shield layer including a horizontally-extending metallic shield portion overlying a top surface of the silicon substrate and a tubular metallic shield portion laterally surrounding the TSV structure, metal interconnect structures formed in dielectric material layers and overlying the front metallic shield layer, and a backside metallic shield layer located on a backside surface of the silicon substrate and contacting the tubular metallic shield portion; and a first redistribution structure comprising first redistribution wiring interconnects formed in first redistribution dielectric layers and overlying the silicon interconnect die.

12. The device structure of claim 11, wherein the silicon interconnect die comprises an insulating spacer layer including a horizontally-extending portion overlying a top surface of the silicon substrate and a tubular insulating material portion laterally surrounding of the TSV structure.

13. The device structure of claim 12, wherein the tubular metallic shield portion comprises an inner cylindrical sidewall that contacts an outer cylindrical sidewall of the tubular insulating material portion.

14. The device structure of claim 11, wherein the interposer comprises a molding compound (MC) interposer frame laterally surrounding the silicon interconnect die and contacting a bottom surface of the first redistribution structure.

15. The device structure of claim 11, wherein the interposer comprises a second redistribution structure comprising second redistribution wiring interconnects embedded in second redistribution dielectric layers and underlying the silicon interconnect die, wherein the second redistribution wiring interconnects comprise redistribution via structures contacting bottom surfaces of the TSV structure.

16. The device structure of claim 11, wherein the tubular metallic shield portion comprises an outer cylindrical sidewall of which a bottom portion contacts a sidewall of the backside metallic shield layer.

17. The device structure of claim 11, wherein:

a bottom surface of the silicon substrate is vertically recessed upward relative to a bottom surface of the TSV structure; and the backside metallic shield layer is located on the recessed bottom surface of the silicon substrate and on the bottom surface of the TSV structure.

18. A semiconductor device structure, comprising:

a silicon substrate having a top surface and a bottom surface;

a Through-Substrate Via (TSV) structure extending through the silicon substrate, wherein the TSV structure comprises a metallic core portion;

a front metallic shield layer formed in an upper portion of the silicon substrate, the front metallic shield layer having a barrier layer and a metal layer;

a metallic interconnect stack formed over the top surface of the silicon substrate, the metallic interconnect stack being electrically connected to the TSV structure; and a backside metallic shield layer formed on the bottom surface of the silicon substrate, wherein the backside metallic shield layer is electrically coupled to at least one the front metallic shield layer or the TSV structure.

19. The device structure of claim 18, wherein the bottom surface of the silicon substrate is vertically recessed upward relative to the bottom surface of the TSV structure, and wherein the backside metallic shield layer is formed on the recessed bottom surface of the silicon substrate and on the bottom surface of the TSV structure.

20. The device structure of claim 18, wherein the front metallic shield layer comprises a horizontally-extending metallic shield portion overlying the top surface of the silicon substrate, and wherein the front metallic shield layer is formed by lithographic patterning that leaves laterally spaced portions of the front metallic shield layer remaining, covering the TSV structure.

* * * * *